(12) United States Patent
Pederson

(10) Patent No.: US 6,547,410 B1
(45) Date of Patent: Apr. 15, 2003

(54) LED ALLEY/TAKE-DOWN LIGHT

(75) Inventor: John C. Pederson, St. Cloud, MN (US)

(73) Assignee: 911 Emergency Products, Inc., St. Cloud, MN (US)

( * ) Notice: Subject to any disclaimer, the term of this patent is extended or adjusted under 35 U.S.C. 154(b) by 25 days.

(21) Appl. No.: 09/627,866

(22) Filed: Jul. 28, 2000

(51) Int. Cl.[7] .............................................. F21V 21/30

(52) U.S. Cl. ........................ 362/35; 362/272; 362/524; 362/542; 362/545

(58) Field of Search .......................... 362/35, 524, 545, 362/540, 542, 800, 272

(56) References Cited

U.S. PATENT DOCUMENTS

| | | | |
|---|---|---|---|
| 3,701,043 A | 10/1972 | Zuleeg et al. | 331/94.5 |
| 3,705,316 A | 12/1972 | Burrous et al. | 307/311 |
| 3,863,075 A | 1/1975 | Ironmonger et al. | 250/552 |
| 3,889,147 A | 6/1975 | Groves | 313/500 |
| 4,149,111 A | 4/1979 | Coates, Jr. | 315/169.4 |
| 4,243,985 A | 1/1981 | Quayle | 340/753 |
| 4,298,806 A | 11/1981 | Herold | 250/504 |
| 4,301,461 A | 11/1981 | Asano | 357/17 |
| 4,319,306 A | 3/1982 | Stanuch | 362/35 |
| 4,342,944 A | 8/1982 | Thorpe | 313/499 |
| 4,390,931 A | 6/1983 | Gorick et al. | 362/267 |
| 4,598,198 A | 7/1986 | Fayfield | 250/205 |
| 4,615,131 A | 10/1986 | Wakatake | 40/473 |
| 4,616,225 A | 10/1986 | Woudenberg | 340/908 |
| 4,630,180 A | 12/1986 | Muraki et al. | 362/223 |
| 4,630,183 A | 12/1986 | Fujita | 362/311 |
| 4,633,280 A | 12/1986 | Takasu | 357/17 |
| 4,654,629 A | 3/1987 | Bezos et al. | 340/87 |
| 4,703,219 A | 10/1987 | Mesquida | 313/111 |
| 4,716,296 A | 12/1987 | Bussiere et al. | 250/504 |

(List continued on next page.)

FOREIGN PATENT DOCUMENTS

| | | |
|---|---|---|
| DE | 43 04 216 A1 | 2/1993 |
| DE | 297 12 281 | 5/1997 |
| EP | 0 468 822 A2 | 7/1991 |
| EP | 0 531 184 A1 | 8/1992 |
| EP | 0 531 185 A1 | 8/1992 |
| EP | 0 596 782 A1 | 10/1992 |
| EP | 0 633 163 A1 | 7/1994 |
| EP | 0 709 818 A1 | 5/1996 |
| EP | 0 793 403 A1 | 1/1997 |
| EP | 0 887 783 A2 | 6/1998 |
| EP | 0 890 894 A1 | 7/1998 |
| EP | 0 896 898 A2 | 7/1998 |
| FR | 2 658 024 | 2/1990 |
| FR | 2 680 861 | 9/1991 |
| FR | 2 707 222 | 7/1993 |
| FR | 2 800 500 | 10/2000 |
| GB | 2069257 | 8/1981 |
| GB | 2175428 A | 11/1986 |
| GB | 2240650 A | 8/1991 |
| GB | 2272791 A | 5/1994 |
| GB | 2292450 A | 2/1996 |
| GB | 2311401 A | 9/1997 |
| GB | 2 330 679 A | 10/1998 |
| WO | 99/35634 | 1/1999 |

*Primary Examiner*—Stephen Husar
(74) *Attorney, Agent, or Firm*—Vidas, Arrett & Steinkraus, P.A.

(57) ABSTRACT

A light emitting diode (LED) warning signal light, the warning signal light comprising a plurality of light sources constructed and arranged with a reflector or culminator, the LED light source being in electrical communication with a controller and a power supply, battery, or other electrical source. The warning signal light provides various colored light signals for independent use or use on an emergency vehicle. The warning light signals may include a strobe light, revolving light, an alternating light, a flashing light, a modulated light, a pulsating light, an oscillating light or any combination thereof. The controller may further be adapted to regulate or modulate the power intensity exposed to the illuminated LED's to create a variable intensity light signal.

30 Claims, 28 Drawing Sheets

U.S. PATENT DOCUMENTS

| | | | |
|---|---|---|---|
| 4,720,835 A | 1/1988 | Akiba | 372/50 |
| 4,799,135 A | 1/1989 | Inukai et al. | 362/296 |
| 4,918,497 A | 4/1990 | Edmond | 357/17 |
| 4,929,866 A | 5/1990 | Murata et al. | 313/500 |
| 4,935,665 A | 6/1990 | Murata | 313/500 |
| 4,954,822 A | 9/1990 | Borenstein | 340/925 |
| 4,965,644 A | 10/1990 | Kawabata et al. | 357/17 |
| 4,966,862 A | 10/1990 | Edmond | 437/100 |
| 4,990,970 A | 2/1991 | Fuller | 357/17 |
| 5,027,168 A | 6/1991 | Edmond | 357/17 |
| 5,041,947 A * | 8/1991 | Yuen et al. | 362/35 |
| 5,045,767 A | 9/1991 | Wakatake | 318/696 |
| 5,050,055 A | 9/1991 | Lindsay et al. | 362/293 |
| D324,921 S | 3/1992 | Stanuch et al. | D26/35 |
| 5,093,768 A | 3/1992 | Ohe | 362/241 |
| 5,097,397 A | 3/1992 | Stanuch et al. | 362/74 |
| 5,097,612 A | 3/1992 | Williams | 40/591 |
| 5,101,326 A | 3/1992 | Roney | 362/61 |
| 5,122,943 A | 6/1992 | Pugh | 362/256 |
| 5,136,287 A | 8/1992 | Borenstein | 340/925 |
| 5,187,547 A | 2/1993 | Niina et al. | 257/77 |
| 5,220,235 A | 6/1993 | Wakimizu et al. | 313/25 |
| 5,224,773 A | 7/1993 | Arimura | 362/227 |
| 5,233,204 A | 8/1993 | Fletcher et al. | 257/13 |
| 5,235,498 A | 8/1993 | Val Dulmen et al. | 362/296 |
| 5,283,425 A | 2/1994 | Imamura | 250/208.1 |
| 5,302,965 A | 4/1994 | Belcher et al. | 345/31 |
| 5,313,187 A | 5/1994 | Choi et al. | 340/331 |
| 5,321,593 A | 6/1994 | Moates | 362/251 |
| 5,357,123 A | 10/1994 | Sugawara | 257/88 |
| 5,357,409 A | 10/1994 | Glatt | 362/105 |
| 5,359,255 A | 10/1994 | Kawai et al. | 313/17 |
| 5,361,190 A | 11/1994 | Roberts et al. | 362/61 |
| 5,362,971 A | 11/1994 | McMahon et al. | 250/577 |
| 5,403,916 A | 4/1995 | Watanabe et al. | 437/127 |
| 5,406,095 A | 4/1995 | Koyama et al. | 257/88 |
| 5,410,328 A | 4/1995 | Yoksza et al. | 345/82 |
| 5,419,065 A | 5/1995 | Lin | 40/550 |
| 5,420,444 A | 5/1995 | Sawase et al. | 257/99 |
| 5,422,623 A | 6/1995 | Bader et al. | 340/331 |
| 5,426,417 A * | 6/1995 | Stanuch | 362/35 |
| 5,450,301 A | 9/1995 | Waltz et al. | 362/231 |
| 5,475,241 A | 12/1995 | Harrah et al. | 257/99 |
| 5,482,896 A | 1/1996 | Tang | 437/209 |
| 5,490,049 A | 2/1996 | Montalan et al. | 362/240 |
| 5,491,350 A | 2/1996 | Unno et al. | 257/99 |
| 5,498,883 A | 3/1996 | Lebby et al. | 257/95 |
| 5,514,627 A | 5/1996 | Lowery et al. | 437/209 |
| 5,516,727 A | 5/1996 | Broom | 437/211 |
| 5,519,720 A | 5/1996 | Hirano et al. | 372/36 |
| 5,526,237 A | 6/1996 | Devanport et al. | 362/32 |
| 5,528,474 A | 6/1996 | Roney et al. | 362/249 |
| 5,567,036 A | 10/1996 | Theobald et al. | 362/80 |
| 5,569,939 A | 10/1996 | Choi | 257/94 |
| 5,575,459 A | 11/1996 | Anderson | 362/240 |
| 5,580,156 A | 12/1996 | Suzuki et al. | 362/184 |
| 5,585,783 A | 12/1996 | Hall | 340/473 |
| 5,593,223 A | 1/1997 | Koizumi | 362/255 |
| 5,612,231 A | 3/1997 | Holm et al. | 437/23 |
| 5,625,201 A | 4/1997 | Holm et al. | 257/88 |
| 5,627,851 A | 5/1997 | Takahashi | 372/44 |
| 5,631,474 A | 5/1997 | Saitoh | 257/88 |
| 5,632,551 A | 5/1997 | Roney et al. | 362/249 |
| 5,634,711 A | 6/1997 | Kennedy et al. | 362/119 |
| 5,636,916 A | 6/1997 | Sokolowski | 362/61 |
| 5,656,829 A | 8/1997 | Sakaguchi et al. | 257/94 |
| 5,661,645 A | 8/1997 | Hochstein | 363/89 |
| 5,661,742 A | 8/1997 | Hunag et al. | 372/46 |
| 5,674,000 A | 10/1997 | Kalley | 362/293 |
| 5,694,112 A | 12/1997 | VannRox et al. | 340/472 |
| 5,697,175 A | 12/1997 | Schwartz | 40/552 |
| 5,705,047 A | 1/1998 | Lee | 205/123 |
| 5,707,891 A | 1/1998 | Izumi et al. | 437/120 |
| 5,726,535 A | 3/1998 | Yan | 362/800 |
| 5,739,552 A | 4/1998 | Kimura et al. | 257/89 |
| 5,739,592 A | 4/1998 | Rigsby et al. | 307/9.1 |
| 5,758,947 A | 6/1998 | Glatt | 362/105 |
| 5,760,531 A | 6/1998 | Pederson | 313/25 |
| 5,785,418 A | 7/1998 | Hochstein | 362/373 |
| 5,789,768 A | 8/1998 | Lee et al. | 257/96 |
| 5,793,062 A | 8/1998 | Kish, Jr. et al. | 257/98 |
| 5,796,376 A | 8/1998 | Banks | 345/82 |
| 5,804,822 A | 9/1998 | Brass et al. | 250/302 |
| 5,805,081 A | 9/1998 | Fikacek | 340/908 |
| 5,806,965 A | 9/1998 | Deese | 362/249 |
| 5,838,024 A | 11/1998 | Masuda et al. | 257/98 |
| 5,838,247 A | 11/1998 | Bladowski | 340/815.45 |
| 5,848,837 A | 12/1998 | Gustafson | 362/235 |
| 5,898,381 A | 4/1999 | Gartner et al. | 340/815.65 |
| 5,900,850 A | 5/1999 | Bailey et al. | 345/55 |
| 5,929,788 A | 7/1999 | Vukosie | 340/908.1 |
| 5,931,562 A | 8/1999 | Arato | 362/184 |
| 5,932,860 A | 8/1999 | Plesko | 235/454 |
| 5,934,694 A | 8/1999 | Schugt et al. | 280/33.991 |
| 5,975,714 A | 11/1999 | Vetorino et al. | 362/192 |
| 5,990,802 A | 11/1999 | Maskeny | 340/815.45 |
| 6,009,650 A | 1/2000 | Lamparter | 40/572 |
| 6,018,899 A | 2/2000 | Hanitz | 40/473 |
| 6,028,694 A | 2/2000 | Schmidt | 359/264 |
| 6,095,661 A | 8/2000 | Lebens et al. | 362/184 |
| 6,102,696 A | 8/2000 | Osterwalder et al. | 433/29 |
| 6,118,388 A | 9/2000 | Morrison | 340/908 |
| 6,159,005 A | 12/2000 | Herold et al. | 433/29 |
| 6,177,678 B1 | 1/2001 | Brass et al. | 250/461.1 |
| 6,183,100 B1 | 2/2001 | Suckow et al. | 362/35 |

* cited by examiner

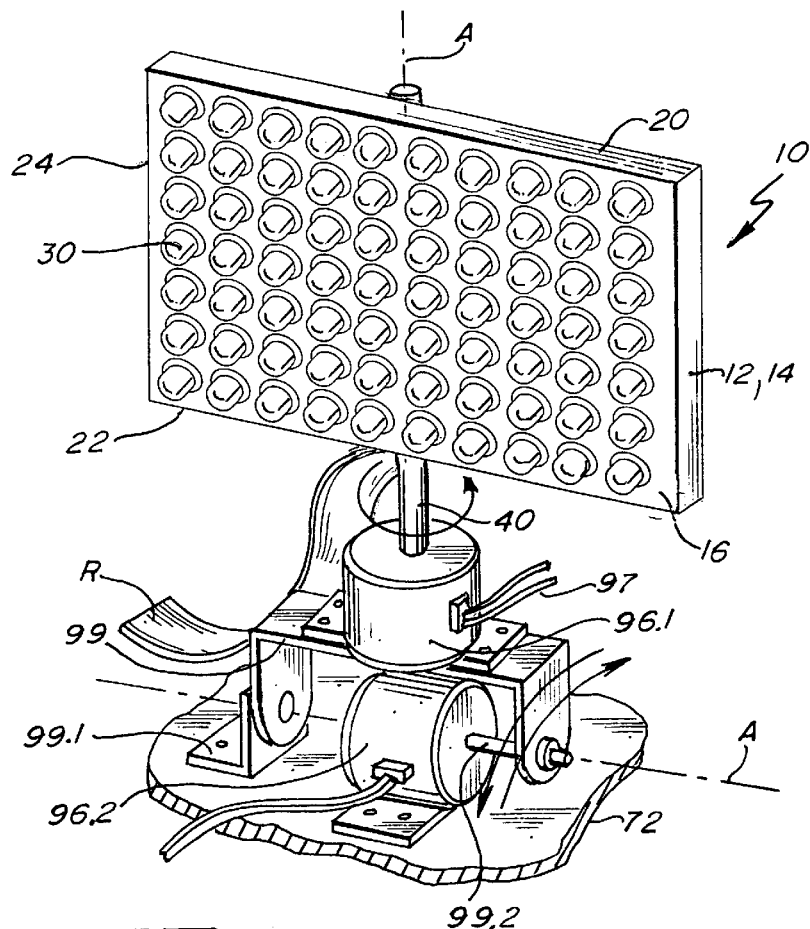
Fig. 3.
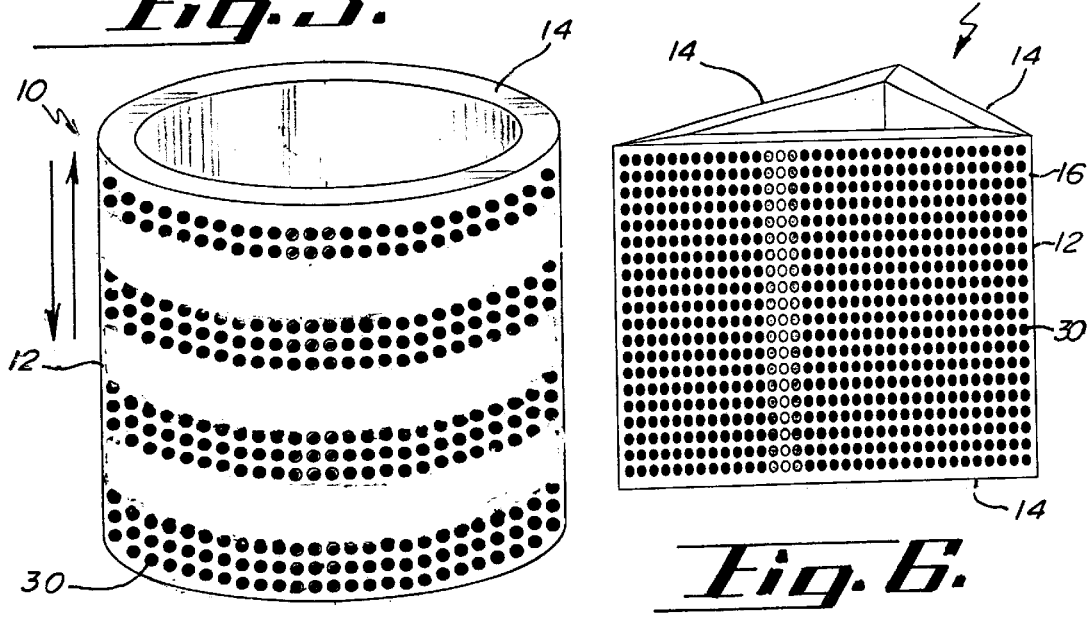
Fig. 5.
Fig. 6.

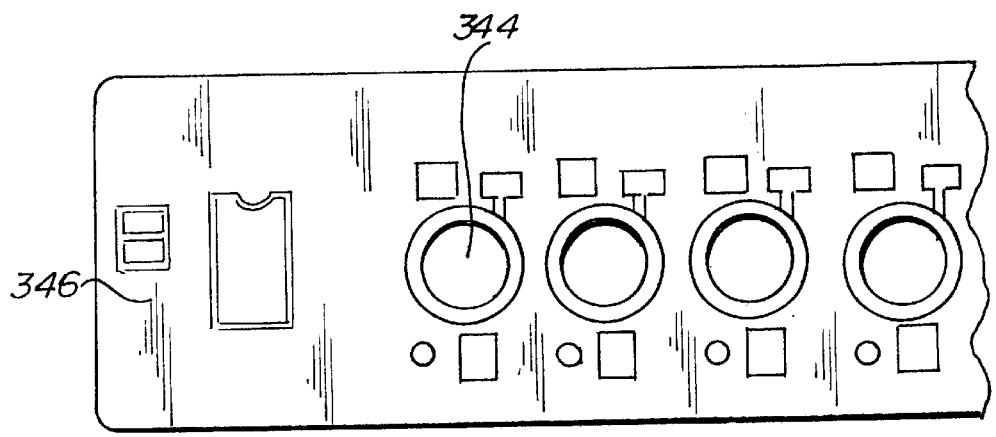
_Fig. 36._
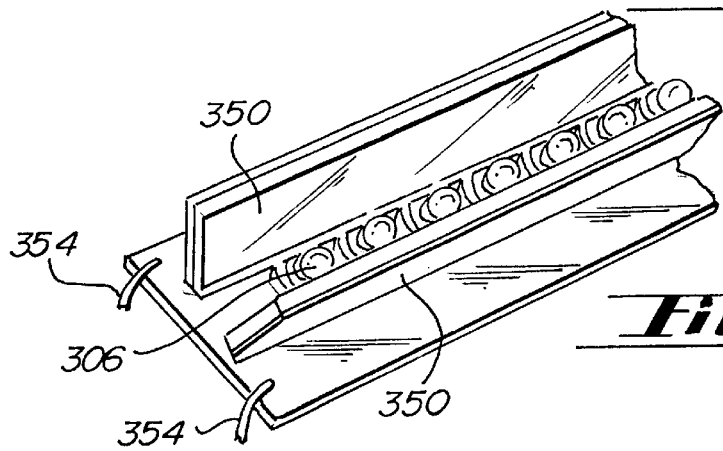
_Fig. 37._
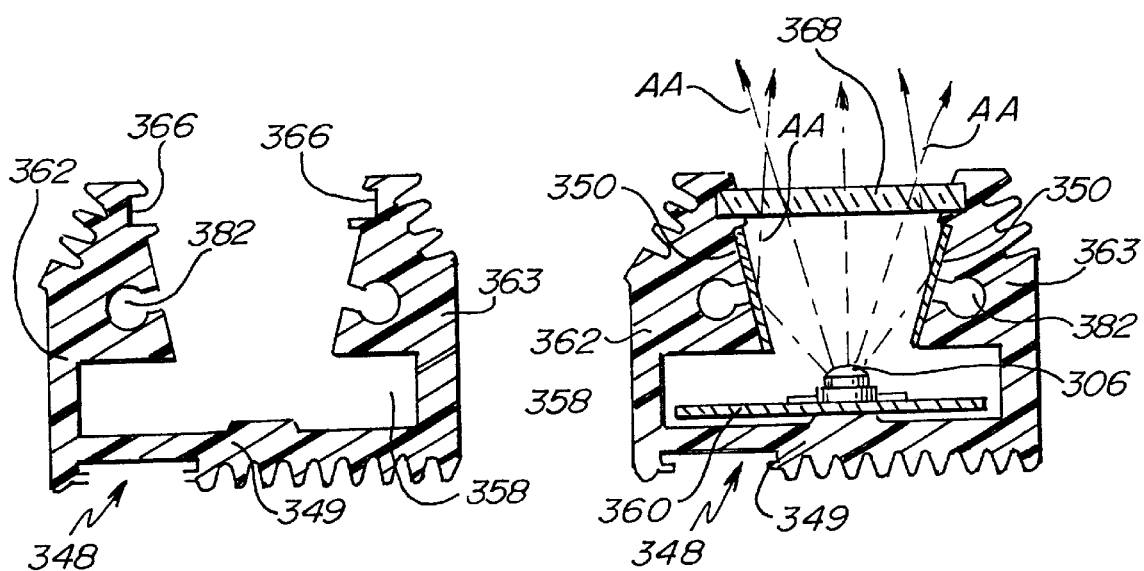
_Fig. 38._  _Fig. 39._

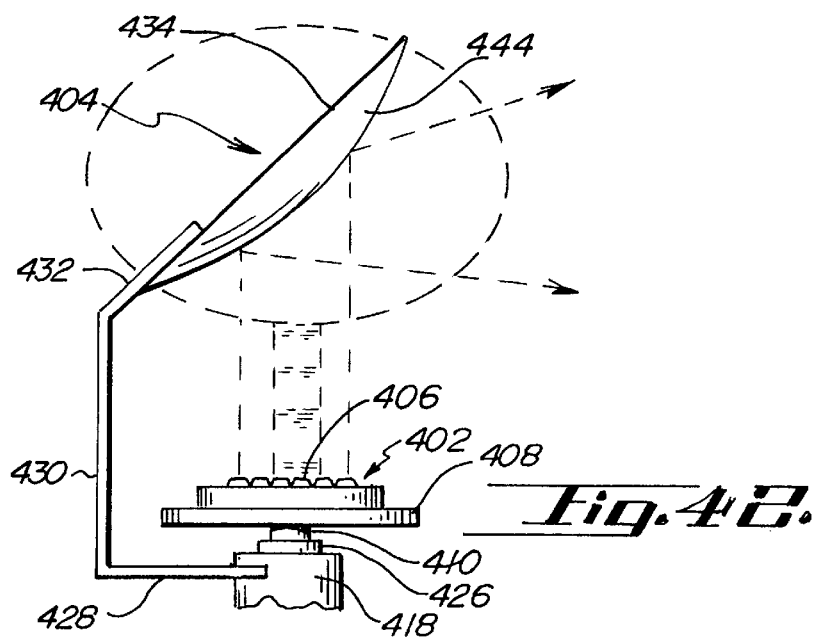
_Fig. 42._
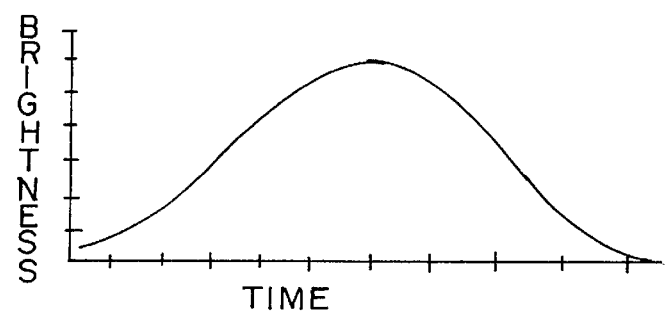
_Fig. 43._
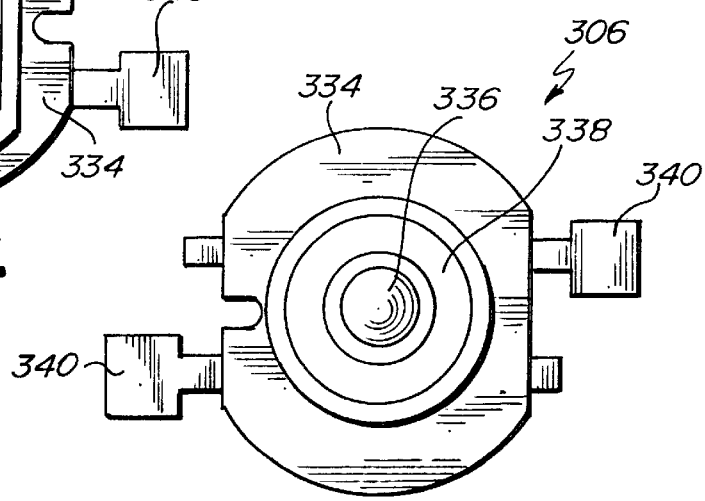
_Fig. 48._
_Fig. 49._

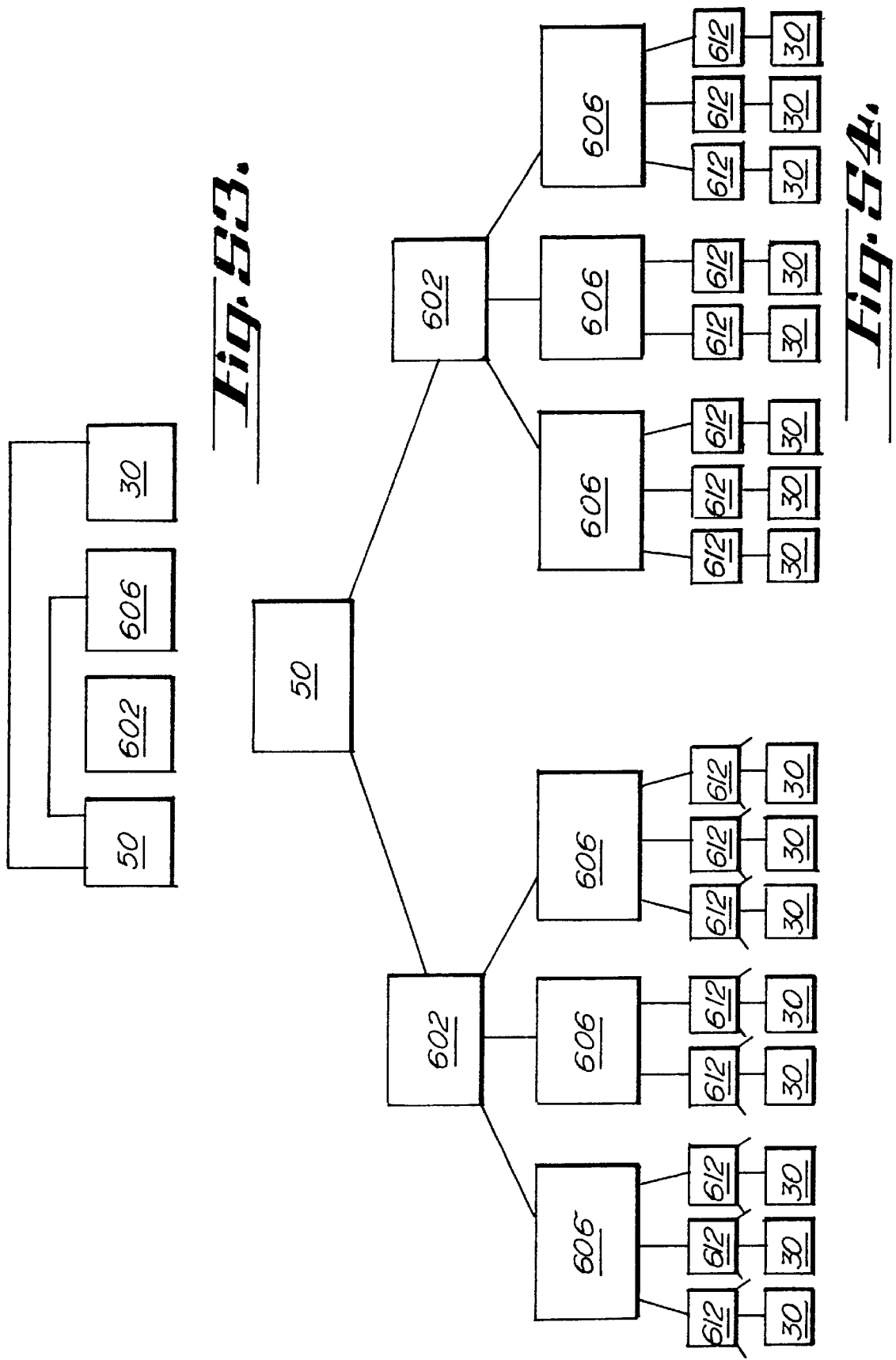

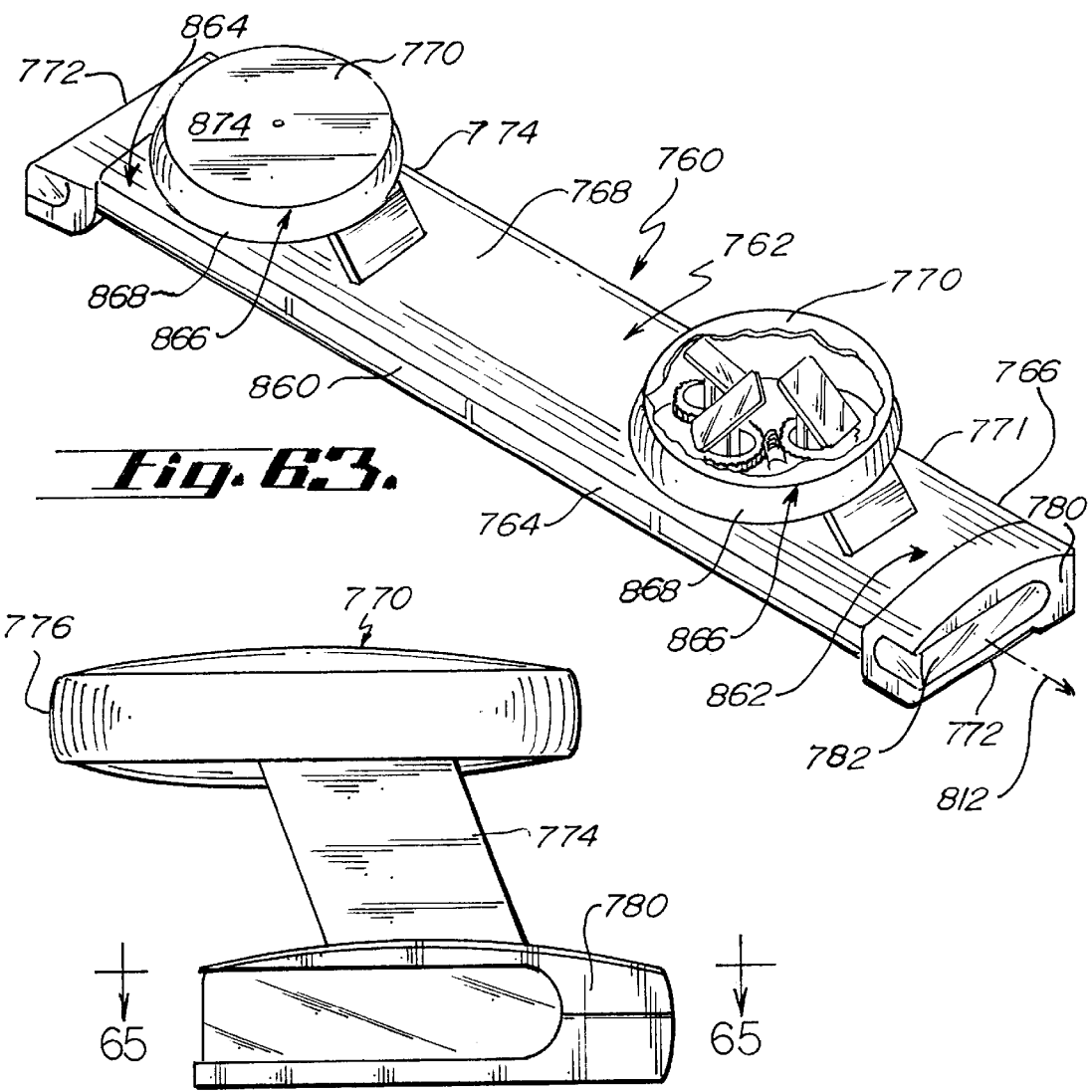
Fig. 63.
Fig. 64.
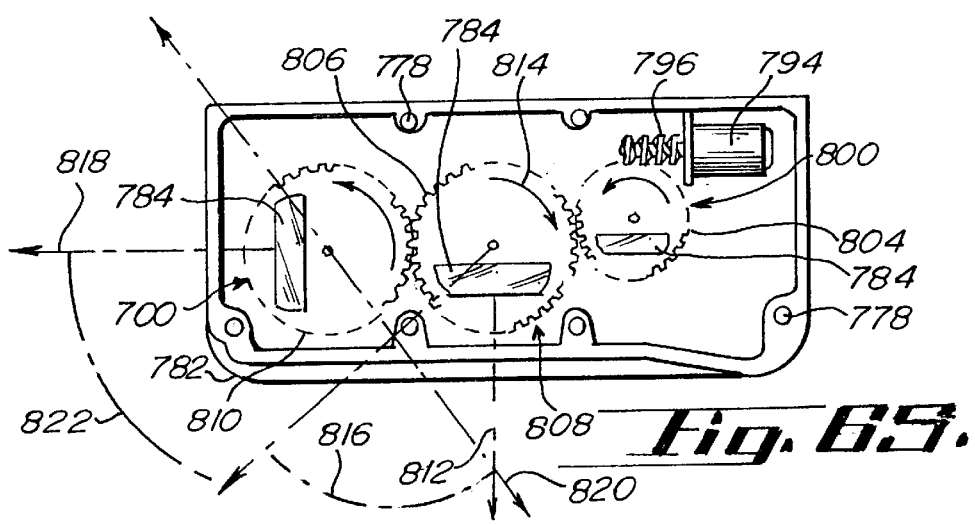
Fig. 65.

LED ALLEY/TAKE-DOWN LIGHT

The present invention relates to light emitting diode (LED) warning signal lights having modulated power intensity for use by emergency vehicles and is based upon Provisional U.S. patent application Ser. No. 60/147,240, filed Aug. 4, 1999, which is incorporated herein by reference in its entirety.

BACKGROUND OF THE INVENTION

Light bars or emergency lights of the type used on emergency vehicles such as fire trucks, police cars, and ambulances, utilize warning signal lights to produce a variety of light signals. These light signals involve the use of various colors and patterns. Generally, these warning signal lights consist of incandescent and halogen light sources having reflective back support members and colored filters.

Many problems exist with the known methods for producing warning light signals. One particular problem with known light sources is their reliance on mechanical components to revolve or oscillate the lamps to produce the desired light signal. Additionally, these components increase the size of the light bar or emergency lights which may adversely affect the vehicles aerodynamic characteristics. Moreover, there is an increased likelihood that a breakdown of the light bar or light source will occur requiring the repair or replacement of the defective component. Finally, the known light bars and light sources require a relatively large amount of electrical current during operation. The demands upon the electrical power system for a vehicle may therefore exceed available electrical resources reducing optimization of performance.

Halogen lamps or gaseous discharge xenon lamps generally emanate large amounts of heat which is difficult to dissipate from a sealed light enclosure or emergency light and which may damage the electronic circuitry contained therein. In addition, these lamps consume large amounts of current requiring a large power supply or battery or electrical source which may be especially problematic for use with a vehicle. These lamps also generate substantial electromagnetic emissions which may interfere with radio communications for a vehicle. Finally, these lamps, which are not rugged, have relatively short life cycles necessitating frequent replacement.

Another problem with the known warning signal lights is the use of filters to produce a desired color. Filtering techniques produce more heat that must be dissipated. Moreover, changing the color of a light source requires the physical removal of the filter from the light source or emergency light and the replacement of a new filter. Furthermore, filters fade or flake over time rendering the filters unable to consistently produce a desired color for observation in an emergency situation.

These problems associated with traditional signaling lamps are exacerbated by the fact that creating multiple light signals requires multiple signaling lamps. Further, there is little flexibility in modifying the light signal created by a lamp. For example, changing a stationary lamp into one that rotates or oscillates would require a substantial modification to the light bar which may not be physically or economically possible.

The present invention generally relates to electrical lamps and to high brightness light-emitting diode or "LED") technology which operates to replace gaseous discharge or incandescent lamps as used with vehicle warning signal light sources.

In the past, illumination lamps for automobile turn signals, brake lights, back-up lights, and/or marker lights/ headlights frequently have accompanying utility parabolic lens/reflector enclosures which have been used for utility warning signals or emergency vehicle traffic signaling. These signaling devices as known are commonly referred to as "unmarked corner tubes," or "dome tubes. A problem with these illumination lamps is the cost and failure rate of the known "unmarked corner tubes," or "dome lights." The failure rate of these devices frequently results in a significant amount of "down time" for a vehicle to effectuate replacement. Further, an officer is frequently unaware that a vehicle light is inoperative requiring replacement. This condition reduces the safety to an officer during the performance of his or her duties. In addition, the reduced life cycle and failure rate of the known illumination devices significantly increases operational costs associated with material replacement and labor. A need, therefore, exists to enhance the durability, and to reduce the failure rate, of illumination devices used with vehicles while simultaneously reducing the cost of a replacement illumination source.

In the past, the xenon gaseous discharge lamps have utilized a sealed compartment, usually a gas tube, which may have been filled with a particular gas known to have good illuminating characteristics. One such gas used for this purpose was xenon gas, which provides illumination when it becomes ionized by the appropriate voltage application. Xenon gas discharge lamps are used in the automotive industry to provide high intensity lighting and are used on emergency vehicles to provide a visible emergency signal light.

A xenon gas discharge lamp usually comprises a gas-filled tube which has an anode element at one end and a cathode element at the other end, with both ends of the tube being sealed. The anode and cathode elements each have an electrical conductor attached, which passes through the sealed gas end of the lamp exterior. An ionizing trigger wire is typically wound in a helical manner about the exterior of the glass tube, and this wire is connected to a high voltage power source typically on the order of 10–12 kilowatts (kw). The anode and cathode connections are connected to a lower level voltage source which is sufficient to maintain illumination of the lamp once the interior gas has been ionized by the high voltage source. The gas remains ignited until the anode/cathode voltage is removed; and once the gas ionization is stopped, the lamp may be ignited again by reapplying the anode/cathode voltage and reapplying the high voltage to the trigger wire via a voltage pulse.

Xenon gas lamps are frequently made from glass tubes which are formed into semicircular loops to increase the relative light intensity from the lamp while maintaining a relatively small form factor. These lamps generate extremely high heat intensity, and therefore, require positioning of the lamps so as to not cause heat buildup in nearby components. The glass tube of a xenon lamp is usually mounted on a light-based pedestal which is sized to fit into an opening in the light fixture and to hold the heat generating tube surface in a light fixture compartment which is separated from other interior compartment surfaces or components. In a vehicle application, the light and base pedestal are typically sized to fit through an opening in the light fixture which is about 1 inch in diameter. The light fixture component may have a glass or plastic cover made from colored material so as to produce a colored lighting effect when the lamp is ignited. Xenon gas discharge lamps naturally produce white light, which may be modified to produce a colored light, of lesser intensity, by placing the xenon lamp in a fixture having a colored lens. The glass tube of the xenon lamp may also be painted or otherwise colored to produce a similar result, although the light illumination from the tube tends to dominate the coloring; and the light may actually have a colored tint appearance rather than a solid colored light. The color blue is particularly hard to produce in this manner.

Because a preferred use of xenon lamps is in connection with emergency vehicles, it is particularly important that the lamp be capable of producing intense coloring associated with emergency vehicles, i.e., red, blue, amber, green, and clear.

When xenon lamps are mounted in vehicles, some care must be taken to reduce the corroding effects of water and various chemicals, including road salt, which might contaminate the light fixture. Corrosive effects may destroy the trigger wire and the wire contacts leading to the anode and cathode. Corrosion is enhanced because of the high heat generating characteristics of the lamp which may heat the air inside the lamp fixture when the lamp is in use, and this heated air may condense when the lamp is off resulting in moisture buildup inside the fixture. The buildup of moisture may result in the shorting out of the electrical wires and degrade the performance of the emission wire, sometimes preventing proper ionization of the gas within the xenon gas discharge lamp.

Warning lights, due to the type of light source utilized, may be relatively large in size which in turn may have an adverse affect upon adjacent operational components. In addition, there is an increased likelihood for a breakdown of the light source requiring repair or replacement of components.

Another problem with the known warning signal lights is the use of rotational and/or oscillating mechanisms which are utilized to impart a rotational or oscillating movement to a light source for observation during emergency situations. These mechanical devices are frequently cumbersome and difficult to incorporate and couple onto various locations about a vehicle due to the size of the device. These mechanical devices also frequently require a relatively large power source to impart rotational and/or oscillating movement for a light source.

Another problem with the known warning signal lights is the absence of flexibility for the provision of variable intensity for the light sources to increase the number of available distinct and independent visual light effects. In certain situations it may be desirable to provide variable intensity for a light signal, or a modulated intensity for a light signal, to provide a unique light effect to facilitate observation by an individual. In addition, the provision of a variable or modulated intensity for a light signal may further enhance the ability to provide a unique desired light effect for observation by an individual.

No warning lights are known which are flexible and which utilize a variable light intensity to modify a standard lighting effect. The warning lights as known are generally limited to a flashing light signal. Alternatively, other warning signal lights may provide a sequential illumination of light sources. No warning or utility light signals are known which simultaneously provide for modulated and/or variable power intensity for a known type of light signal to create a unique and desirable type of lighting effect.

No warning signal lights are known which provide irregular or random light intensity to a warning signal light to provide a desired lighting effect. Also, no warning light signals are known which provide a regular pattern of variable or modulated light intensity for a warning signal light to provide a desired type of lighting effect. It has also not been known to provide a warning light signal which combines either irregular variable light intensity or regular modulated light intensity to provide a unique and desired combination lighting effect.

It has also not been known to provide alternative colored LED light sources which may be electrically controlled for the provision of any desired pattern of light signal such as flashing, pulsating, oscillating, modulating, rotational, alternating, strobe, and/or combination light effects. In this regard, a need exists to provide a spatially and electrically efficient LED light source for use on an emergency or utility vehicle which provides the appearance of rotation, or other types of light signals.

In view of the above, there is a need for a warning signal light that:

(1) Is capable of producing multiple light signals;
(2) Produces the appearance of a revolving or oscillating light signal without relying upon mechanical components;
(3) Generates little heat;
(4) Uses substantially less electrical current;
(5) Produces significantly reduced amounts of electromagnetic emissions;
(6) Is rugged and has a long life cycle;
(7) Produces a truer light output color without the use of filters;
(8) Is positionable at a variety of locations about an emergency vehicle; and
(9) Provides variable power intensity to the light source without adversely affecting the vehicle operator's ability to observe objects while seated within the interior of the vehicle.

Other problems associated with the known warning signal lights relate to the restricted positioning of the signal light on a vehicle due to the size and shape of the light source. In the past, light sources due to the relatively large size of light bars or light sources, were required to be placed on the roof of a vehicle or at a location which did not interfere with, or obstruct, an operator's ability to visualize objects while seated in the interior of the vehicle. Light bars or light sources generally extended perpendicular to the longitudinal axis of a vehicle and were therefore more difficult to observe from the sides by an individual.

The ease of visualization of an emergency vehicle is a primary concern to emergency personnel regardless of the location of the observer. In the past, optimal observation of emergency lights has occurred when an individual was either directly in front of, or behind, an emergency vehicle. Observation from the sides, or at an acute angle relative to the sides, frequently resulted in reduced observation of emergency lights during an emergency situation. A need therefore exists to improve the observation of emergency lights for a vehicle regardless of the location of the observer. A need also exists to improve the flexibility of placement of emergency lights upon a vehicle for observation by individuals during emergency situations.

A need exists to reduce the size of light sources on an emergency vehicle and to improve the efficiency of the light sources particularly with respect to current draw and reduced aerodynamic drag. In addition, the flexibility of positioning of light sources about a vehicle for observation by individuals is required to be enhanced to optimize utility for a warning signal light. In order to satisfy these and other needs, more spatially efficient light sources such as LED's are required. It is also necessary to provide alternative colored LED light sources which may be electrically controlled for the provision of any desired pattern of light signal such as flashing, alternating, pulsating, oscillating, variable, modulating, rotational, and/or strobe light effects without the necessity of spatially inefficient and bulky mechanical devices.

In the past, illumination of an area to the front or to the sides of an emergency vehicle during low light conditions has been problematic. Take-down lights have been utilized by law enforcement personnel for a number of purposes including, but not necessarily limited to, enhancing observation of an individual in a vehicle on a roadway subject to investigation and to hide the location of an officer, or to block or deter observation of an officer by individuals during law enforcement activities.

The take-down lights as known have generally been formed of halogen or gaseous discharge xenon lamp illumination sources which have a relatively short useful life, are bulky, have relatively large current draw requirements, and which require frequent replacement. A need exists for a take-down light which has significant illumination characteristics, is spatially efficient, has a long useful life, and has reduced current draw requirements for use on a law enforcement vehicle or as used as a utility light source.

The alley lights as known also suffer from the deficiencies as identified for the take-down lights during dark illumination conditions. Alley lights are used to illuminate areas adjacent to the sides of a vehicle.

In the past, the intersection clearing lights have been predominately formed of halogen, incandescent, and/or gaseous discharge xenon illumination sources. The drawbacks associated with these types of illumination sources are the relatively high current draw, reduced useful life and durability necessitating frequent replacement, large RF electromagnetic emissions which increase radio interference and other draw backs as previously discussed. A need therefore exists for an intersection clearing light which solves these and other identified problems and which further has significant illumination characteristics, is spatially efficient, has a long useful life, and has reduced current draw requirements for use on a vehicle or as a utility light source.

A problem has also existed with respect to the use of emergency lights on unmarked law enforcement vehicles. In the past, emergency lights for unmarked law enforcement vehicles have consisted of dome devices which are formed of revolving mechanisms. These lights are usually withdrawn from a storage position under a motor vehicle seat for placement upon dashboard of a law enforcement vehicle. In undercover situations it has been relatively easy to identify dashboard affixation mechanisms used to secure these types of dome illumination devices to a dashboard. The known dome devices are also clumsy, have large current draw requirements, and are difficult to store in a convenient location for retrieval in an emergency situation by an individual. A need therefore exists for an emergency vehicle or utility warning light which is spatially efficient, easily hidden from view, and is transportable by an individual for retrieval during an emergency situation.

A need also exists for a new emergency vehicle light bar which is aerodynamic and which provides for both a longitudinal illumination element and an elevated pod illumination device. A need exists for a light bar having enhanced illumination properties and flexibility for provision of new and additional warning light signals including, but not limited to, strobe, variable, modulated, alternating, pulsating, rotational, oscillating, flashing, and/or sequential light signals for use within an emergency situation.

GENERAL DESCRIPTION OF THE INVENTION

According to the invention, there is provided a light emitting diode (LED) warning signal light which may be depicted in several embodiments. In general, the warning signal light may be formed of a single row or an array of light emitting diode light sources configured on a light support and in electrical communication with a controller and a power supply, battery, or other electrical source. The warning signal light may provide various light signals, colored light signals, or combination light signals for use in association with a vehicle or by an individual. These light signals may include a strobe light, a pulsating light, a revolving light, a flashing light, a modulated or variable intensity light, an oscillating light, an alternating light, and/or any combination thereof. Additionally, the warning signal light may be capable of displaying symbols, characters, or arrows. Rotating and oscillating light signals may be produced by sequentially illuminating columns of LED's on a stationary light support in combination with the provision of variable power intensity from the controller. However, the warning signal light may also be rotated or oscillated via mechanical means. The warning signal light may also be transportable and may be conveniently connected to a stand such as a tripod for electrical connection to a power supply, battery, or other electrical source as a remote stand-alone signaling device.

For the replacement LED lamp, extending from the standard mounting base may be a light source which one or a plurality of LED lamp modules which may be formed of the same or different colors as desired by an individual. Additionally, rotating and oscillating light signals may be produced by substitution of an LED light source in an oscillating or reflective light assembly. In addition, the warning signal light and/or replacement warning signal light may be electrically coupled to a controller used to modulate the power intensity for the light sources to provide for various patterns of illumination to create an illusion of rotation or other type of illusion for the warning signal light without the use of mechanical devices.

A reflective light assembly may also be provided. The reflective light assembly may rotate about a stationary light source or the light source may rotate about a stationary reflector. In another alternative embodiment, the reflective assembly may be positioned at an acute angle of approximately 45° above a stationary LED panel or solitary light source, where the reflector may be rotated about a pivot point and axis to create the appearance of rotation for the light source. The light source may be utilized in conjunction with the reflective assembly and may also be electrically coupled to a controller for the provision of pulsating, oscillating, alternating, flashing, stroboscopic, revolving, variable, and/or modulated light intensity for observation by an individual.

The controller is preferably in electrical communication with the power supply and the LED's to modulate the power intensity for the LED light sources for provision of a desired type of warning light effect.

The warning signal light may be formed of an array of LED's, a single row of LED's or a solitary LED mounted upon and in electrical communication with a substantially flat light support which includes a circuit board or LED mounting surface. The light support may have any desired dimensions and may be approximately three inches by three inches or smaller at the discretion of an individual. Each light support may include an adhesive, magnetic, and/or other affixation mechanism to facilitate attachment at various locations on and/or around an emergency vehicle. Each individual light support may be positioned adjacent to and be in electrical communication with another light support through the use of suitable electrical connections. A plurality of light supports or solitary light sources may be electrically coupled in either a parallel or series manner to the controller. A plurality of light sources each containing an array or singular LED may be in electrical communication with a powers supply and a controller to selectively illuminate the LED's to provide for the appearance of a revolving, modulating, strobe, oscillating, alternating, pulsating, and/or a flashing light source or any combination thereof. The controller is also preferably in electrical communication with the power supply and the LED's, to regulate or modulate the power intensity for the LED light sources for variable illumination of the LED light sources as observed by an individual. The warning signal lights may encircle an emergency vehicle at the discretion of an individual. In addition, the light support may be encased within a waterproof enclosure to prevent moisture or other contamination of the LED light sources.

The individual LED's and/or arrays of LED's may be used as take-down and/or alley lights by law enforcement vehicles to illuminate dark areas relative to the emergency vehicle. The take-down light source may be stationary or may be coupled to one or more rotational mechanisms at the discretion of an individual. The intersection clearing light may be a particular application of the alley light as mounted to a motor for oscillation of the light source forwardly and rearwardly relative to an emergency vehicle. The intersection clearing mode preferably rotates or oscillates the alley lights forwardly and rearwardly on both sides of a light bar or emergency vehicle as the emergency vehicle enters an intersection. The intersection clearing light mode preferably warns all traffic perpendicular to the direction of travel of the emergency vehicle as to the presence of an emergency vehicle within an intersection. The intersection clearing light may be mounted to each exterior end of a light bar. When the intersection clearing light mode is not in operation the alley light or take-down light may be used to provide illumination at any desired angle relative to the passenger or drivers areas of an emergency vehicle.

A portable pocket LED warning signal light may also be provided having a base and a power adaptor for use in unmarked law enforcement vehicles. The portable pocket LED warning signal light may also be connected to, or have, an integral controller for the provision of a variety of unique light signals including but not necessarily limited to rotational, alternating, pulsating, oscillating, flashing, modulated, strobe, and/or sequential illumination of rows or columns of LED's. The portable pocket LED may also include one or more reflective culminators to enhance the performance of the warning or utility signal light.

A new and unique light bar may also be provided having one or more elevated pod illumination elements. Each pod illumination element may be raised with respect to a light bar by one or more supports which extend upwardly from the base. The pod illumination elements may alternatively be oval or circular in shape at the discretion of an individual. The light bar may also include one or more longitudinal light elements integral to the base which extend transversely to the roof of an emergency vehicle. The longitudinal light elements may be configured similar to light bars as described and depicted in FIGS. 32, 36, 37, 38, 39, and 50.

A principal advantage of the present invention is to provide a warning signal light capable of simulating revolving or oscillating light signals without the use of mechanical components.

Another principal advantage of the present invention is that the warning signal light is capable of producing several different types of light signals or combinations of light signals.

Still another principal advantage of the present invention is to be rugged and to have a relatively longer life cycle than traditional warning signal lights.

Still another principal advantage of the present invention is to produce a truer or pure light output color without the use of filters.

Still another principal advantage of the present invention is to allow the user to adjust the color of the light signal without having to make a physical adjustment to the light source from a multi-colored panel.

Still another principal advantage of the present invention is that it may be formed into various shapes. This allows the invention to be customized for the particular need.

Still another principal advantage of the present invention is the provision of an LED light source which is formed of a relatively simple and inexpensive design, construction, and operation and which fulfills the intended purpose without fear of failure or risk of injury to persons and/or damage to property.

Still another principal advantage of the present invention is the provision of an LED light source which is flexible and which may easily replace existing illumination devices used as turn signals, brake lights, back-up lights, marker lights, and headlights in utility lens/reflector enclosures.

Still another principal advantage of the present invention is the provision of an LED light source for creation of bright bursts of intense white or colored light to enhance the visibility and safety of a vehicle in an emergency signaling situation.

Still another principal advantage of the present invention is the provision of an LED light source which is flexible and may easily replace existing illumination devices at a much more economic expense and further having a reduced failure rate.

Still another principal advantage of the present invention is the provision of an LED light source which produces brilliant lighting in any of the colors associated with an emergency vehicle light signal such as red, blue, amber, green, and/or white.

Still another principal advantage of the present invention is the provision of an LED light source which is highly resistant to corrosive effects and which is impervious to moisture build-up.

Still another principal advantage of the present invention is the provision of an LED light source which has an extended life cycle and continues to operate at maximum efficiency throughout its life cycle.

Still another principal advantage of the present invention is the provision of an LED light source which draws less current and/or has a reduced power requirement from a power source for a vehicle.

Still another principal advantage of the present invention is the provision of an LED light source which is simple and may facilitate the ease of installation and replacement of a xenon, halogen, and/or incandescent light source from a motor vehicle.

Still another principal advantage of the present invention is the provision of an LED light source which reduces RF emissions which may interfere with other radio and electronic equipment in an emergency vehicle.

Still another principal advantage of the present invention is the provision of an LED light source which functions under cooler operating temperatures and conditions thereby minimizing the exposure of heat to adjacent component parts which, in turn, reduces damage caused by excessive heat.

Still another principal advantage of the present invention is the provision of an LED light source having simplified electronic circuitry for operation as compared to xenon gaseous discharge lamps, halogen lamps, and/or incandescent lamps as used with an emergency vehicle.

Still another principal advantage of the present invention is the provision of a warning signal light which may be easily visualized during emergency situations thereby enhancing the safety of emergency personnel.

Still another principal advantage of the present invention is the provision of a warning signal light which includes LED technology and which is operated by a controller to provide any desired type or color of light signal including but not limited to rotational, pulsating, oscillating, strobe, flashing, alternating, and/or modulated light signals without the necessity for mechanical devices.

Still another principal advantage of the present invention is the provision of a warning signal light which is capable of simultaneously producing several different types of light signals.

Still another principal advantage of the present invention is the provision of a warning signal light which includes light emitting diode technology which is flexible and which may be attached to any desired location about the exterior of an emergency vehicle.

Still another principal advantage of the present invention is the provision of an emergency warning signal light for emergency vehicles which has improved visualization, aerodynamic efficiency, and increased electrical efficiency.

Still another principal advantage of the present invention is the provision of an LED light source which is flexible and which may be connected to a modulated power source to provide variable power intensity for the light source which in turn is used to create the appearance of rotation and/or oscillation without the use of mechanical rotation or oscillating devices.

Still another principal advantage of the present invention is the provision of an LED take-down light which provides significant illumination properties for flooding of an area in front of a law enforcement vehicle with light during dark illumination conditions.

Still another principal advantage of the present invention is the provision of an LED alley light which has significant illumination characteristics for flooding of an area to the sides of a law enforcement vehicle with light during dark illumination conditions.

Still another principal advantage of the present invention is the provision of an LED alley light which may be rotated for illumination of areas adjacent to a law enforcement vehicle.

Still another principal advantage of the present invention is the provision of an LED take-down light which enables a law enforcement officer to easily visualize the occupants of a vehicle disposed in front of a law enforcement vehicle.

Still another principal object of the present invention is the provision of an LED take-down light which has significant illumination characteristics which prohibits an individual located in a temporarily stopped vehicle from observing the location or actions or law enforcement personnel within or adjacent to a law enforcement vehicle.

Still another principal advantage of the present invention is the provision of an LED take-down light and/or alley light having prolonged useful life for use on a law enforcement vehicle.

Still another principal advantage of the present invention is the provision of an LED take-down or alley light which is formed of sturdy construction having reduced current draw requirements for a law enforcement vehicle.

Still another principal advantage of the present invention is the provision of an LED take-down or alley light which is spatially efficient for use upon a law enforcement vehicle.

Still another principal advantage of the present invention is the provision of an LED pocket warning signal light for use with unmarked law enforcement vehicles.

Still another principal advantage of the present invention is the provision of an LED warning signal light which eliminates the necessity for bulky rotational mechanisms.

Still another principal advantage of the present invention is the provision of an LED warning signal light which may be easily carried within the pocket of an undercover law enforcement officer.

Still another principal advantage of the present invention is the provision of an LED warning signal light which may be easily retrieved for use upon an emergency vehicle.

Still another principal advantage of the present invention is the provision of an LED warning signal light which may be easily connected to a power source of a law enforcement vehicle.

Still another principal advantage of the present invention is the provision of an LED warning signal light which may be easily positioned upon the dash board of a law enforcement vehicle.

Still another principal advantage of the present invention is the provision of an LED warning signal light which may be easily and completely hidden from view during periods of non-use.

Still another principal advantage of the present invention is the provision of an LED light bar which is aerodynamically efficient for use upon an emergency vehicle.

Still another principal advantage of the present invention is the provision of an LED light bar which is aesthetically pleasing in visual appearance for use upon an emergency vehicle.

Still another principal advantage of the present invention is the provision of an LED light bar which may easily replace an existing light bar for an emergency vehicle.

Still another principal advantage of the present invention is the provision of an LED light bar having improved flexibility for providing alternative and unique light signals or lighting effects for use with an emergency vehicle.

Still another principal advantage of the present invention is the provision of an LED alley light which is visible to traffic perpendicular to the direction of travel of an emergency vehicle within an intersection.

Still another principal advantage of the present invention is the provision of an LED alley light which reduces RF electromagnetic and/or radio emission interference for an emergency vehicle.

Still another principal advantage of the present invention is the provision of an LED alley light which is a longer useful life for use upon an emergency vehicle.

Still another principal advantage of the present invention is the provision of an LED alley light which may easily adapted for use within existing light bar for an emergency vehicle.

Still another principal advantage of the present invention is the provision of a warning signal light which may be easily customized by the user via the use of a microprocessor/controller.

Still another principal advantage of the present invention is the provision of an LED light source having improved reliability as compared to xenon gaseous discharge lamps and/or incandescent lamps as currently used in association with emergency vehicles.

A feature of the invention is the provision of a plurality of light emitting diodes (LED's), integral to a circuit board or LED mounting surface, where the LED's may be aligned in a single row or in vertical columns and horizontal rows.

Another feature of the invention is the mounting of a panel of LED's to a mechanical device which rotates or oscillates the panel during use as a warning signal light on an emergency vehicle.

Yet another feature of the invention is the provision of a plurality of LED's mounted to a flexible circuit board which may be manipulated into any desired configuration and which may be used to produce rotating, oscillating, pulsating, flashing, alternating, and/or modulated warning signal light for an emergency vehicle.

Yet another feature of the invention is the provision of an LED support member supporting an array of colored LED's and a controller capable of selectively illuminating the LED's of the same color to produce a single or mixed colored light signal.

Still another feature of the invention is the provision of a light emitting diode support member having an array of LED's disposed about at least two sides and a controller capable of producing light signals on each side which are independent and/or different from each other.

Still another feature of the invention is the provision of an LED support member having an array of LED's angularly offset with respect to the LED support member for the provision of a horizontal light signal as viewed by an individual when the LED support member is mounted within the interior of the forward or rear windshield of a vehicle.

Still another feature of the invention is the provision of an LED support member which may be easily connectable and/or removed from a transportable support such as a tripod for placement of an LED warning signal light at any location as desired by an individual.

Still another feature of the invention is the provision of an LED support member which may be easily connectable to an emergency vehicle, including but not limited to automobiles, ambulances, trucks, motorcycles, snowmobiles, and/or any other type of vehicle in which warning signal or emergency lights are utilized.

Still another feature of the present invention is the provision a base having one or more LED's mounted thereon where said base is adapted for insertion into a standard one inch opening presently used for receiving xenon strobe tubes as a replacement LED warning light signaling light source.

Still another feature of the present invention is the provision a base having one or more LED's mounted thereon which is adapted for insertion into a mechanical device which rotates or oscillates a light source during use as a warning signal light on an emergency vehicle.

Still another feature of the present invention is the provision a microprocessor/controller which is in electrical communication with the LED light sources to selectively activate individual LED's to produce a flashing, strobe, alternating, rotating, oscillating, modulated and/or pulsating warning light signals.

Still another feature of the present invention is the provision an LED light signal which may be easily electrically coupled to a controller.

Still another feature of the present invention is the provision a warning signal light having a plurality of strip LED light sources affixed to the exterior of an emergency vehicle where the strip LED light sources are in electrical communication with a controller.

Still another feature of the present invention is the provision a warning signal light having a controller in electrical communication with a plurality of strip LED light sources for the provision of modulated power intensity utilized to create the appearance of a rotational, pulsating, oscillating, flashing, strobe, or alternating warning light signal.

Still another feature of the present invention is the provision an LED light source where the power may be modulated by the controller to produce variable power intensity for the light sources to produce various desired patterns of illumination.

Still another feature of the present invention is the provision of a warning signal light having LED technology which includes an array, a single row or a solitary LED light source mounted to a light support.

Still another feature of the present invention is the provision of a strip warning signal light having LED technology which includes a light support having one or more LED light sources where the light support has a size dimension approximating three inches by three inches or smaller.

Still another feature of the present invention is the provision of a strip warning signal light having LED technology where a plurality of strip LED light supports may be affixed in surrounding engagement to the exterior of an emergency vehicle.

Still another feature of the present invention is the provision of a strip warning signal light having LED technology where a light support is enclosed within a transparent and water resilient enclosure to prevent water penetration and/or other contamination.

Still another feature of the present invention is the provision of a warning signal light having a plurality of light supports affixed to the exterior of an emergency vehicle where the controller is in electrical communication with each of the light supports.

Still another feature of the present invention is the provision of a warning signal light having a controller in electrical communication with a single light source for the provision of a modulated power intensity to the light source.

Still another feature of the present invention is the provision of an LED light source where the power may be modulated by the controller to produce variable power intensity for the light source to provide various desired patterns or combinations of patterns of illumination.

Still another feature of the present invention is the provision of an LED light source which includes a reflective device which rotates about the LED light source to provide a warning light signal.

Still another feature of the present invention is the provision of an LED light source which includes a reflective device which is flat, concave, convex and/or parabolic for reflection of the light emitted for the LED light source.

Still another feature of the present invention is the provision of an LED light source which includes a reflector mounted at an acute angel of approximately 45 degrees relative to the LED light source for reflection of light in a direction as desired by an individual.

Still another feature of the present invention is the provision of an LED light source which includes a reflector mounted at an acute angle of approximately 45 degrees relative to the LED light source where the reflector may be rotated about the LED light source for reflection of light in a direction as desired by an individual.

Still another feature of the present invention is the provision of an LED light source where a single LED light source or an array of LED light sources may be rotated and simultaneously a reflective device may be rotated to provide a warning signal light.

Still another feature of the present invention is the provision of an LED light source which may include a conical shaped reflector positioned above a light source.

Still another feature of the present invention is the provision of a rotatable or stationary filter mounted between an LED light source and a reflector.

Still another feature of the present invention is the provision of a rotatable or stationary reflector or culminator which may include transparent and/or reflective sections.

Still another feature of the present invention is the provision of an LED light source where the individual LED light sources or arrays of LED light sources may be rotated for transmission of light through the transparent and/or opaque sections of a filter for the provision of a unique warning signal light effect.

Still another feature of the present invention is the provision of a conical reflector which may include concave and/or convex reflective surfaces to assist in the reflection of light emitted from an LED light source.

Still another feature of the present invention is the provision of an LED light support having a longitudinal dimension and a single row of LED's which provide a desired type of warning light signal.

Still another feature of the present invention is the provision of an LED light support having a frame adapted to hold a circuit board or LED mounting surface.

Still another feature of the present invention is the provision of an LED light support where the circuit board or LED mounting surface includes one or more heat sink wells where an individual LED is positioned within each of the heat sink wells.

Still another feature of the present invention is the provision of an LED light support having one or more reflectors or elongate mirrors disposed in the frame to reflect light emitted from the LED light sources is a desired direction.

Still another feature of the present invention is the provision of an LED light support having a culminator reflector which may be formed of one or more conical reflector cups which are utilized to reflect light emitted from the light sources in a direction desired by an individual.

Still another feature of the present invention is the provision of an LED light support having a lens cover attached to the frame to minimize water penetration or contamination exposure into the interior of the frame.

Still another feature of the present invention is the provision of an LED light support having a positioning support functioning as a culminator reflector which additionally positions individual LED's at a desired location relative to the interior of the frame.

Still another feature of the present invention is the provision of an LED light support having a switch which may be manipulated to terminate power from a power supply or to terminate communication to a controller.

Still another feature of the present invention is the provision of an LED light support having an affixation mechanism which may be integral or attached to the frame where the affixation mechanism is adapted to enable the light support to be secured to a vehicle at a desired location.

A feature of the present invention is the provision of an LED take-down light having a single LED or an array of LED's of white colored light for illumination of an area in front of a law enforcement vehicle during dark illumination periods.

Still another feature of the present invention is the provision of an LED take-down light incorporated into a light bar having reflectors or culminators and LED illumination sources of white colored light for illumination of an area in front of a law enforcement vehicle during dark illumination periods.

Still another feature of the present invention is the provision of an LED take-down light formed of one or more LED light sources of white colored light as connected to, or integral with, a circuit board which is electrically coupled to a power source for an emergency vehicle.

Still another feature of the present invention is the provision of an LED alley light having a single LED or an array of LED's of white colored light for illumination of an area to the sides of an emergency vehicle during dark illumination periods.

Still another feature of the present invention is the provision of an LED alley light which may be mounted to rotational device for providing illumination at acute angles relative to the sides of an emergency vehicle.

Still another feature of the present invention is the provision of an LED alley light having one or more culminators integral to each individual LED light source to reflect light along a desired line of illumination to the sides of an emergency vehicle.

Still another feature of the present invention is the provision of an LED warning signal light which is sized and marked to provide the appearance of a small pocket calculator.

Still another feature of the present invention is the provision of an LED personal warning signal light having one or more culminator is positioned adjacent to each individual LED light source to reflect light along a desired line of illumination.

Still another feature of the present invention is the provision of an LED personal warning signal light having a pliable spine for exposure of two faces where each face may contain a plurality of LED light sources.

Still another feature of the present invention is the provision of an LED warning signal light having plug-in connectors for coupling to an electrical power source for an emergency vehicle such as a cigarette lighter receptacle.

Still another feature of the present invention is the provision of an LED personal warning signal light having at least one illumination face including a plurality of colored LED light sources.

Still another feature of the present invention is the provision of an LED personal warning signal light which includes a battery for provision of a light signal when connection to an electrical power source is not immediately available.

Still another feature of the present invention is the provision of an LED personal warning signal light which may be easily transported within the pocket of an individual and hidden from view during undercover operations by law enforcement personnel.

Still another feature of the present invention is the provision of an LED light bar having one or more supported or elevated pod illumination elements.

Still another feature of the present invention is the provision of an LED light bar having longitudinally extending illumination elements.

Still another feature of the present invention is the provision of an LED light bar having oval or circular pod illumination elements.

Still another feature of the present invention is the provision of an LED light bar having end cap illumination elements which are integral to the distal ends of the longitudinally extending illumination elements.

Still another feature of the present invention is the provision of an LED intersection clearing light signal to oscillate the alley light 45° forwardly and 45° rearwardly to a perpendicular axis for an emergency vehicle for communication to traffic adjacent to an intersection as to the presence of an emergency vehicle and/or emergency situation.

Still another feature of the present invention is the provision of an LED intersection clearing light signal which is generally not used simultaneously to an alley light for an emergency vehicle.

Still another feature of the present invention is the provision of an LED intersection clearing light signal which oscillates forwardly and rearwardly from the sides of an emergency vehicle to communicate the presence of the emergency vehicle within an intersection.

BRIEF DESCRIPTION OF THE DRAWINGS

FIG. 3 is a perspective view of a warning signal light attached to a gyrator according to an embodiment of the invention;

FIG. 5 is a perspective view of a warning signal light according to an embodiment of the invention depicting sequential activation of rows of LED's;

FIG. 6 is a perspective view of a warning light signal according to an embodiment of the invention;

FIG. 36 is an alternative detailed view of a circuit board or LED mounting surface having heat sink wells;

FIG. 37 is an alternative detailed isometric view of a reflector assembly;

FIG. 38 is an alternative cross-sectional side view of the frame of a reflector assembly;

FIG. 39 is an alternative cross-sectional side view of a frame of a reflector assembly;

FIG. 42 is an alternative detailed side view of a reflector assembly;

FIG. 43 is a graphical representation of a modulated or variable light intensity curve;

FIG. 48 is a detailed back view of an individual LED light source;

FIG. 49 is a detailed front view of an individual LED light source;

FIG. 53 is a block diagram of an electrical schematic of an embodiment of the invention;

FIG. 54 is a block diagram of an electrical schematic of an embodiment of the invention;

FIG. 63 is an isometric view of an LED light bar for an emergency vehicle;

FIG. 64 is a side view of an LED light bar for an emergency vehicle;

FIG. 65 is a cross-sectional top view of the take-down and alley light; and

DETAILED DESCRIPTION OF THE PREFERRED EMBODIMENTS

Figure 1:
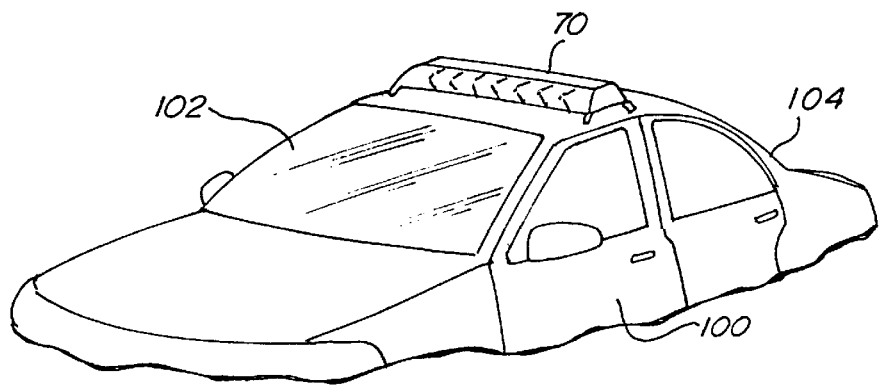
FIG. 1 is a partial perspective view of an emergency vehicle equipped with a light bar containing warning signal lights according to an embodiment of the invention.
Figure 2:
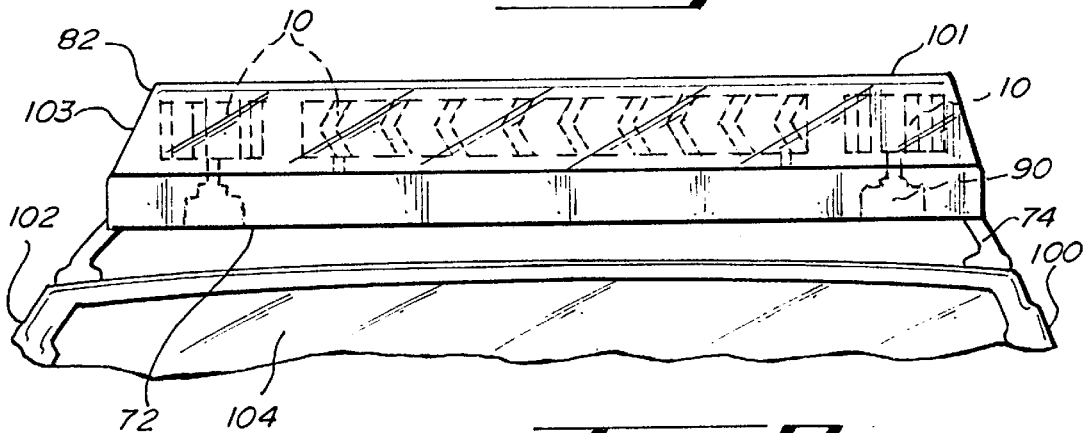
FIG. 2 is a partial front elevation view of an emergency vehicle equipped with a light bar containing warning signal lights referring to an embodiment of the invention.

A warning signal light according to the principles of the invention is indicated generally herein as numeral 10. FIGS. 1 and 2 depict light bar 70 mounted to an emergency vehicle 104. Light bar 70 includes base 72, mounting means 74, cover 82, and warning signal lights 10. Also included in light bar 70 are gyrators 90 used to impart motion to warning signal lights 10.

Figure 9:
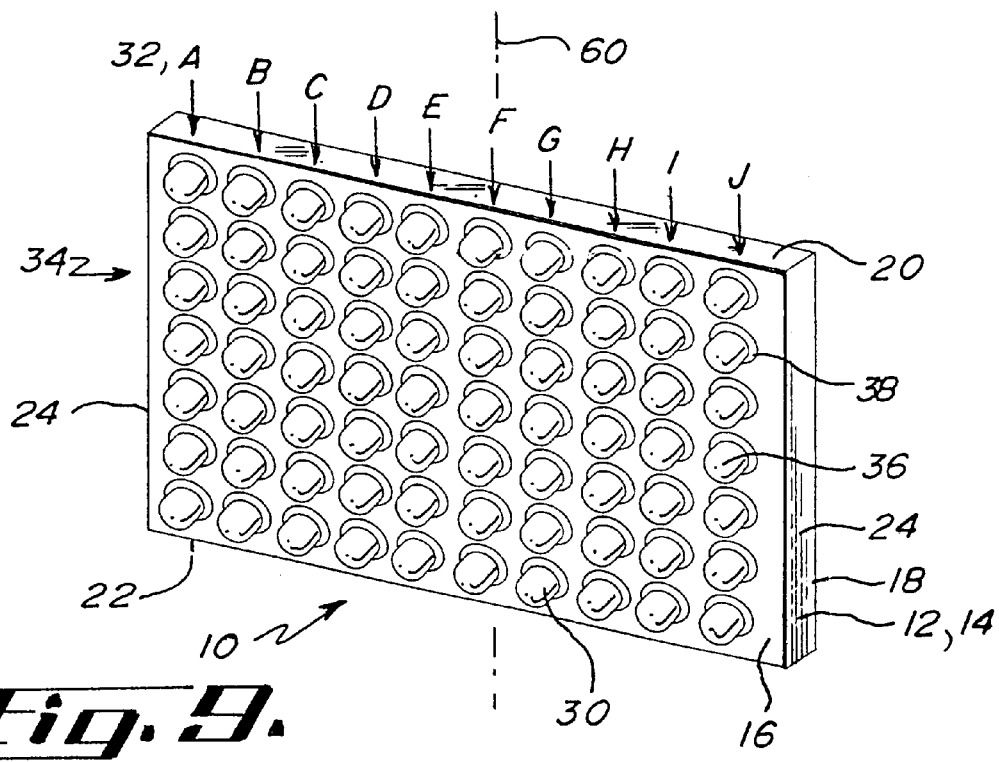
FIG. 9 is a perspective view of a warning light signal according to an embodiment of the invention.

Referring to FIGS. 3 and 9, warning signal light 10 comprises light support 12, light sources 30, controller 50 (shown in FIG. 11), and connecting portion 40 for attaching the warning signal light 10 to light bar 70 or gyrator 90. The warning signal light 10 operates to create a warning signal for use by an emergency vehicle 104 by selectively activating light sources 30 using controller 50. Alternatively, warning signal light 10 may be formed of a solitary LED light source 30 at the discretion of an individual.

Figure 7:
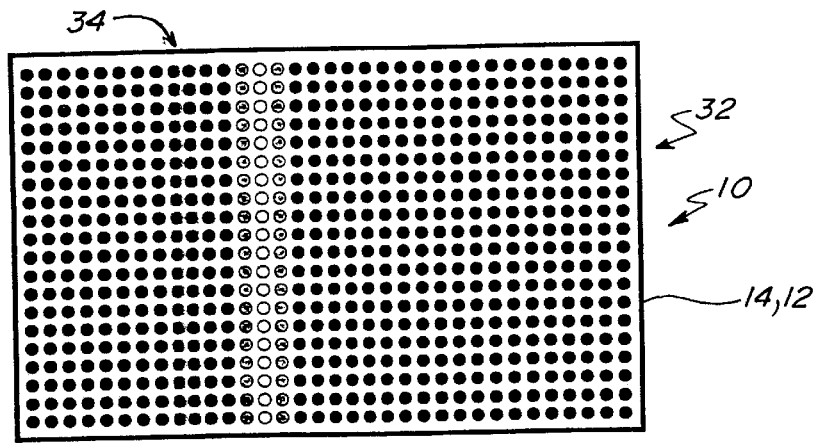
FIG. 7 is a perspective view of a warning light signal according to an embodiment of the invention.

Light sources 30 are preferably light emitting diodes (LED's) and are generally arranged in aligned columns 32 and rows 34 as shown in FIGS. 7 and 9. Each of the light emitting diodes (LED's) may have shoulder portion 38 adjacent LED support 12 and dome 36. LED's 30 are situated to be in electric communication with controller 50 and a power supply, a battery, or power source. The use of light emitting diodes (LED's) to replace traditional halogen, incandescent, or gaseous discharge xenon lamps reduces heat generation, current draw, and electromagnetic emissions, while increasing lamp life and producing a more true output light color.

The controller 50 is used to selectively activate columns 32, rows 34, or individual LED's 30, to illuminate any number of a plurality of visually distinct types of warning light signals at any moment; to illuminate more than one of a plurality of visually distinct types of warning light signals simultaneously at any moment; to illuminate one of a plurality of combinations or patterns of visually distinct warning light signals at any moment, or over any desired period of time, or to illuminate more than one of a plurality of combinations or patterns of visually distinct warning light signals over any desired period of time. The plurality of visually distinct warning light signals may include, but are not necessarily limited to, a strobe light signal, a pulsating light signal, an alternating light, a modulated light signal, a flashing light signal, the illusion of a rotating or an oscillating light signal, a reverse character message, or images such as arrows. It should be noted that the controller 50 may also incorporate into any selected warning light signal variable or modulated power intensity to facilitate the provision of a desired unique lighting effect. For example, the controller 50 may illuminate one or more LED light sources 30 to establish a single warning light signal at a given moment. Alternatively, the controller 50 may illuminate one or more light emitting diode light sources 30 to provide two or more warning light signals at any given moment. Further, the controller 50 may simultaneously, consecutively, or alternatively, illuminate one or more LED light sources 30 to establish any desired combination or pattern of illuminated visually distinct warning light signals at any given moment or over a desired period of time. The combination and/or pattern of visually distinct warning light signals may be random or may be cycled as desired by an individual. The illumination of one or more patterns or combinations of warning light signals facilitates the continued observation by an individual. Occasionally, the concentration or attention of an individual is diminished when exposed to a repetitive or to a monotonous light signal. The desired purpose for illumination of a warning light signal is thereby reduced. The provision of a pattern, combination, and/or random illumination of visually distinct warning light signals maximizes the concentration or attention to be received from an individual observing a warning light signal. The purpose of the warning light signal is thereby promoted.

Figure 11A:
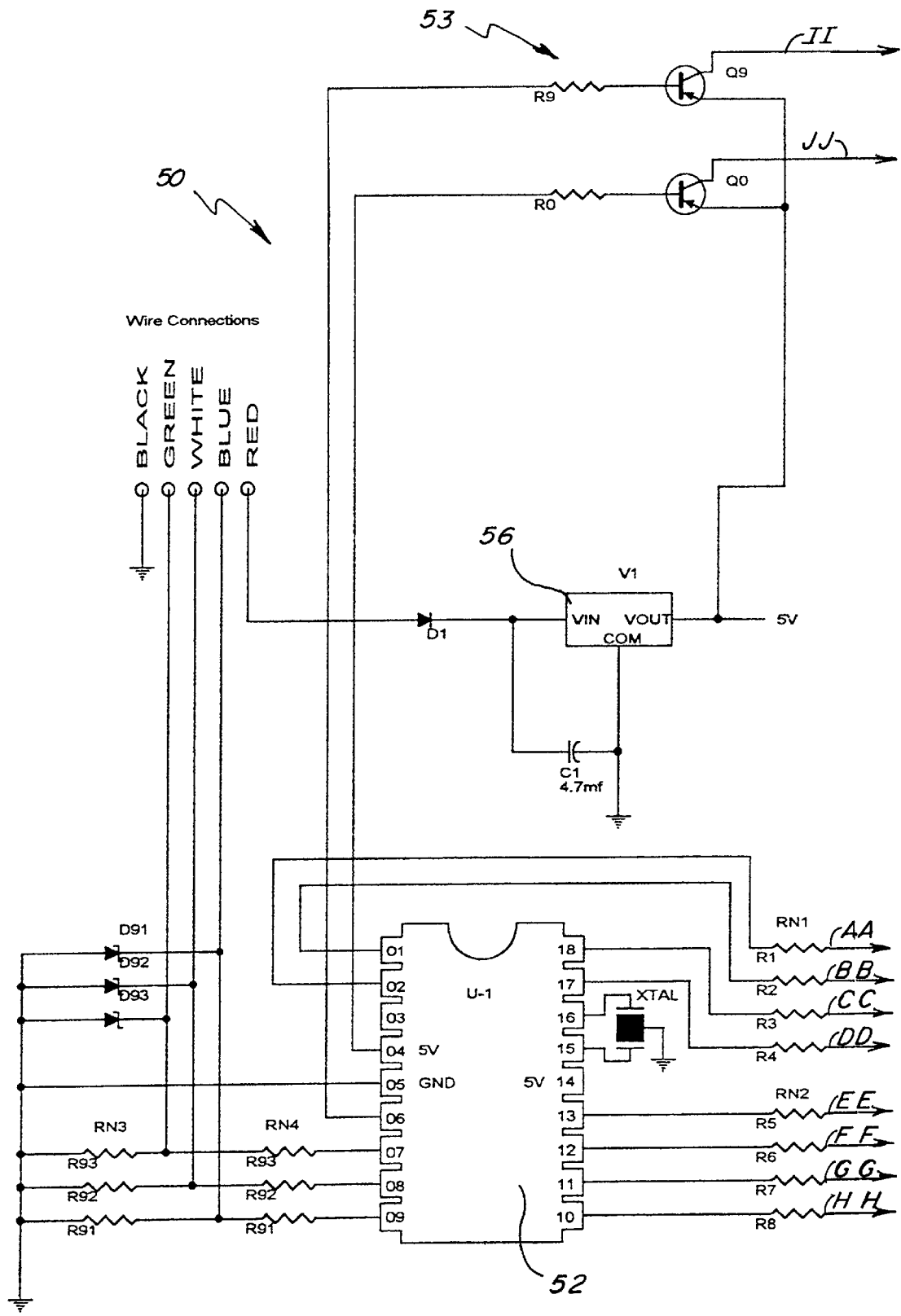
FIGS. 11A, 11B, and 11C are schematic diagrams of the controller circuitry in accordance with an embodiment of the invention.
Figure 11B:
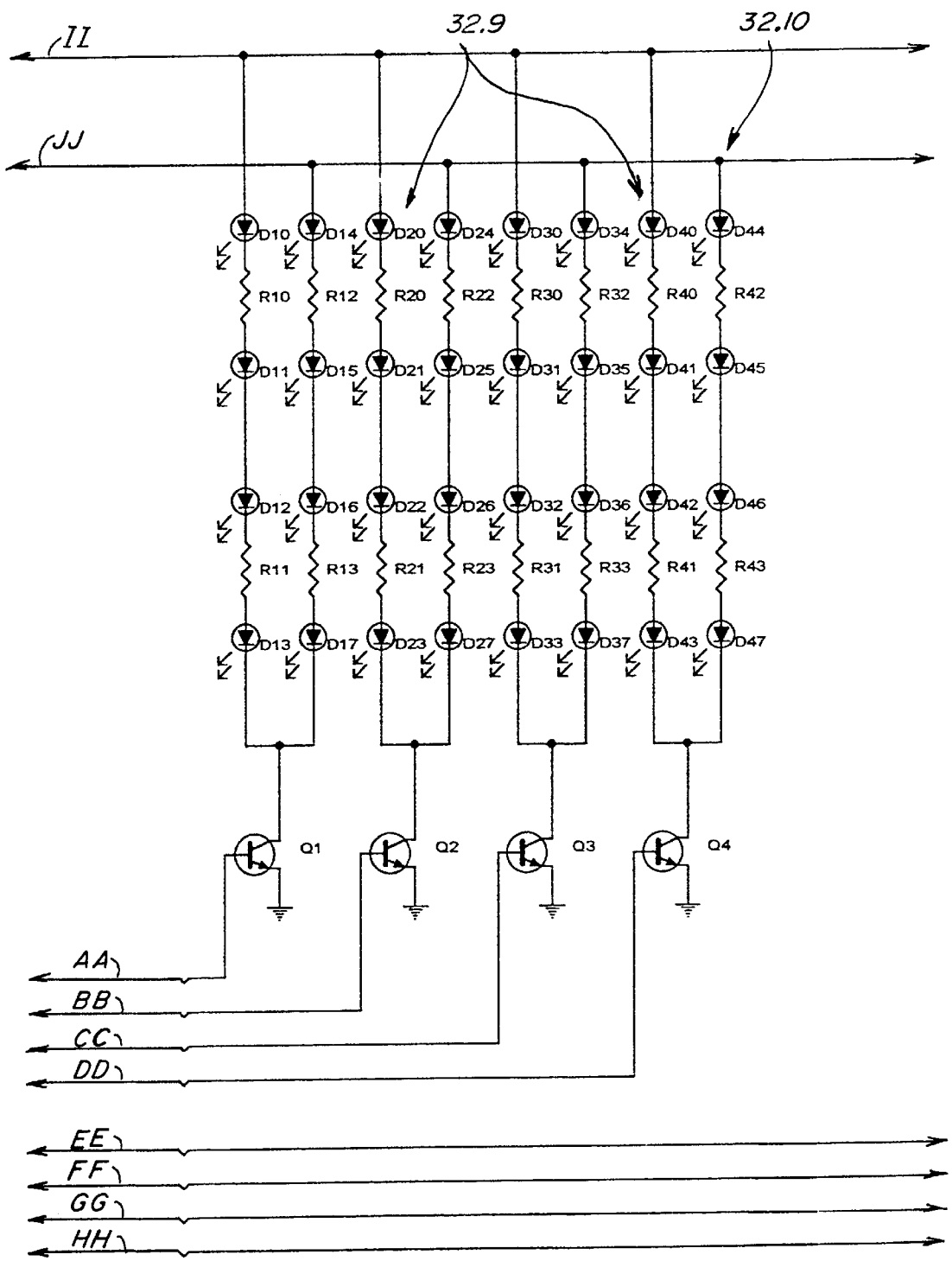
Figure 11C:
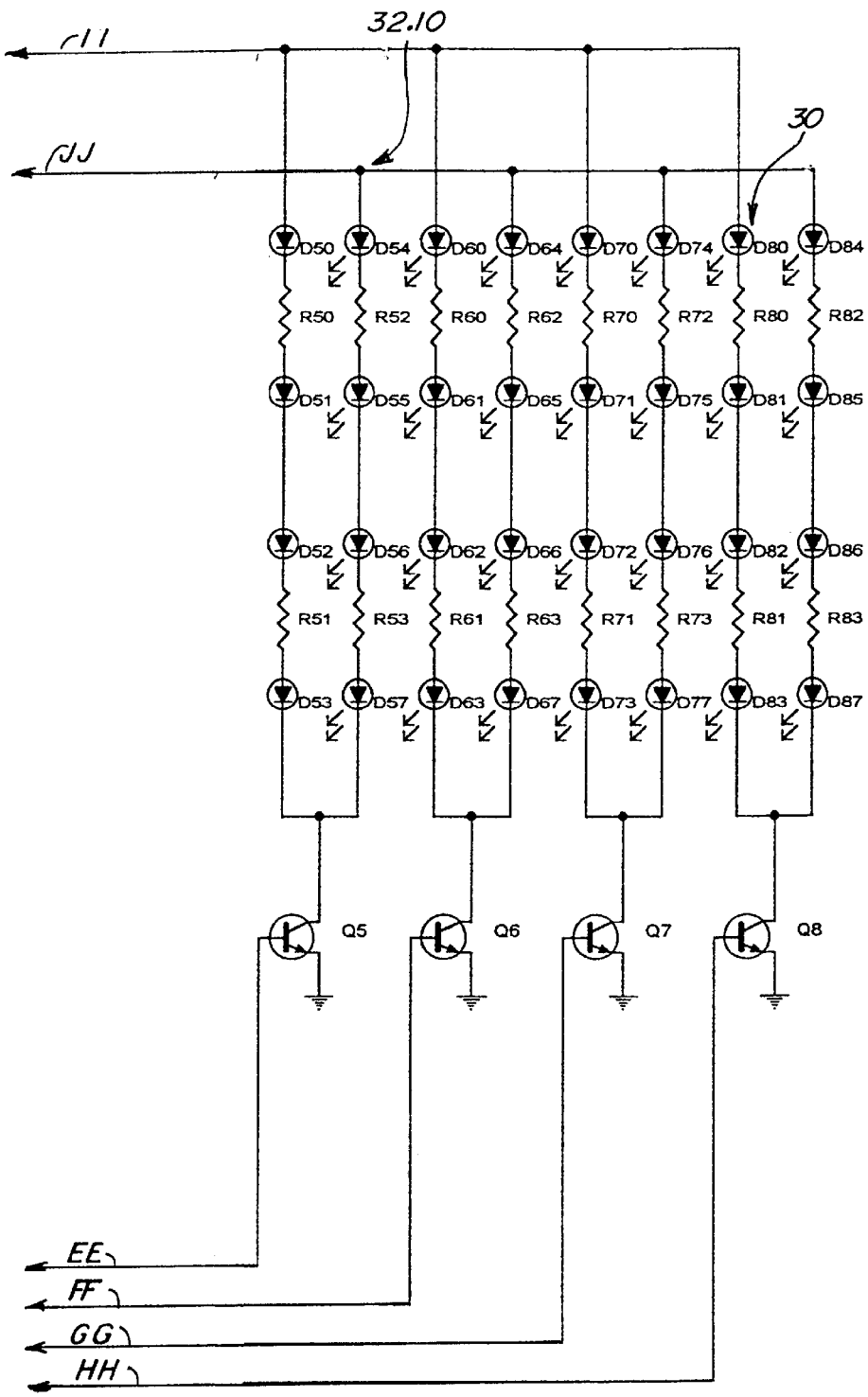

FIGS. 11A, 11B, and 11C show an embodiment of controller 50 capable of selectively activating columns 32, rows 34 or individual LED's 30. Controller 50 generally comprises microprocessor 52 and circuitry 53 and is preferably contained within, attached to, or an element of, LED support 12. It is envisioned that controller 50 may be programmed by an external controller 55 and powered through cable R.

In one embodiment, controller 50 generally comprises circuit board 54 or LED mounting surface having microprocessor 52 attached to a low voltage power supply, battery, or electrical source 56. Microprocessor 52 is configured through circuitry 53 to selectively activate columns 32 of LED's 30. Transistors Q9 and Q10 are in electronic communication with microprocessor 52, power supply, battery, or electrical source 56, and their respective columns 32.9 and 32.10 of LED's 30. Columns 32 of LED's 30 are connected to transistors Q1–Q8, which are in turn connected to microprocessor 52 through resistors R1–R8. Microprocessor 52 is capable of selectively activating transistors Q1–Q8 to allow current flowing through transistors Q9 and Q10 to activate the selected column 32 of LED's 30. This circuit is capable of producing a strobe light signal, an alternating light signal, a modulated signal, a revolving light signal, a pulsating light signal, an oscillating light signal, or flashing light signal, a reverse character message, or images such as arrows.

In one embodiment, a rotating or oscillating light signal may be established by the sequential illumination of entire columns 32 of LED's 30 by turning a desired number of columns on and then sequentially illuminating one additional column 32 while turning another column 32 off. Alternatively, the rotating or oscillating warning light signal may be created by selectively activating columns 32 of LED's 30. The following algorithm may be used to provide a counterclockwise revolving light signal (FIG. 9):

1) column A is activated at 0% duty cycle (column A 0%), column B 0%, column C 0%, column D 0%, column E 0%, column F 0%, column G 0%, column H 0%, column I 0%, and column J 0%;
2) column A 25%, column B 0%, column C 0%, column D 0%, column E 0%, column F 0%, column G 0%, column H 0%, column I 0%, and column J 0%;
3) column A 50%, column B 25%, column C 0%, column D 0%, column E 0%, column F 0%, column G 0%, column H 0%, column I 0%, and column J 0%;
4) column A 75%, column B 50%, column C 25%, column D 0%, column E 0%, column F 0%, column G 0%, column H 0%, column I 0%, and column J 0%;
5) column A 100%, column B 75%, column C 50%, column D 25%, column E 0%, column F 0%, column G 0%, column H 0%, column I 0%, and column J 0%;
6) column A 100%, column B 100%, column C 75%, column D 50%, column E 25% column, column F 0%, column G 0%, column H 0%, column I 0%, and column J 0%;
7) column A 75%, column B 100%, column C 100%, column D 75%, column E 50%, F 25%, column G 0%, column H 0%, column I 0%, and column J 0%;
8) column A 50%, column B 75%, column C 100%, column D 100%, column E 75%, column F 50%, column G 25%, column H 0%, column I 0%, and column J 0%;
9) column A 25%, column B 50%, column C 75%, column D 100%, column E 100%, column F 75%, column G 50%, column H 25%, column I 0%, and column J 0%;
10) column A 0%, column B 25%, column C 50%, column D 75%, column E 100%, column F 100%, column G 75%, column H 50%, column I 25%, and column J 0%;
11) column A 0%, column B 0%, column C 25%, column D 50%, column E 75%, column F 100%, column G 100%, column H 75%, column I 50%, and column J 25%;
12) column A 0%, column B 0%, column C 0%, column D 25%, column E 50%, column F 75%, column G 100%, column H 100%, column I 75%, and column J 50%;
13) column A 0%, column B 0%, column C 0%, column D 0%, column E 25%, column F 50%, column G 75%, column H 100%, column I 100%, and column J 75%;
14) column A 0%, column B 0%, column C 0%, column D 0%, column E 0%, column F 25%, column G 50%, column H 75%, column I 100%, and column J 100%;
15) column A 0%, column B 0%, column C 0%, column D 0%, column E 0%, column F 0%, column G 25%, column H 50%, column I 75%, and column J 100%;
16) column A 0%, column B 0%, column C 0%, column D 0%, column E 0%, column F 0%, column G 0%, column H 25%, column I 50%, and column J 75%;
17) column A 0%, column B 0%, column C 0%, column D 0%, column E 0%, column F 0%, column G 0%, column H 0%, column I 25%, and column J 50%;
18) column A 0%, column B 0%, column C 0%, column D 0%, column E 0%, column F 0%, column G 0%, column H 0%, column I 0%, and column J 25%;
19) column A 0%, column B 0%, column C 0%, column D 0%, column E 0%, column F 0%, column G 0%, column H 0%, column I 0%, and column J 0%;
20) return to step 1).

A clockwise revolving light signal may be created by performing steps 1–19 in descending order then repeating the steps. An oscillating light signal may be created by performing: (a) steps 7 through 16 in ascending order; (b) steps 7 through 16 in descending order; and (c) repeating (a) and (b).

A second embodiment of controller 50 provides a means for activating LED's 30 individually to allow for greater flexibility in the type of warning light signal created. This embodiment of the invention is capable of displaying information in different colors or patterns. Depending on the size of the display, it may be necessary to scroll the symbols or characters across the display to accommodate for a larger visual appearance. It is envisioned that the mirror image of patterns, symbols, or characters could be displayed making the message easily readable by drivers viewing the signal in a rear view mirror. It is also envisioned that this embodiment of the invention could display arrows indicating a direction a vehicle is to travel or other images as shown in FIG. 2. In addition, combinations of warning signal lights, direction arrows, and other information carrying signals or images, could be displayed simultaneously by the invention.

LED support 12 is envisioned to have several embodiments. One embodiment, shown in FIG. 9, consists of a panel 14 having front 16, back 18, top 20, bottom 22 and sides 24. LED's 30 are arranged on front 16, with domes 36 extending therefrom, in columns 32 and rows 34. LED's 30 are in electric communication with controller 50 which may be contained or sealed within LED support 12 to provide protection from the elements.

Figure 10:
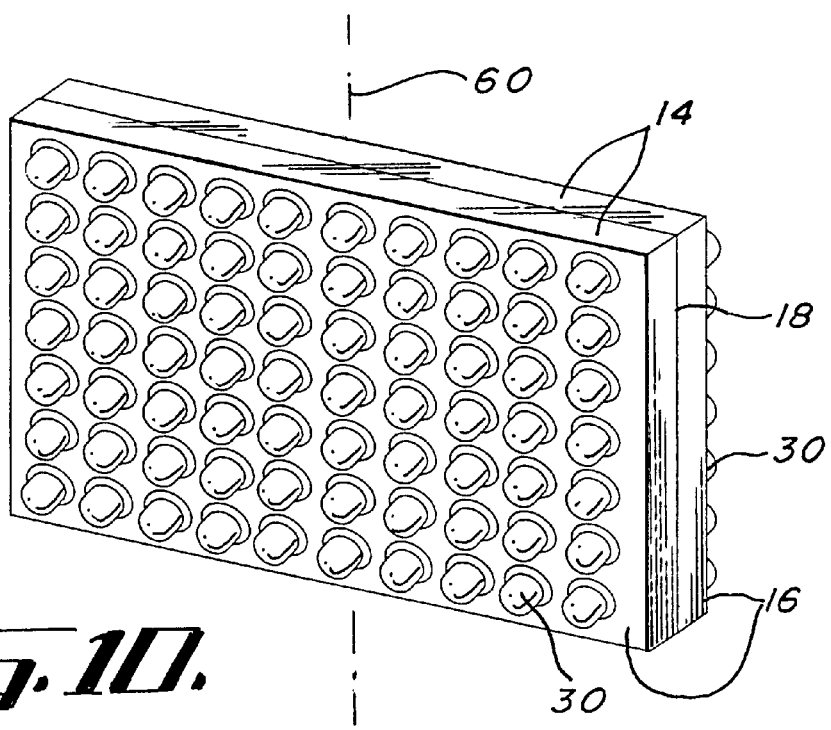
FIG. 10 is a perspective view of a warning light signal according to an embodiment of the invention.

Another embodiment of warning signal light 10 is depicted in FIG. 10. Here, the backs 18 of two panels 14 are attached together to allow for a light signal to be produced on two sides. The two panels 14 form LED support 12. Alternatively, it is envisioned that a single panel 14 having LED's arranged about front 16 and back 18 could be used as well.

Figure 8:
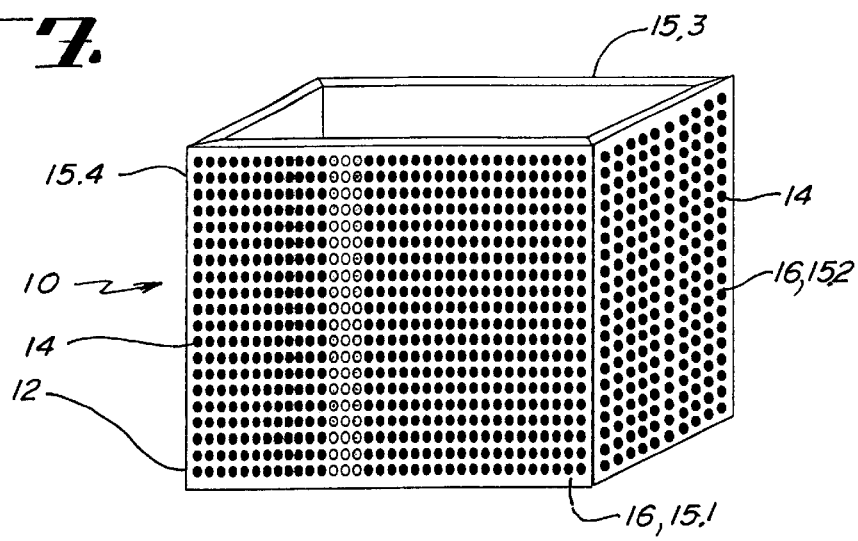
FIG. 8 is a perspective view of a warning light signal according to an embodiment of the invention.

FIGS. 6 and 8 show further embodiments of warning signal light 10. In FIG. 8, panels 14 are used to form an LED support 12 having four sides and generally shaped as squared. FIG. 6 shows panels 14 connected to form an LED support 12 having three sides and generally triangular in shape. In both embodiments, LED's 30 are arranged about the fronts 16 of the panels 14. It is further envisioned that panels 14 may be integral to each other.

Figure 13:
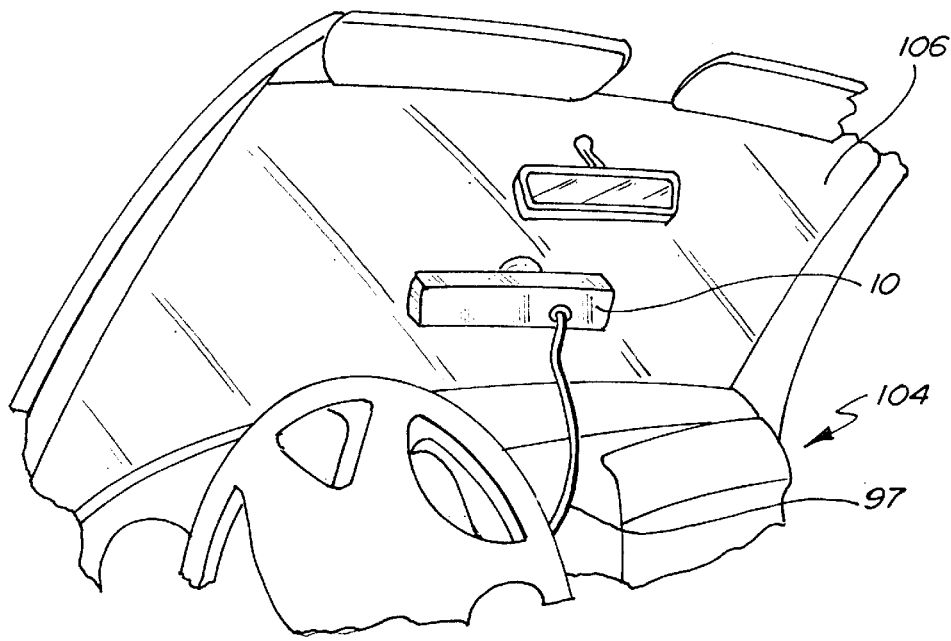
FIG. 13 is a perspective detailed view of a warning signal light attached to the interior of a windshield of an emergency vehicle.
Figure 14:
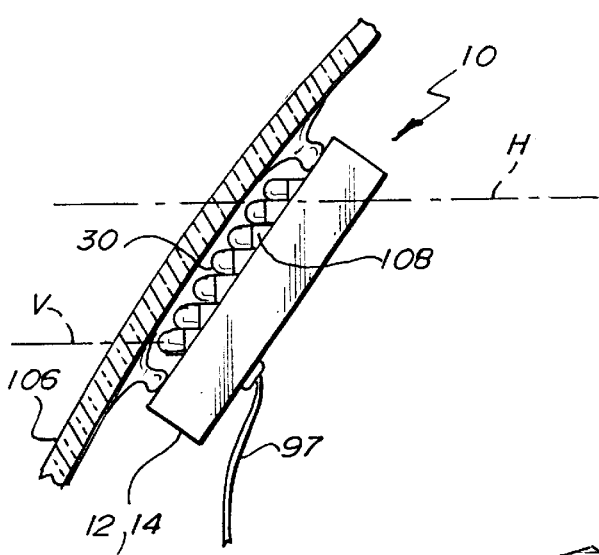
FIG. 14 is a side plan view of a warning signal light mounted to an interior surface of an emergency vehicle window having auxiliary offset individual LED light sources.

Yet another embodiment of warning signal light 10, consists of a flexible panel 14 and controller 50 to allow LED support 12 to be formed into various shapes. FIG. 5 shows LED support 12 formed into a cylinder. Further variations include the use of flexible panels 14 to form other shapes such as semicircles (FIG. 12) or to simply conform to a surface of an emergency vehicle (FIGS. 13 and 14). This embodiment is particularly useful for undercover vehicles which generally position the warning signal lights inside the vehicle. For example, panel 14 could be attached to the front, rear, or side window of an undercover police vehicle.

It should be noted that numerous other shapes could be formed from panels 14 including those formed from combinations of flat, curved, and flexible panels at the preference of an individual.

In each of the embodiments discussed above, the array of LED's 30 may be formed of the same or differently colored LED's. Generally, each column 32 or row 34 may consist of a series of differently colored LED's. Controller 50 may be configured to select the color of the LED's to be illuminated forming the light signal. Accordingly, the user may select a blue, red, white, yellow, green, or amber color or any combination thereof to be used as the color of light signal. Alternatively, the warning signal 10 may be formed of individual LED's 30 which may be selectively illuminated at the discretion of an individual.

It is also envisioned that the controller 50 may control warning signal lights 10 having multiple sides (FIGS. 5, 6, 8, and 10) such that each side is capable of producing warning light signals or combination warning light signals that are independent and/or different from those produced upon the other sides. For example, the squared shape warning signal light shown in FIG. 8 may produce or simulate a red revolving light on first side 15.1, while second side 15.2 is simultaneously producing a blue oscillating light, while third side 15.3 is producing or simulating a stationary white light, and while fourth side 15.4 is producing a white strobe light.

Another embodiment of warning signal light 10 is depicted in FIGS. 1 and 2 as light bar 70 which extends from driver side 100 to passenger side 102 of emergency vehicle 104. Cover 82 protects light bar 70 from the elements. Each side of light bar 70 may have LED's 30 to produce or simulate warning light signals on each side of emergency vehicle 104. Furthermore, controller 50 may be used to create multiple warning light signals on each side of light bar 70. For example, controller 50 may create a simulated revolving blue light positioned at front passenger side 102 of light bar 70, oscillating white lights positioned at front driver side 100, and yellow arrows there between. Additional or alternative warning light signals may be produced out the back 18 and sides of light bar 70. It is further envisioned that light bar 70 may consist of a single light source, a single row of light source or a large array of LED's 30 across each side (not shown). This embodiment provides the largest display and, therefore, is best suited to display desired combinations of warning lights and images. It should be noted that the identified types of warning light signals, combinations and/or patterns of warning light signals, may also be reproduced through the illumination of a single row of LED light sources 30.

Mechanical rotation and oscillation of warning signal lights 10 about axis A is possible by way of attachment to gyrator 90 depicted in FIG. 3. Gyrator 90 mounted to light bar 70, generally comprises electric motors 96 having cables 97. Gyrator 90 is configured to receive connecting portion 40 of warning signal light 10. Cable 97 is preferably connected to a power supply and either an external controller 55 or controller 50.

Gyrator 90 may be capable of rotating or oscillating warning signal light 10 about a single or dual axis of rotation A. FIG. 3 shows gyrator 90 configured to rotate or oscillate warning signal light 10 about a vertical axis A by way of motor 96.1 and oscillate warning signal light 10 about a horizontal axis A by way of motor 96.2. Rotation or oscillation of warning-signal light 10 about vertical axis A is accomplished through direct attachment of connecting portion to motor 96.1. Oscillation of warning signal light 10 about horizontal axis A is accomplished by attaching swivel arm 99 to bracket 99.1 and post 99.2 which is mounted to motor 96.2.

Alternative methods for imparting rotation or oscillation motion to warning signal light 10 may be accomplished through the use of electric motors, toothed gears, and worm gears. In addition, maintaining electrical communication between a power supply and an external controller 55 with a revolving or oscillating warning signal light 10 may be accomplished using brushes or other means without sacrificing the operation of the warning signal light 10.

In another embodiment as depicted in FIGS. 13 and 14, emergency vehicle 104 may include a front or rear windshield 106. The front or rear windshield 106 is generally angularly offset with respect to the vehicle at an approximate angle of 45 degrees. In this embodiment, the mounting of a panel 14 of light sources 30 in flush contact with the interior of a front or rear windshield 106 occurs through the use of angular offsets 108 for the light sources 30 such that light emitted from the light sources 30 occur at a horizontal visual line (V) which is substantially parallel to the plane of a vehicle and not at an approximate angle of 45 degrees upward, which corresponds to the angle for the front or rear windshield 106.

In this embodiment, the ease of visualization of the light source 30 is significantly enhanced by the downward angular offsets 108 which position the light sources 30 along parallel visual lines of sight (V). LED supports 12 or panels 14 may then be positioned in any desired location within the interior of a vehicle in flush contact or proximate to the front or rear windshield 106. A suitable cable 97 is required to provide electrical power for illumination of the light sources 30. It should be noted that the angle of incidence for the angular offsets 108 may vary considerably dependent upon the make or model for the vehicle to include the warning signal lights 10.

It should be further noted that the warning signal light 10 may be used with an automobile, motorcycle, snowmobile, personal water craft, boat, truck, fire vehicle, helicopter, and/or any other type of vehicle receptive to the use of warning signal lights 10. It should be further noted that LED support 12 or panel 14 may be mounted to the interior top dashboard of a vehicle proximate to the front windshield 106 or to the interior top rear dashboard proximate to the rear windshield 106 of a vehicle.

Mounting of a light support 12 or panel 14 to either the front or rear dashboards may minimize the necessity for inclusion of angular offset 108 for the light sources 30. It should be further noted that LED supports 12 or panels 14 may be releasably affixed to the interior of the front or rear windshields 106 via the use of suction cups, hook-and-loop fabric material such as Velcro®, and/or any other releasable affixation mechanism at the preference of an individual. An individual may then adjust and reposition the location of the light support 12 or panels 14 anywhere within the interior of a vehicle as desired for maximization of visualization of the warning signal lights 10.

Figure 15:
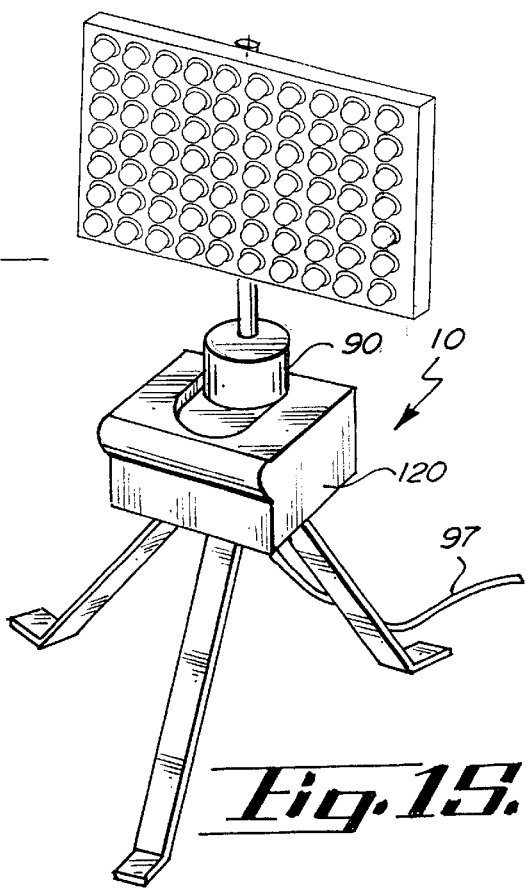
FIG. 15 is an environmental view of a warning signal light as engaged to a remote support device such as a tripod.

In another alternative embodiment as depicted in FIG. 15, warning signal light 10 may function as a remote, revolving, or stationary beacon. In this embodiment, LED support 12 or panel 14 is preferably releasably connected to a transportable support 120 via the use of a bracket. The transportable support 120 may be a tripod having telescoping legs or may be any other type of support as preferred by an individual. In this embodiment, LED light support 12 or panel 14 is electrically connected to an elongate electrical extension cable 97 which may include any desired adapter for electrical connection to a power source which may be a vehicle. The remote light support 12 or panel 14 may also include plug-in adapters for electrical connection to any desired electrical power source other than a vehicle as is available.

The transportable support 120 may also include gyrator 90 as earlier described to provide a desired rotational or oscillatory motion for warning signal light 10. A controller 50 having a microprocessor 52 may also be integral to, or in electrical communication with, LED's 30 for the provision of multi-colored lights, flashing, alternating, modulated, moving characters, arrows, stroboscopic, oscillating and/or revolving warning light signals as desired by an individual. In this embodiment, the warning signal light 10 may be physically separated from an emergency vehicle 104 any desired distance to facilitate or enhance the safety of a potentially dangerous situation necessitating the use of warning signal lights 10. In addition, it should be noted that a series of remote warning signal lights 10 may be electrically coupled to each other for any desired distance to again facilitate the safety of a situation necessitating the use of warning signal lights 10.

Figure 16:
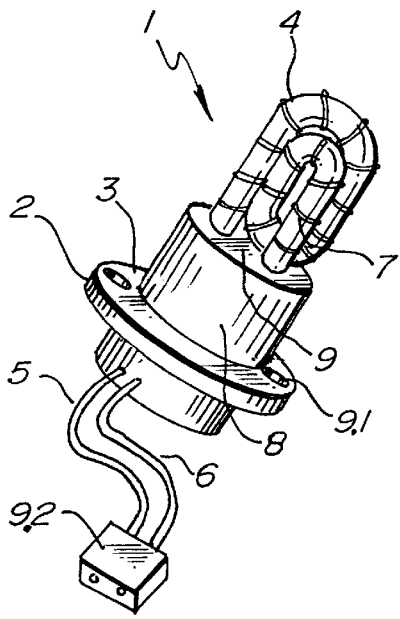
FIG. 16 is a detailed isometric view of a xenon strobe tube and standard mounting base.

FIG. 16 shows a perspective view of a xenon lamp 1. Xenon lamp 1 has a base pedestal 2 which is typically formed of rubber, plastic, or other insulating material. Base pedestal 2 has a top surface 3 which may support a glass tube 4 which may have a looped curve such that an anode end and a cathode end are each supported on a top surface. The anode and cathode ends may be sealed and respective electrical conductors 5 and 6 may pass through the sealed ends and through the top surface 3. A trigger wire 7 may be helically wound about the exterior surface of the glass tube 4 and the ends of the trigger wire 7 may be passed through the top surface 3 of the base pedestal 2 to form a third conductor on the underside of the base pedestal 2.

Base pedestal 2 may have an upper cylinder portion 8 extending from a lower shoulder all of which may extend above the top surface 3. The upper cylindrical portion 8 may include an upper shoulder 9. A glass dome (not shown) may be sized to fit over the xenon lamp 1 and glass tube 4 for resting on the upper shoulder 9. The glass dome may be preferably made from a transparent or silicate glass material capable of withstanding heat stress. The outer diameter of the glass dome is typically about one inch which is sized to fit through the conventional opening in a typical vehicle lamp fixture. The exterior glass dome surface typically has a much lower temperature during operation than the exterior surface of the glass tube 4 forming a part of the xenon lamp 1. The temperature drop between the glass tube 4 and the glass dome facilitates the use of coloring of the dome to provide a colored lamp by virtue of the xenon light intensity passing through the colored dome.

Figure 20:
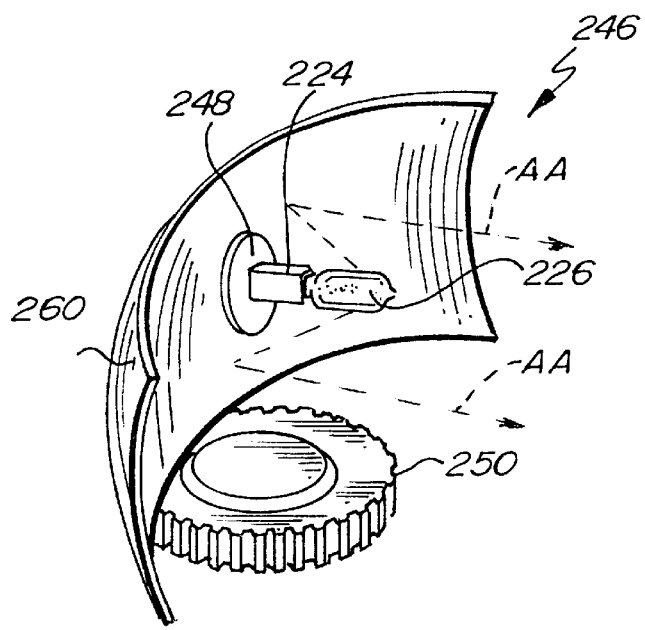
FIG. 20 is a front view of a standard halogen light source mounted in a rotating reflector.
Figure 21:
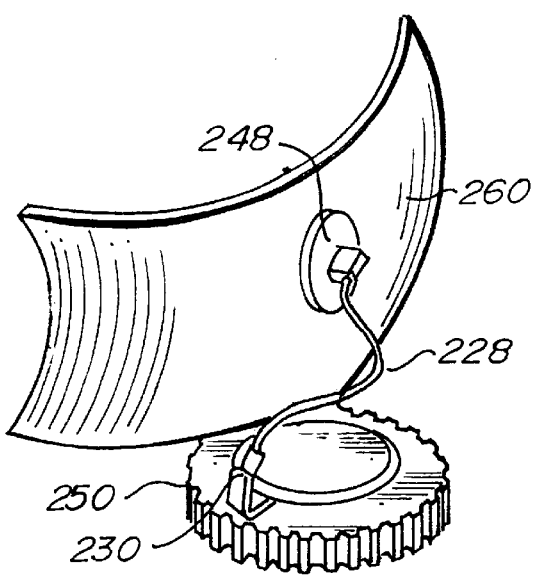
FIG. 21 is a detailed rear view of a rotating reflector mechanism.

The xenon lamp 1 is preferably aligned for insertion into a conventional opening 248 of a light reflector 260 (FIGS. 20 and 21). The light receptacle opening 248 in the light reflector 260 is typically about one inch in diameter; and the glass dome and base pedestal 2 are preferably sized to fit within the light receptacle opening 248. The xenon lamp 1 in its final construction may include a cover plate (not shown) affixed over the bottom opening of the base pedestal 2 for affixation to a light reflector 260 via the use of screws which pass through the screw apertures 9.1. The anode, cathode, and trigger wire 7 preferably traverse the base pedestal 2 and may include a plug 9.2 which is adapted for engagement to a controller/power supply for a motor vehicle.

The light reflector 260 may be a conventional light reflector of the type found in vehicles having a clear plastic or glass lens cover. The glass or lens cover may be fitted over the front edge of the reflector 260 in a manner which is conventional with vehicle lamps. It should be noted that the light reflector 260 may be parabolically or other shaped at the preference of an individual. The light reflector 260 may be mounted to a motor for rotation about a vertical axis. In this embodiment the light source/replacement lamp 200 may be integrally connected or affixed to the reflector 260 for simultaneous rotation about the vertical axis during use of the motor. Alternatively, the light source/replacement lamp 200 may be fixed proximate to the vertical axis where the light reflector 260 is rotated around the stationary replacement lamp 200 to provide for the visual appearance of a rotational light source.

The glass domes as used with the xenon lamps 1 may be colored with any color as preferred by an individual including but not limited to red, blue, amber, green, and/or white. It should be noted that the light fixture incorporating the light reflector 260 may be a headlight fixture or a turn signal light fixture where the xenon lamp 1 is mounted into the light reflector 260 on either side of a centrally-mounted halogen light bulb which may be used as a headlight lamp. In this case, the light fixture could perform its normal function as a headlight and could alternatively flash several additional colors, depending upon the needs of the user. This configuration provides an emergency flashing light construction which is wholly concealed within a normal head lamp of a vehicle and is, therefore, not readily visible from outside the vehicle unless the lights are flashing. This construction may find application in an unmarked emergency vehicles such as might be used by some law enforcement officers.

In operation, the LED replacement lamp 200 may be constructed as a replacement part for a conventional incandescent or xenon gaseous discharge lamp. The standard mounting base 204 and LED support assembly 212 may be sized to readily fit into the same light opening as an incandescent lamp would require, although it is apparent the electrical driving circuit for the LED replacement lamp 200 may require modifications to accommodate the LED operating principles.

LED warning signal lamp 200 may be used in a variety of locations about a vehicle. It should be noted that the use of the LED warning signal lamps 200 are not necessarily limited to positioning adjacent to the head lamp or headlight, tail light, or turn signal illumination devices for an emergency vehicle 104. The LED warning signal lamp 200 may be used as a rotational, pulsating, or oscillating reflector light within the interior adjacent to a front, rear, and/or side window of a vehicle.

It is also envisioned that the controller 50 may control warning signal lights 200 independently of one another such that each warning signal lamp 200 is capable of producing warning light signals which are independent and/or different from those produced at another location about an emergency vehicle 104. For example, a front left location may produce a red colored light while simultaneously a front right location may produce an amber colored light and a right rear location may produce a green colored light and a left rear location may produce a blue colored light. The controller 50 may then alternate the color of the light illuminated from the warning signal lamp 200 in each area as desired by an individual. Alternatively, the controller 50 may sequentially activate warning signal lamps 200 positioned about an emergency vehicle 104 to simultaneously produce a desired color or alternating sequence of colors. It should also be noted that the controller 50 may simultaneously illuminate all LED warning signal lamps 200 to produce a flashing or strobe light which may be particularly useful in certain emergency situations. It should be further noted that the controller 50 may selectively illuminate individual LED warning signal lamps 200 in any desired color, pattern, and/or combination as desired by an individual.

Figure 17:
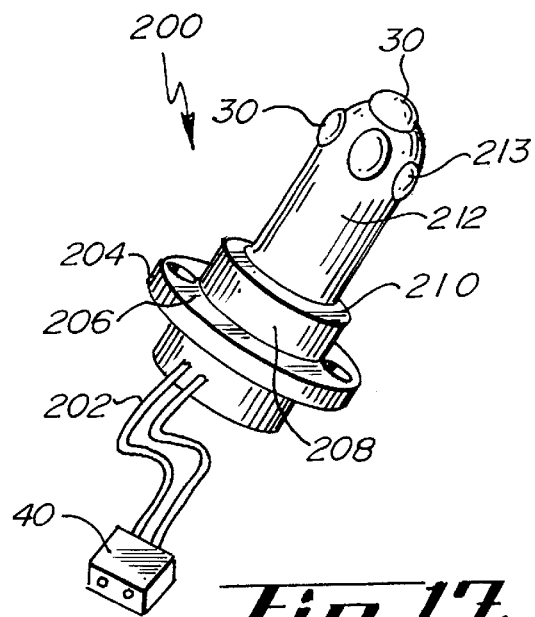
FIG. 17 is a detailed isometric view of the replacement LED light source and standard mounting base.

Referring to FIG. 17 in detail, an LED replacement lamp 200 is depicted. In this embodiment the LED replacement lamp 200 includes a standard mounting base 204 which preferably includes a top surface 206. Extending upwardly from the top surface 206 is preferably an upper cylindrical portion 208 which includes an upper shoulder 210. Extending upwardly from the upper shoulder 210 is preferably an LED support assembly 212 which includes one or more LED lamp modules 213. The LED lamp modules 213 may be of the same or different colors at the discretion of an individual. A wire 202 is preferably in electrical communication with the plurality of LED lamp modules 213 to provide for electrical communication with the controller 50 to individually activate or illuminate LED lamp modules 213 as preferred by an individual. A plug-in connector 40 is preferably coupled to the wire 202 for engagement to the controller 50 and/or power source of an emergency vehicle 104.

The LED replacement lamp 200 is preferably adapted to be positioned in a one inch light receptacle opening 248 (approximate size) which has been previously placed through the backside of a reflector assembly 260. The LED replacement lamp 200 is preferably used to replace a xenon gaseous discharge lamp or incandescent lamp as previously mounted to a base which is inserted into opening 248 in a reflector assembly 260. Illumination of one or more individual LED lamp modules 213, as mounted in the reflector assembly 260, enables the reflector assembly/lens to take on the appearance of a warning signal or emergency signaling lamp. The LED replacement lamp 200 preferably replaces the xenon gaseous discharge or incandescent lamp assemblies with high brightness, long life LED technology.

Figure 18:
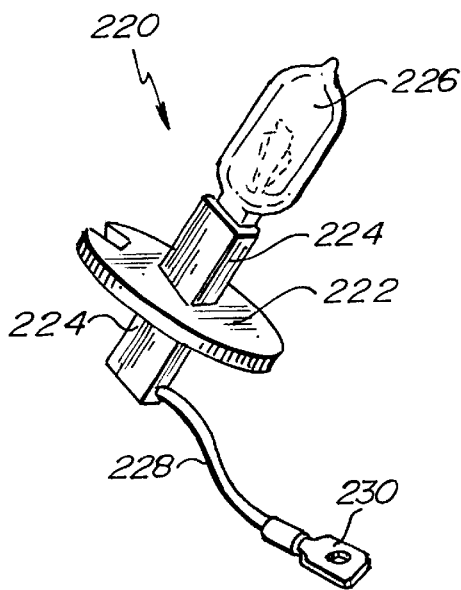
FIG. 18 is a detailed isometric view of an incandescent lamp light source and standard mounting base.

Referring to FIG. 18, an incandescent lamp or quartz halogen H-2 lamp is depicted and in general is indicated by the numeral 220. The incandescent lamp assembly 220 is preferably formed of a standard mounting base 222. A vertical post 224 preferably extends upwardly from the standard mounting base 222. The incandescent light bulb 226 is preferably mounted in the vertical post 224. The vertical post 224 may extend below the standard mounting base 222 to provide for electrical coupling with a wire 228 which preferably includes a standard pin connector 230. The standard pin connector 230 is preferably adapted for electrical communication to a power supply and/or controller 50 for activation of the incandescent lamp assembly 220. The incandescent lamp assembly 220 may be stationary or mounted in a rotational light reflector 260 as desired by an individual. The light bulb 226 may be a halogen H-2, 55 watt, lamp at the discretion of an individual.

Figure 19:
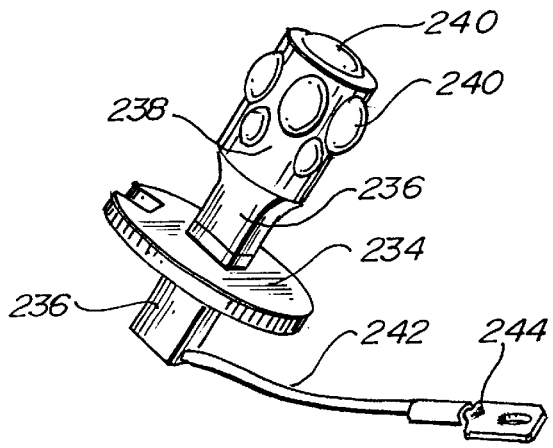
FIG. 19 is a detailed isometric view of a replacement LED lamp and standard mounting base.

As depicted in FIG. 19, LED replacement lamp 200 is adapted to replace the incandescent lamp assembly 220 in a stationary or rotational light reflector 260. The LED replacement lamp 200 as depicted in FIG. 19 preferably includes a standard mounting base 234 and a vertical post 236. It should be noted that the vertical post 236 may extend upwardly from the standard mounting base 234 and may alternatively extend below the standard mounting base 234 at the preference of an individual. An LED mounting area 238 may be preferably integral or affixed to the upper section of the vertical post 236. The LED mounting area 238 preferably includes a plurality of individual LED module lamps 240 which may be individually, sequentially, or illuminated in combination with other light sources at the preference of an individual.

The individual LED module lamps 240 are preferably in electrical communication with a wire 242 which includes an integral standard wire connector 244. The wire connector 244 is preferably adapted to be plugged into a controller 50 or power supply. Communication is thereby provided for selective illumination of the individual LED module lamps 240. It should be noted that a group of individual LED module lamps 240 are mounted in the LED mounting area 238. It should also be noted that the LED replacement lamp 200 is preferably adapted to replace the incandescent lamp assembly 220 or a xenon gaseous discharge lamp assembly base of FIG. 16 or 18. The purpose of the LED replacement lamp assembly 200 is to replace existing xenon gaseous discharge and incandescent lamps with new LED technology while simultaneously utilizing existing standard bases in a standard lamp enclosure. For example, an individual may choose to replace a halogen "H-2" 55 watt lamp with an "LED-2" lamp in an existing rotating light fixture with no other structural modifications, yet achieving the advantages of less power consumption, greater reliability, easier installation, less RF emissions (which reduces interference with radio or electronic equipment), cooler operating temperatures, simplified circuitry, longer life, greater durability and duty capability, and simultaneously providing pure and easier-to-see color light output.

As depicted in FIG. 20, a rotational light reflector 246 is disclosed. The rotational light fixture 246 includes a reflector assembly 260 having a standard opening 248. The incandescent light assembly 220 is preferably positioned in the standard opening 248 for extension of the vertical post 224 outwardly from the reflector assembly 260 for positioning of the light bulb 226 in a desired location. Light emitted from the standard halogen light bulb 226 preferably reflects off the parabolic-shaped reflector assembly 260 for transmission of light in a direction as indicated by arrows AA for visualization by individuals. Reflector assembly 260 and light source 226 may be rotated via the use of gears 250 which are preferably driven by electrical motors not shown. In this manner, the rotational light fixture 246 including the reflector assembly 260 may be rotated at any desired velocity as preferred by an individual.

As may be seen in FIG. 21, a rear or back view of the rotational light fixture 246 is provided. As may be seen in FIG. 21, the light source is preferably positioned in the standard opening 248. The wire 228 as in electrical communication with the light source and is preferably connected via the standard pin connector 230 for electrical communication with a power source.

Figure 22:
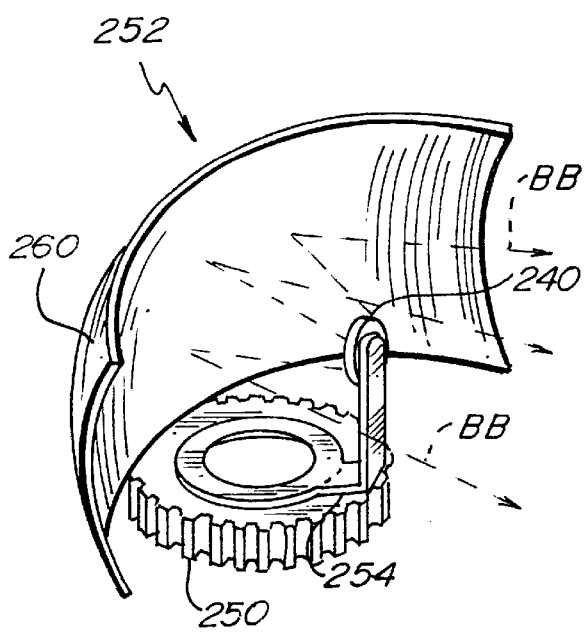
FIG. 22 is a detailed front view of the LED light source mounted to a rotating reflector.

As depicted in FIG. 22, an alternative rotational light fixture 252 is depicted. Rotational light fixture 252 preferably includes a reflector assembly 260 which may be parabolic in shape for the transmission of light along a common axis as depicted by arrows BB for visualization by an individual. In this embodiment, the individual LED module lamps 240 may be positioned to the front of the reflector assembly 260 through the use of a frame 254. The frame 254 may be integral or connected to a gear 250 as desired by an individual. The gear 250 may be driven by a motor for rotation of the light fixture 252. It should be noted that the individual LED module lamps 240 are preferably in electrical communication with a power source not shown.

It should be further noted that the rotational light fixture 252 may also be adapted for the provision of an oscillating or pulsating warning light signal at the preference of an individual.

Figure 23:
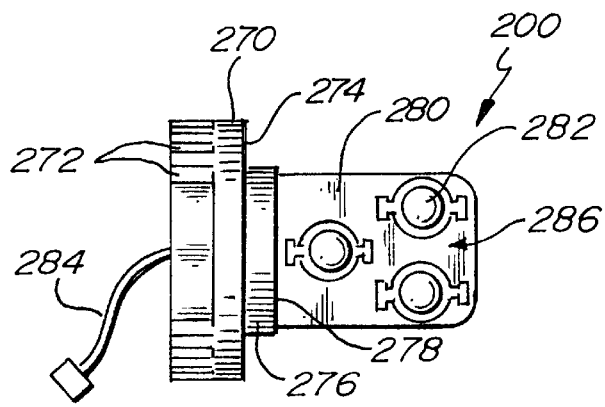
FIG. 23 is a detailed front view of a replacement LED light source.
Figure 24:
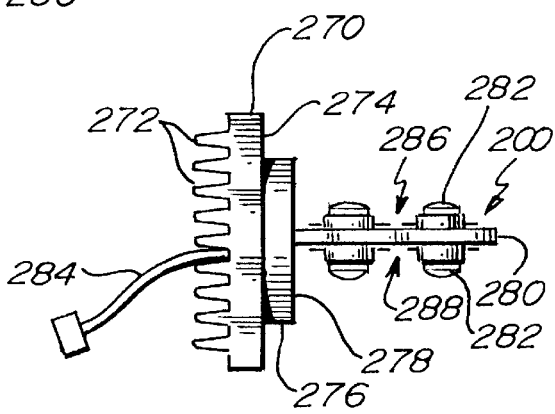
FIG. 24 is a detailed side view of a replacement LED light source.
Figure 25:
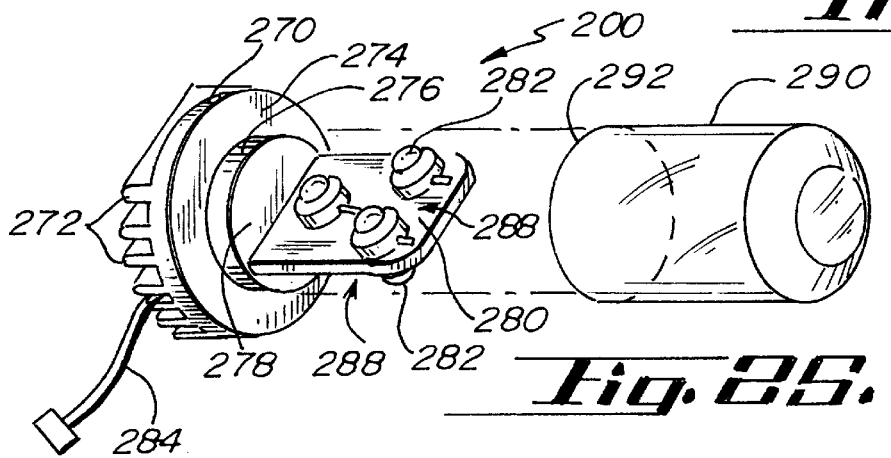
FIG. 25 is a detailed isometric view of a replacement LED light source and cover.

An alternative replacement LED lamp 200 is depicted in FIGS. 23–25. In this embodiment the LED replacement lamp 200 includes a standard mounting base 270. The standard mounting base 270 also preferably includes a plurality of teeth 272. The teeth 272 are preferably adapted for mating coupling with gears integral to a motor and/or reflector 260, or rotational light fixture 246 to facilitate rotation and/or oscillation of the replacement LED lamp 200. The standard mounting base 270 also preferably includes a top surface 274 opposite to the teeth 272.

An upper cylinder portion 276 is preferably adjacent to the top surface 274. The upper cylinder portion 276 preferably includes an upper shoulder 278. Extending upwardly from the upper shoulder 278 is preferably a circuit board, LED mounting surface, or support 280 which preferably includes one or more LED illumination sources 282. The LED illumination sources 282 may be of the same or different colors at the preference of an individual. A wire 284 is preferably in electrical communication with the LED illumination sources 282 to provide for communication and contact with the controller 50 for combination and/or individual illumination of the LED illumination sources 282. A standard plug-in connector may be integral to the wire 284 to facilitate coupling engagement to the controller 50 and/or power source for a vehicle 104.

The circuit board or LED mounting surface 280 is preferably adapted to have a first side 286 and an opposite side 288. Preferably a plurality of LED illumination sources 282 are disposed on both the first side 286 and the opposite side 288 of the replacement lamp 200.

A glass dome or protector 290 is preferably adapted for positioning over the circuit board or LED mounting surface 280 for sealing engagement to the top surface 274 of the standard mounting base 270. The glass dome 290 may be formed of transparent plastic material or a transparent or silicate glass material capable of withstanding heat stress at the preference of an individual. It should be further noted that the glass dome 290 preferably protects the circuit board or LED mounting surface 280 and the LED illumination sources 282 from contamination and from exposure to moisture during use of the replacement lamp 200. In this regard, the sealing lip 292 of the glass dome 290 preferably is securely affixed to the top surface 274 to effectuate sealing engagement therebetween. The outer diameter of the glass dome 290 is preferably about one inch which is sized to fit within the conventional opening 248 in a typical lamp fixture or reflector assembly 260.

The replacement lamp 200 depicted in FIGS. 23, 24, and 25 is also adapted to be positioned in a one inch light receptacle opening 248 which has been placed into a reflector assembly 260. Illumination of one or more individual LED illumination sources 282 as disposed on the circuit board or LED mounting surface 280 enables the replacement lamp 200 to take on the appearance of a warning signal or emergency signaling lamp.

The replacement lamp as depicted in FIGS. 23, 24, and 25 may alternatively permit the circuit board 280 to extend below the upper shoulder 278 to facilitate affixation and positioning relative to the standard mounting base 270.

The controller 50 may regulate the illumination of the LED light sources 282 individually, or in combination, to provide a desired warning lighting effect for the replacement lamp 200. Also, the controller 50 may illuminate the LED light sources 282 individually, or in combination, independently with respect to the first side 286 and the opposite side 288 to provide different warning light effects to be observed by an individual dependant upon the location of the person relative to the replacement lamp 200. The controller 50 may also simultaneously or independently regulate the power intensity to the LED illumination sources 282 to provide for a modulated or variable light intensity for observation by an individual. It should also be noted that the LED illumination sources 282 may be formed of the same or different colors at the preference of an individual to provide a desired type of warning light effect for the replacement lamp 200.

In an alternative embodiment, the LED warning signal lamps 10 or LED replacement lamps 200 may be electrically coupled to a controller 50 which in turn is used to provide a modulated power intensity for the light source. A modulated power intensity enables the provision of various power output or patterns of illumination for creation of a plurality of visually distinct warning light signals without the use of mechanical devices. In these embodiments, the controller 50 illuminates selected light sources 282 and the controller 50 may also regulate and/or modulate the power supplied to the light source 282 thereby varying the intensity of the observed light. In addition, the controller 50 may modulate the power supplied to the LED warning signal lamps 10 or LED replacement lamps 200 in accordance with a sine wave pattern having a range of 0 to full intensity. At the instant of full intensity, the controller 50 may also signal or regulate a power burst for observation by an individual. The controller 50 operating to regulate and/or modulate the power intensity for the warning signal lamps 10 or LED replacement lamps 200 in conjunction with illumination and non-illumination of selected light source 282 may establish the appearance of a rotational warning light source or pulsating light source without the necessity of mechanical rotational or oscillating devices. The current draw requirements upon the electrical system of an emergency vehicle 104 is thereby significantly reduced. Spatial considerations for an emergency vehicle are also preferably optimized by elimination of mechanical, rotational and/or oscillation devices.

The controller 50 may also regulate the modulated power intensity for the provision of a unique variable intensity warning light signal. The unique variable intensity light source is not required to cycle through a zero intensity phase. It is anticipated that in this embodiment that the range of intensity will cycle from any desired level between zero power to full power. A range of power intensity may be provided between thirty percent to full power and back to thirty percent as regulated by the controller 50. It should also be further noted that an irregular pattern of variable power intensity may be utilized to create a desired type of warning light effect. In addition, the controller 50 may also sequentially illuminate adjacent columns 32 to provide a unique variable rotational, alternating, oscillating, pulsating, flashing, and/or combination variable rotational, alternating, pulsating, oscillating, or flashing visual warning light effects. A pulsating warning light signal may therefore be provided through the use of modulated power intensity to create a varying visual illumination or intensity effect without the use of rotational or oscillating devices. The controller 50 may also modulate the power intensity for any combination of light sources 30 or 282 to provide a distinctive or unique type of warning light signal.

The use of a controller 50 to provide a modulated power intensity for a light source may be implemented in conjunction with replacement lamps 200, flexible circuit boards having LED light sources 30, paneled circuit boards or LED mounting surfaces having LED light sources 30, light bars 70 having LED light sources 30, a cylindrical, square, rectangular, or triangular-shaped circuit boards having LED light sources 30 and/or any other type or shape of LED light sources including but not limited to the types depicted in FIGS. 1–50 herein.

Figure 35:
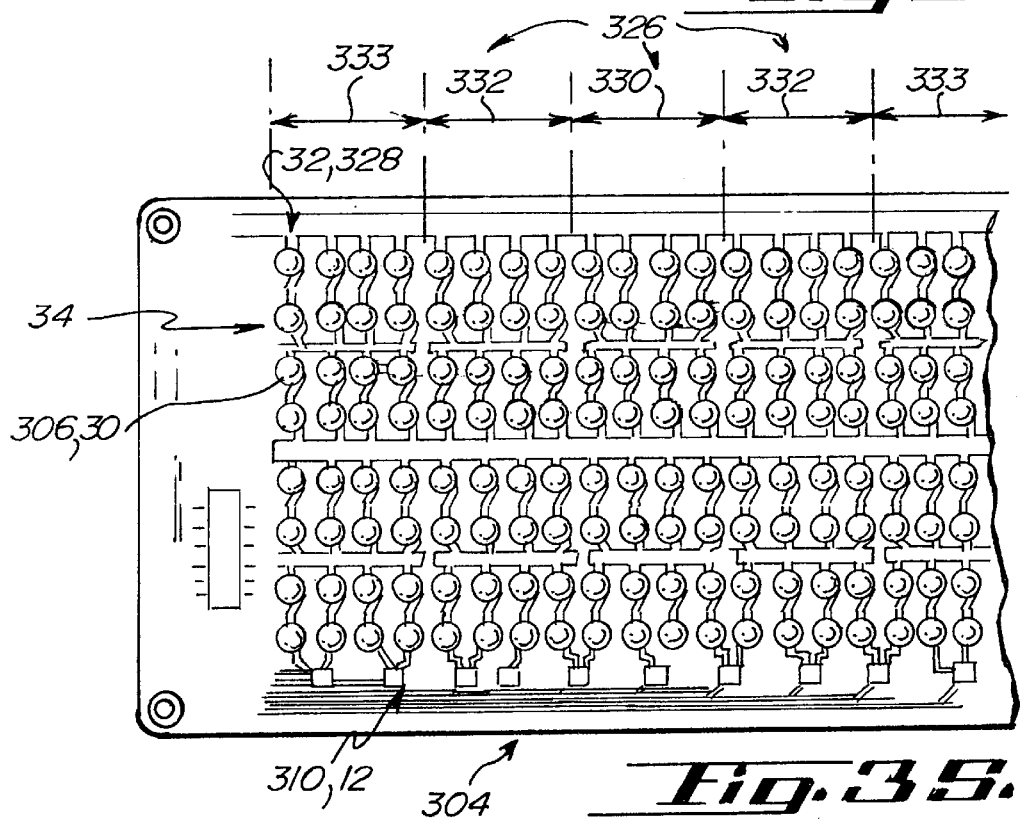
FIG. 35 is an alternative detailed view of an LED light source having sectors.
Figure 40:
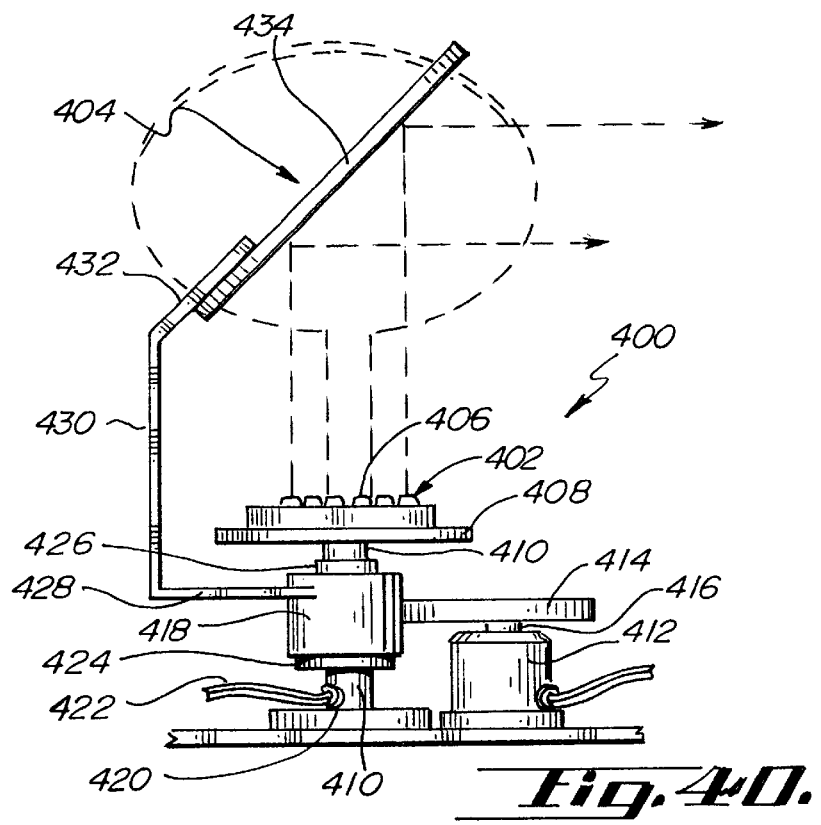
FIG. 40 is an alternative detailed side view of a reflector assembly.

Further, the controller 50 may be utilized to simultaneously provide modulated or variable light intensity to different and/or independent sections, areas, and/or sectors 326 of a light source (FIG. 35). Also, the controller 50 may be utilized to simultaneously provide modulated or variable light intensity to different and/or independent sectors, areas, and/or sections 326 of the forward facing side or rearward facing side of the light bar 70 for the provision of different warning light signals or a different warning light effects on each side. In this embodiment it is not required that the forward facing and rearward facing sides of the light bar 70 emit the identical visual patterns of illuminated light sources 30. The controller 50 may regulate and modulate the variable light intensity of any desired sector 326 of the forward facing side independently from the rearward facing side of the light bar 70. The controller 50 may thereby provide any desired pattern and/or combination of patterns of warning light signals through the utilization of variable and/or modulated light intensity for the forward facing side, and a different type or set of patterns and/or combination of patterns of warning light signals having variable or modulated light intensity for the rearward facing side of the light bar 70 as desired by an individual. It should be further noted that an infinite variety of patterns and/or combinations of patterns of warning light signals may be provided for the forward facing side and the rearward facing side of the light bar 70 a the preference of an individual.

The use of the controller 50 to modulate the power intensity for a light source 30 to provide a unique warning light signal may be utilized within any embodiment of an LED light source 10, light bar 70 light support, replacement lamp 200 or reflector assembly as described in FIGS. 1–50 herein.

It should be further noted that the modulation of the power intensity for a light source 30 or replacement lamp 200 may be used in conjunction, or as a replacement to, the sequential illumination of rows, columns, and/or individual LED light sources 30 to provide a desired type of unique warning light effect.

The modulated power intensity may be regulated by the controller 50 to create a unique warning light signal within a single sector 326 or in conjunction with multiple separated or adjacent sectors 326 of light bar 70 or light support for the provision of any desired composite emergency warning light signal. All individual LED light sources 30 within a light bar 70 or light support may be simultaneously exposed to incrementally increased modulated power intensity to provide for an incremental increase in illumination. A power burst at full power may be provided at the discretion of an individual. The modulation of the power intensity in conjunction with the incremental increase in illumination of all LED light sources 30 within light bar 70 or light support may provide the appearance of rotation of a warning light signal when observed by an individual. The power exposed to the individual light sources 30 may then be incrementally decreased at the preference of an individual. It should be noted that the power is not required to be regularly incrementally increased or decreased or terminated. It is anticipated that any pulsating and/or modulated variable light intensity may be provided by the controller 50 to the LED light sources 30.

It should also be noted that all individual LED light sources 30 within a light bar 70 are not required to be simultaneously and incrementally illuminated to provide for the appearance of rotation. For example, a light bar 70 or light support may be separated into one or more distinct segments 326 which are formed of one or more columns 32 of LED light sources 30. a particular segment 326 may be selected as a central illumination band which may receive the greatest exposure to the modulated or variable power intensity and, therefore, provide the brightest observable light signal. An adjacent segment 332 may be disposed on each side of the central illumination band 330 which in turn may receive modulated or variable power intensity of reduced magnitude as compared to the central illumination band 330. A pair of removed segments 333 may be adjacent and exterior to the segments 332, and in turn, may receive exposure to a modulated power source of reduced intensity as compared to segments 332. The number of desired segments may naturally vary at the discretion of an individual. The controller 50 may thereby regulate a power source to provide a modulated or variable power intensity to each individual segment 330, 332, or 333 (FIG. 35) to provide for a unique warning light effect for the light bar 70 or light support.

It should be further noted that light supports 12 may be flat and rigid, pliable, moldable, triangular, cylindrical, partially cylindrical, and/or any other shape as desired by an individual provided that the essential functions, features, and attributes described herein are not sacrificed.

The provision of a modulated power intensity to the light bar 70 or light support may also be coupled with or in combination to the sequential illumination of columns 32 as earlier described. In this situation, the warning light signal may initially be dim or off as the individual columns 32 are sequentially illuminated and extinguished for illumination of an adjacent column or columns 32. The power intensity for the illuminated column or columns 32 may simultaneously be incrementally increased for a combination unique rotational and pulsating modulated or variable warning light signal. In addition, the controller 50 may be programmed to provide the appearance of rotation pulsation and/or oscillation at the discretion of an individual.

Each individual LED light source 30 preferably provides an energy light output of between 20 and 200 or more lumens as desired by an individual.

Each light support 12 may contain a plurality of rows 34 and columns 32 of individual LED light sources 30. The light supports 12 are preferably in electrical communication with the controller 50 and power supply. The supports 12 preferably are controlled individually to create a desired warning light signal for an emergency vehicle 104 such as rotation, alternating, oscillation, strobe, flashing, or pulsating as preferred by an individual. Each support 12 may be controlled as part of an overall warning light signal or pattern where individual supports 12 may be illuminated to provide a desired type or combination light signal in addition to the provision of a modulated or variable power intensity for the light source 30.

Modulated power intensity may be regulated by the controller 50 to create the appearance of rotation within a single support 12 or in conjunction with multiple separated, independent or adjacent supports 12 for the provision of a composite emergency warning light signal.

It should be noted that each portion, section, sector, or area 326 of light bar 70 or light support may be controlled as part of an overall warning light signal or pattern where individual sections or sectors 326 may be illuminated to provide a desired type of warning light signal including but not limited to rotation and/or oscillation through the use of a modulated or variable power intensity. Alternatively, the controller 50 may provide for the random generation of light signals without the use of a preset pattern at the preference of an individual.

Controller 50 may be used to selectively activate individual LED's 30 to create a pulsating light signal, a strobe light signal, a flashing light signal, an alternating light signal, and/or an alternating colored flashing light signal for an emergency vehicle.

Controller 50 provides a means for activating LED's 30 individually to allow for greater flexibility in the type of warning light signal created. This embodiment of the invention is also capable of displaying information in a variety of different colors or sequential illumination of colors.

Figure 33:
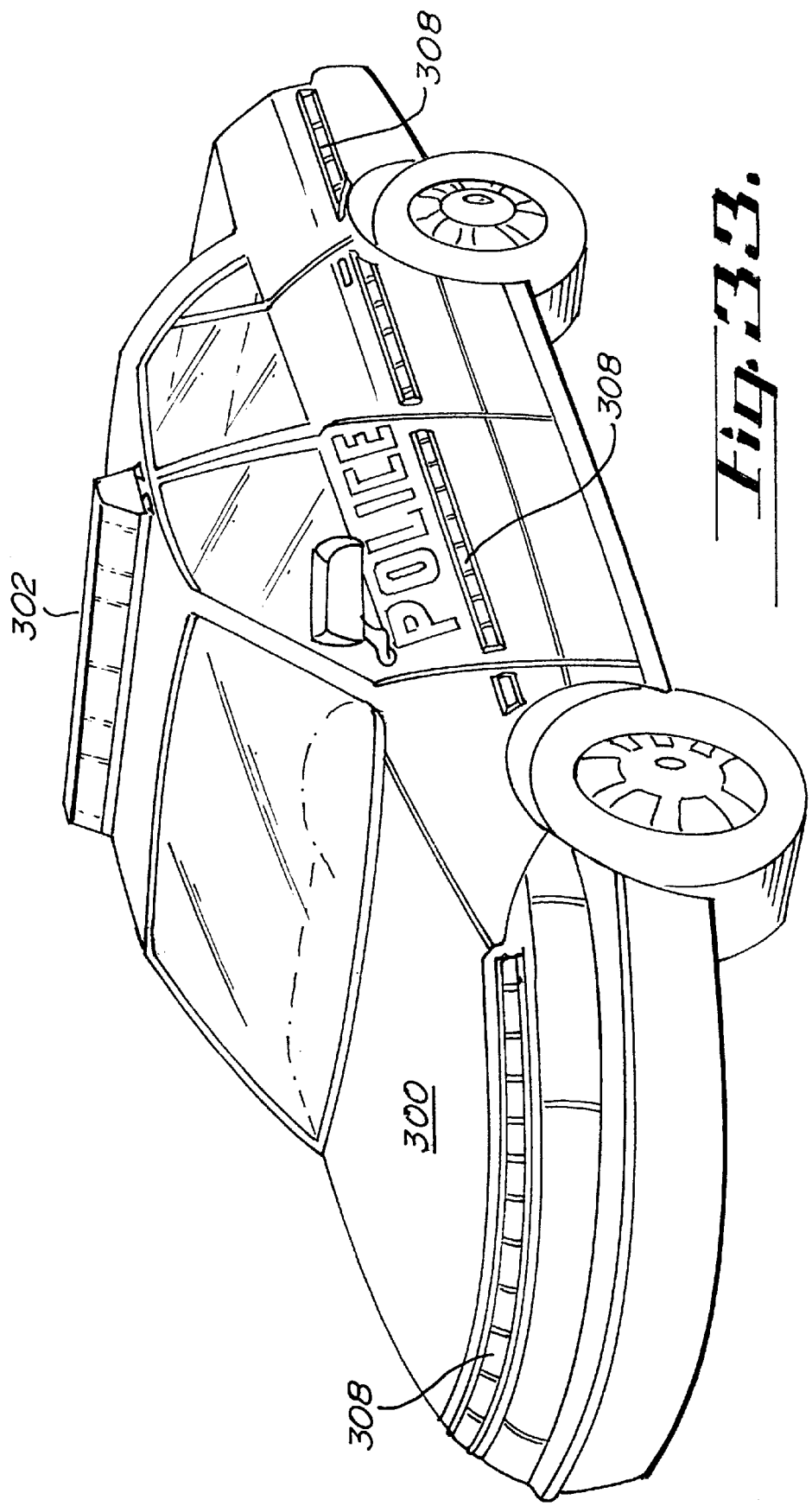
FIG. 33 is an environmental view of an emergency vehicle having strip LED light sources.

Referring to FIG. 33, the emergency vehicle 300 preferably includes a light bar or light support 302 which may include one or more panels of LED light sources 306. A strip LED light source 308 may also be secured to the exterior of the emergency vehicle 300 at any location as desired by an individual. It is anticipated that the strip LED light source 308 may preferably encircle an entire emergency vehicle 300 to enhance the visualization of the emergency vehicle 300 as proximate to an emergency situation.

Figure 34:
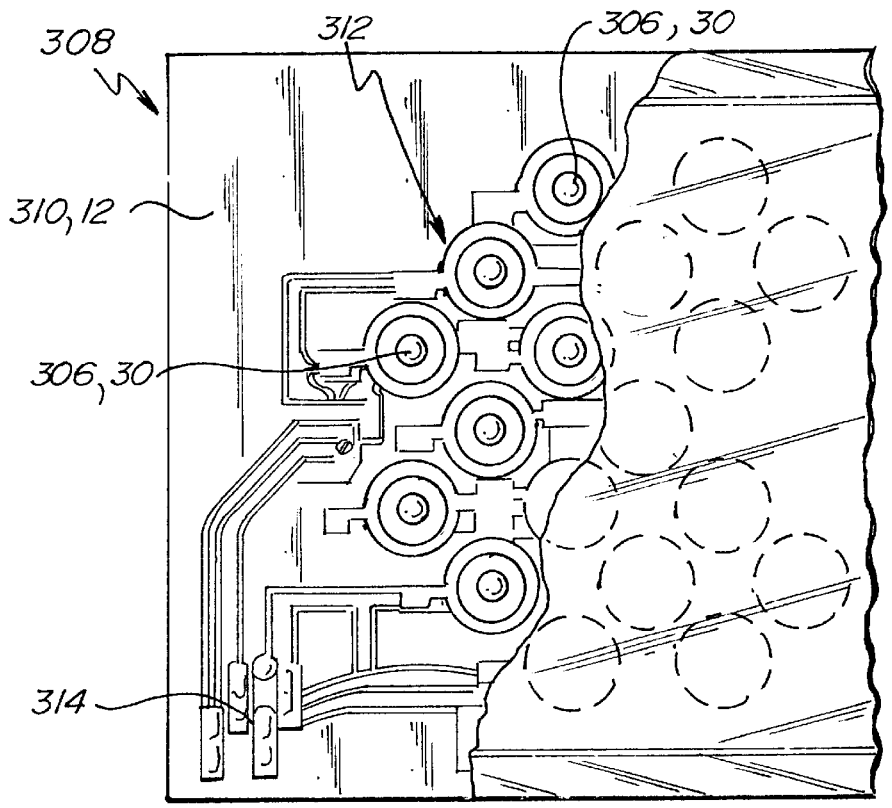
FIG. 34 is an alternative detailed partial cut away view of a strip LED light source.

Referring to FIG. 34, the strip LED light source 308 is preferably comprised of a circuit board 310 having an array 312 of individual LED light sources 306. The LED light sources 306 are preferably in electrical communication with each other via electrical contacts 314. Each circuit board 310 is preferably in electrical communication with a power supply and/or controller 50 via the use of wires 316. Each individual LED light source 306 as included within a strip LED light source 308 may be enclosed within a reflector 370 to facilitate and maximize light output along a desired visual line of sight. It should be noted that the LED light sources 306 preferably have maximum illumination at an angle of incidence approximately 40°–45° downwardly from vertical. The strip LED light sources 308 preferably include a back-side. The back-side preferably includes an adhesive, magnetic, or other affixation device which may be used to secure the strip LED light sources 308 to the exterior of an emergency vehicle 300 in any desired pattern or location. The strip LED light sources 308 may also be enclosed within a transparent cover 324 which prevents moisture or other contamination from adversely affecting the performance of the LED light sources 306 during use of the strip LED light source 308.

Wires of adjacent strip LED light sources 308 may preferably be intertwined to extend across a vehicle for coupling to a power supply at a central location. The wires are preferably connected to the controller 50 which may be used to regulate the illumination of individual LED light sources 306 and/or individual panels of the strip LED light sources 308 to provide for the appearance of sequential, pulsating, alternating, oscillating, strobe, flashing, modulated, and/or rotational lights for an emergency vehicle 300. It should be noted that the individual LED light sources 306 within the strip LED light source 308 may be of a single or variety of colors as desired by an individual. Alternatively, adjacent strip LED light sources 308 may be electrically coupled to each other in a parallel or series electrical connection for communication to a centrally located controller and power source.

The individual LED light sources 306 as incorporated into the array 312 of the strip LED light sources 308 are preferably sturdy and do not fail or separate from a vehicle 300 when exposed to rough operating conditions. It should be further noted that any individual strip of LED light sources 308 may be easily replaced as required. The transparent cover 324 for the strip LED light sources 308 is preferably formed of sturdy and resilient plastic material which prevents water penetration and/or contamination to the circuit board 310 and/or individual light sources 306. Each individual LED light source 306 preferably provides an energy light output of between 20 and 200 or more lumens as desired by an individual.

The strip LED light sources 308 may individually be any size as preferred by an individual. It is anticipated that the strip LED light sources 308 may have the approximate dimensions of three inches in length, three inches in width, and one-half inch in thickness for use in affixation to the exterior of an emergency vehicle 300.

It should be noted, however, that any desired size of strip LED light sources 308 may be selected by an individual for use in association with the exterior of the emergency vehicle 300 including the use of a series of solitary light sources 306.

Referring to FIG. 35, a panel 304 of individual LED light sources 306 is depicted. The panel 304 may form the illumination element for the strip of LED light sources 308 and/or light bar 70 or light support 12, 302 as affixed to an emergency vehicle 300. Each panel 304 preferably contains a plurality of rows 34 and columns 32, 328 of individual LED light sources 306. The panels 304 are preferably in electrical communication with the controller 50 and power supply (now shown). The panels 304 preferably are controlled individually to create a desired warning light signal for an emergency vehicle 300 such as rotation, alternating, pulsating, sequencing, oscillation, modulated strobe, or flashing as preferred by an individual. Each panel 304 may be controlled as part of an overall warning light signal or pattern where individual panels 304 may be illuminated to provide the appearance of rotation and/or oscillation motion through the use of a modulated power intensity light source without the use of mechanical devices.

It should also be noted that the strip LED light sources 308 may be organized into distinct sections, segments, and/or sectors 326 for individual illumination by the controller 50. Each distinct segment, section, and/or sector 326 may therefore be illuminated with a visually different and distinct type of light signal with, or without, modulated or variable power intensity for the creation of a desired type of unique warning lighting effect for a vehicle. An infinite variety of color and/or pattern combinations or sequences may be established for the emergency vehicle 300 through the use of the controller 50.

Modulated power intensity may be regulated by the controller 50 to create the appearance of rotation or pulsation within a single panel 304, strip 308, or in conjunction with multiple separated or adjacent panels 304 or strips 308 for the provision of a composite warning light signal as desired by an individual. The warning light signal for each or a group of panels 304 or strips 308 may also be regulated by the controller 50 for the provision of a modulated power intensity for an observable warning light signal. All individual LED light sources 306 within a panel 304 or strip 308 may also be exposed to incrementally increased modulated power intensity to provide for an incremental increase in illumination for a warning light signal. The modulation of the power intensity of LED light sources 306 within panel 404 or strips 308 thereby may provide the appearance of rotation of a light signal when observed by an individual. The power modulation or light intensity curve is anticipated to resemble a sine wave pattern when the warning light signal provides the appearance of rotation (FIG. 43). The power to the individual light sources 306 may then be incrementally decreased at the preference of an individual. It should be noted that the power is not required to be terminated. It should also be noted that each individual LED light source 306 is not required to receive the same level of power output from the controller 50. Therefore different individual LED light sources 306 may receive different power output levels within a single warning light signal. Individual LED light sources 306 within panel 304 are not required to be simultaneously and incrementally illuminated to provide for the appearance of rotation. It is anticipated that a pulsating and/or modulated variable light intensity may be provided by the controller 50 for regulation of the power output from thirty percent to maximum and back to thirty percent which affords a desirable type of pulsating modulated variable light effect.

The provision of a modulated power intensity to the panels 304 may also be coupled with or in combination to the sequential illumination of columns 328 as earlier described. In this situation, the warning light signal may initially be dim or off as the individual columns 328 are sequentially illuminated and extinguished for illumination of an adjacent column or columns 328. The power intensity for the illuminated column or columns 328 may simultaneously be incrementally increased for a combination unique rotational and pulsating modulated light signal. In addition, the controller 50 may be programmed to provide the appearance of rotation pulsation and/or oscillation at the discretion of an individual.

It should be noted that the provision of a modulated light or power intensity may be implemented in association with a light bar or light support 302, a cylindrical panel, a strip of lights 308, flat panels 304, or any other type of light source as desired by an individual for use with an emergency vehicle 300.

Referring to FIGS. 48 and 49, an individual LED light source 306 is depicted in detail. The LED light source 306 preferably include a ceramic and/or heat resistant base 334. Centrally within the ceramic and heat-resistant base 334 is positioned a light source 336. The light source 336 is preferably enclosed within a protective cover 338. Extending outwardly from the individual light source 306 are a pair of contact paddles 340 which preferably provide for the electrical contacts for illumination of the light sources 336 during use of the individual light sources 306. The back of the LED light source 306 includes a slug 342. The slug 342 is designed to be positioned within circular openings 344 of a circuit board or LED mounting surface 346 (FIG. 36). The circuit board or LED mounting surface 346 preferably establishes a heat sink within an aluminum base or frame 348 as depicted in FIGS. 38 and 39. The LED light sources 306 as depicted in FIGS. 48 and 49 preferably provide for a light intensity varying between 20 and 200 lumens or higher at the discretion of an individual. The positioning of the slug 342 in the circular openings 344 of the circuit board or LED mounting surface 346 also preferably establishes a heat sink. A heat sink is desirable because the individual LED light sources 306 may have a sufficient level of power output during use to develop heat. As a result, the slugs 342 are positioned within the circular opening 344 and may be fully engaged to an adhesive for affixation to an aluminum base 349 (FIGS. 38 and 39). This combination assists in the dissipation of heat during use of the individual LED light sources 306 enhancing the performance of the light support 302.

As may be seen in FIGS. 31, 32, 37 and 50, in an alternative embodiment, the light bar or light support 302 or panel 304 may be formed of a single row of LED light sources 306. Within this embodiment, the LED light sources 306 are positioned within circular openings 344 of circuit board or LED mounting surface 346 (FIG. 37). Circuit board 346 may be affixed to aluminum base 348 through the use of adhesive including glass beads where the circular openings 344 preferably establish a heat sink for the individual LED light sources 306. The use of adhesive including glass beads to affix the LED light sources 306 and circuit board 346 to the aluminum base 348 preferably assists in the creation of electrical contact for the light bar or light support 302.

As depicted in FIG. 37 the top surface of the circuit board or LED mounting surface 346 may include two reflectors or mirrors 350. The reflectors or mirrors 350 are preferably elongate and are positioned substantially parallel to each other and are adjacent or aligned to the rows of individual LED's 306. The reflectors or mirrors 350 preferably diverge upwardly and outwardly from a position proximate to the LED light source 306 and aluminum base 348. As such, the mirrors 350 have a separation distance which is narrow proximate to the LED light sources 306, where the separation distance becomes larger as the distance vertically from the aluminum base 348 increases.

As earlier described, the brightest or most intense light of the individual LED light sources 306 is provided at an acute angle of approximately 40° to 42°. The reflector or mirror 350 as angled upwardly and outwardly relative to the row of LED light sources 306 reflects light exiting the LED light sources 306 along a desired line of sight which corresponds to perpendicular observation by an individual. The reflectors or mirrors 350 maximize the efficiency of the light sources 306 by reflecting light along the line of sight to be observed by an individual during an emergency situation. The reflectors or mirrors 350 may have a polished or non-polished surface at the preference of an individual depending on the brightness desired for the light support 302. The reflectors or mirrors 350 may also include one or more reflective sections 374 and/or transparent or clear sections 372. The transparent or clear sections 372 and the reflective sections 374 are described in detail with reference to FIGS. 27–30 herein. It should be noted that the surface of the reflectors or mirrors 350 may include any desired combination of sections, patterns, stripes, rows, and/or columns of clear or transparent sections 372 and/or reflective sections 374 as desired by an individual for a reflection of light illuminated from the individual LED light sources 306 during the provision of a warning light signal.

Wires 354 preferably connect the circuit board 346 to the power supply and controller 50. A modulated power source as earlier described may thereby be provided to the light support 302 which includes the reflector or mirrors 350. In this embodiment, the sequential illumination of individual LED's 306 may occur to provide a desired type of warning light signal. Also, the circuit board 346 as engaged to the base 348 may be separated into segments 326 of LED light sources 306 for use in combination with a modulated power intensity electrical source.

As depicted in FIGS. 38 and 39, the frame 348 includes a base 349. The base 349 may include a holding cavity 358. In the holding cavity 358 is preferably positioned a circuit board or LED mounting surface 360 which includes a plurality of circular openings 344. In each circular opening 344, is preferably positioned an individual LED light source 306. Above the holding cavity 358 is preferably a first support 362 and a second support 363. The first support 362 and second support 363 preferably have an angled interior edge 364. Each angled interior edge 364 is preferably adapted to receive a reflector or mirror 350. Each mirror 350 is preferably utilized to reflect light illuminated from an individual light source 306 along a visual line of sight as depicted by arrow AA of FIG. 39. The first and second supports 362, 363 also preferably include a positioning ledge or notch 366 which is adapted to receive a glass or transparent plastic cover lens 368 which serves as a protector for the frame 348 and individual LED light sources 306.

Figure 50:
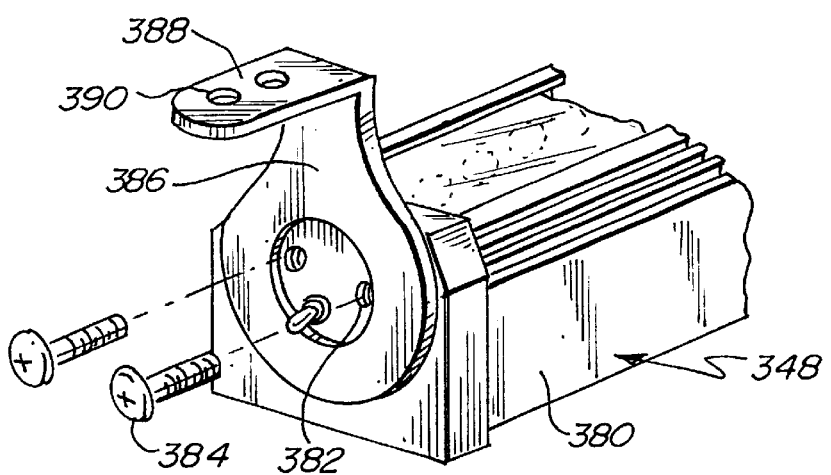
FIG. 50 is a detailed end view of one embodiment of a reflector assembly.

Referring to FIG. 50, the frame 348 may be elongate having a first end 380 and a second end (not shown). The first end 380 and the second end preferably each include and affixation area 382 which may be threaded for receiving engagement to a fastener 384 as preferred by an individual. A bracket 386 may be rotatably engaged to the first end 380 and second end at the preference of an individual by tightening of the fasteners 384 relative to the affixation areas 382. The bracket 386 preferably includes and angled portion 388 which may include a second fastener 390 which may include suction cups. Alternatively, the second fastener 390 may be screws, bolts, and/or rivets for attachment of the frame 348 at a desired location relative to the interior or exterior of a vehicle 300.

Figure 29:
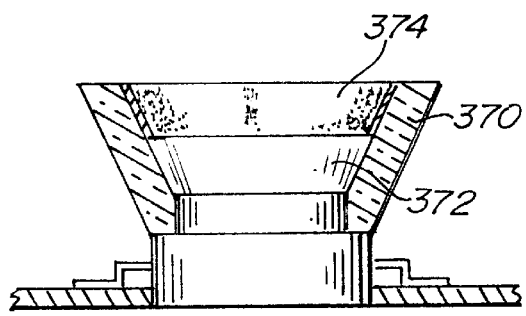
FIG. 29 is an alternative cross-sectional side view of a culminator cup.

Referring to FIGS. 26–30, a reflector or culminator for the individual LED light sources 306 is disclosed. The reflector or culminator is indicated in general by the numeral 370. The reflector or culminator 370 may be conical in shape and may be configured to encircle an individual LED light source 306. The reflector or culminator 370 may be partially transparent. The reflectors 370 may have a clear section 372 and a reflective section 374. In FIG. 29, the clear section 372 is preferably positioned proximate to the LED light source 306 and the reflective section 374 is preferably positioned to the top of the reflector 370.

Figure 28:
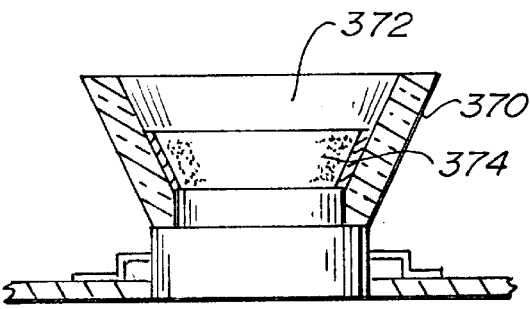
FIG. 28 is an alternative cross-sectional side view of a culminator cup.
Figure 30:
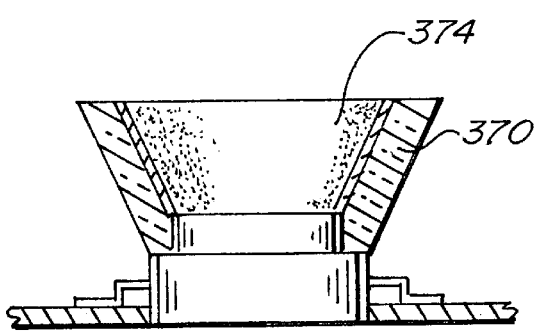
FIG. 30 is an alternative cross-sectional side view of a culminator cup.

In FIG. 28, the reflective section 374 is preferably positioned proximate to the LED light source 306 and the clear section 372 is preferably positioned to the top of reflector or culminator 370. As may be seen in FIG. 30, the entire interior surface of the reflector or culminator 370 may be formed of a reflective section 374. It should be noted that any combination of clear sections 372 and reflective sections 374 may be utilized at the discretion of an individual. It should be noted that a plurality of clear sections 374 may be utilized within each reflector or culminator 370 at the discretion of an individual.

The use of a combination of clear sections 372 and reflective sections 374 enable an individual to select a configuration for the provision of partial illumination along an angle which is not parallel to a desired line of sight. An individual may thereby be able to observe an illuminated light signal from the side or top of a light bar or light support 302 as opposed to being aligned with a desired line of sight.

Each of the culminator or reflector cup 370 preferably includes an angled interior surface which extends upwardly and diverges outwardly from a central opening 394. Each central opening 394 is preferably constructed and adapted for positioning approximate to and over an LED light source 306. Each of the culminator or reflector cups 370 also preferably includes an angled exterior surface which extends upwardly and diverges outwardly from a bottom or base which is preferably positioned approximate to an LED mounting surface or circuit board 346.

Figure 26:
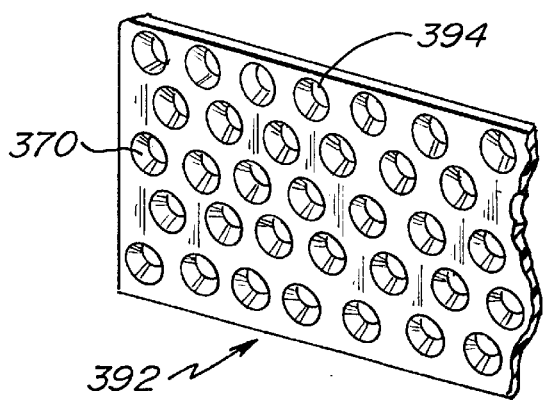
FIG. 26 is a detailed isometric view of a reflector or culminator.
Figure 27:
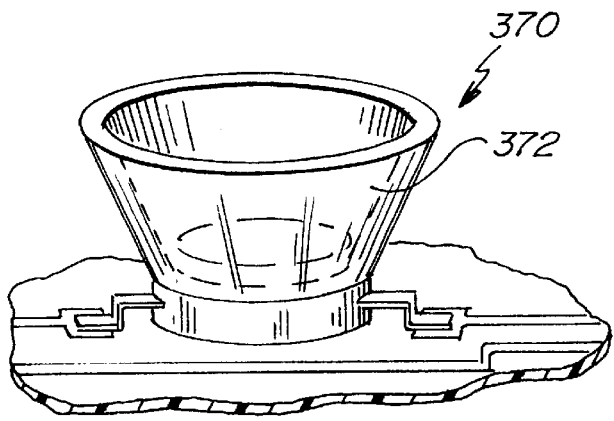
FIG. 27 is a detailed isometric view of a culminator cup.

Referring to FIG. 26 an array of culminator cups or reflectors 270 may be formed into a culminator assembly or array 392. The culminator assembly or array 392 is preferably adapted for positioning over an array of LED light sources 306. Examples of arrays of LED light sources 306 which may be utilized with a culminator assembly 392 are depicted in FIGS. 3–10, 12, 14, 15, 23–25, 31, 32, 34, 35, 37, 39, 40, 44, and 47.

Each culminator array 392 is preferably formed of a reflective material which has plurality of reflective cups 370 disposed there through. Each opening 394 is adapted for positioning over an LED light source 306. The culminator array 392 preferably has a sufficient thickness to establish an interior reflective surface having a sufficient dimension to reflect light as emitted from the LED light sources 306. Alternatively, the interior surface of each reflector cup 370 may be entirely or partially coated with reflective material at the discretion of an individual. It should be noted that the entire culminator assembly 392 is not required to be formed of reflective material if the interior surface of the reflector cups 370 are coated with reflective material.

The culminator array 392 may be formed in any shape as desired by an individual including but not necessarily limited to square, rectangular, triangular, linear, circular, oval, and special or other irregular shapes for use in reflecting light emitted from an LED light source 306. The interior surface of any desired number of culminator cups 370 may also be coated with reflective 374 and non-reflective 372 sections as earlier described.

It should be noted that the strip LED light source 308 and LED light sources 306 in frame 348 are preferably designed to operate on a 12 volt power supply which is available in a standard emergency vehicle battery. It should also be noted that the frame 348 and strip LED light source 308 are preferably enclosed in a waterproof protector to minimize the risk of contamination or failure from any exposure to moisture or dust or dirt. The use of the strip LED light sources 308 and frame 348 preferably minimize the necessity to modify the exterior of an emergency vehicle 300 through the placement of holes or other apertures. In these embodiments, the wires 354 and 316 may be adhesively secured to the exterior of a vehicle for entry into the power source and controller 50 at a common location.

It should be noted that the strip LED light source 308 may be used on other devices and are not necessarily limited to use on an emergency vehicle 300. It is anticipated that the strip LED light sources 308 may be used on a variety of apparatus including but not limited to snowmobiles, water craft, helmets, airplanes, or any other device which may accept use of an LED light source.

In FIGS. 40–43 a warning signal light 400 is depicted which in general includes a light source 402 and a rotatable reflector 404. The light source 402 may include one or more individual LED illumination devices 406. The light source 402 may include a base 408 which may be mounted on a post 410. The light source 402 may either be stationary or rotate at the preference of an individual.

A motor 412 is preferably electrically connected to a power supply for rotation of a wheel or gear 414. The wheel or gear 414 is connected to the motor 412 by a shaft 416. The wheel or gear 414 is in contact with, or is engaged to, a rotatable collar 418 which may be adapted to rotate freely about the post 410 during operation of the motor 412. The wheel or gear 414 may be formed of rubber material or any other desired material as preferred by an individual. Alternatively, the wheel 414 may include teeth and function as a gear for engagement to corresponding grooves and teeth as integral to the exterior surface of the collar 418.

An aperture 420 may pass through post 410 to receive wires 422 for the provision of power to LED light source 402. A washer or support device 424 vertically supports rotatable collar 418 on post 410 from a position below collar 418. A positioner 426 functions to restrict the vertical movement of the collar 418 upwardly during engagement of the motor 412 and rotation of the wheel 414 and collar 418.

A horizontal support arm 428 extends outwardly from collar 418. A vertical support arm 430 extends upwardly form horizontal support arm 428. Angular support arm 432 extends inwardly and upwardly from vertical support arm 430 for positioning of a reflector or mirror 434 above light source 402. The reflector or mirror 434 is preferably positioned at an approximate angle of forty-five degrees relative to the light source 402. Light as emitted vertically from the light source 402 may then reflect from the reflector 434 along a substantially perpendicular line of visual sight. The reflector 434 rotated ninety degrees is depicted in phantom line as an oval due to the angular offset of approximately forty-five degrees.

The use of motor 412 rotates wheel 414 which in turn rotates collar 418 and reflector 434 in a circular direction about light source 402 for the provision of an observed rotational warning light source. In addition, the light source 402 may be electrically coupled to a controller 50 to provide a modulated, alternating, variable, pulsating, or oscillating light source at the preference of an individual simultaneously to the rotation of the reflector 434 about light source 402.

Figure 41:
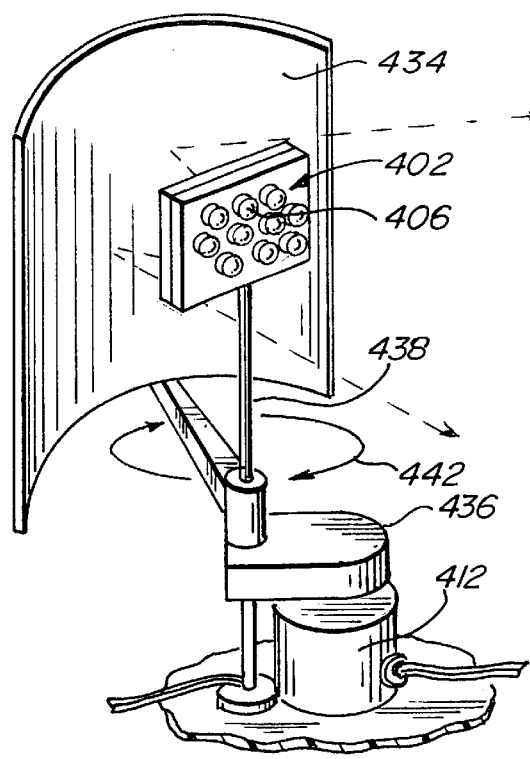
FIG. 41 is an alternative detailed isometric view of a reflector assembly.

Referring to FIG. 41 the warning signal light 400 includes a light source 402 which is rotatable in conjunction with the reflector 434. In this embodiment the motor 412 is connected to a first gear which is enclosed within casing 436. A second gear is also enclosed within casing 436 and is coupled to the first gear for rotation of the reflector 434. A vertical rod 438 is preferably affixed or integral to the second gear. The vertical rod 438 supports the LED light source 402 as positioned adjacent to reflector 434. An angled brace 440 is also preferably engaged to rod 438. Angled brace 440 supports reflector 434 during rotation of reflector 434 which represents a circular motion as depicted by arrow 442. In this embodiment reflector 434 is arcuate in shape and may be parabolic at the discretion of an individual. Light emitted from light source 402 may then be reflected by the arcuate reflector 434 along a desired line of sight. The engagement of the motor 412 rotates the light source 402 and reflector 434 to provide a rotational light source as observed by an individual. It should also be noted that the light source 402 may be coupled to a controller 50 to provide for a modulated, alternating variable, and/or pulsating light signal in conjunction with the rotation of the reflector 434.

Referring to FIG. 42, the reflector 434 is not required to be flat and may include a convex or concave face 444. The provision of a convex or concave face 444, is utilized to assist in the creation of a unique variable light effect as observed by an individual. Light as emitted from the light source 402 may then be reflected at any desired angle other than perpendicular for observation by an individual. The pulsating intensity of the light as observed by an individual may then be unique, especially when used in conjunction with the rotated reflector 434 and variable or modulated power intensity from the controller 50. In addition, the use of a convex or concave reflector 444 may expand or enhance the observation of the warning signal light 400 by individuals beyond a perpendicular line of sight. The warning signal light 400 may then be observed above or below a light source 402. The reflector 434 as rotated ninety degrees is depicted in phantom line and is generally oblong or oval in shape.

FIG. 43 represents graphically the variable or pulsating illumination of the observed light as reflected from the reflector 434 of FIG. 42. Time is represented along the x-axis and increasing brightness is depicted along the y-axis. The graph of FIG. 43 shows the gradual increase in brightness of the observed light as the reflector 434 is rotated to a maximum illumination corresponding to direct in line observation of the warning light signal and then the gradual decrease in observed light intensity as the reflector 434 is rotated away from direct in line sight. It should be noted that the observed warning light signal is not required to be extinguished and may be reduced to a minimum observable intensity of approximately thirty percent.

Figure 44:
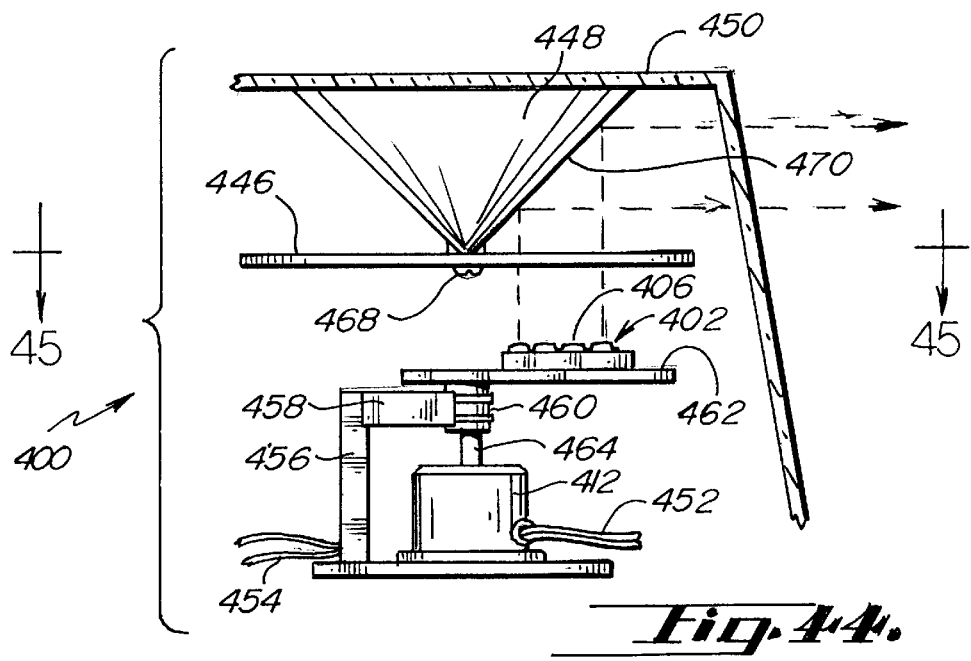
FIG. 44 is an alternative detailed partial cross-sectional side view of a reflector assembly.

Referring to FIG. 44, the warning signal light 400 in general includes a light source 402 which may be rotated through the use of a motor 412 for transmission of light through a filter 446 for reflection from a conical reflector 448 as mounted to the interior of a light bar or light support 450.

Power for motor 412 is supplied through wires 452 from a power source not shown. Power for the light sources 402 is provided through wires 454 in support 456. Brushes 458 may be in electrical communication with the power from the wires 454 to transmit electrical current to a second set of brushes 460 utilized to communicate power to the light sources 402. The base 462 of the light source 402 may preferably be formed of an electrically conductive material to facilitate the provision of power to the light sources 402.

Figure 45:
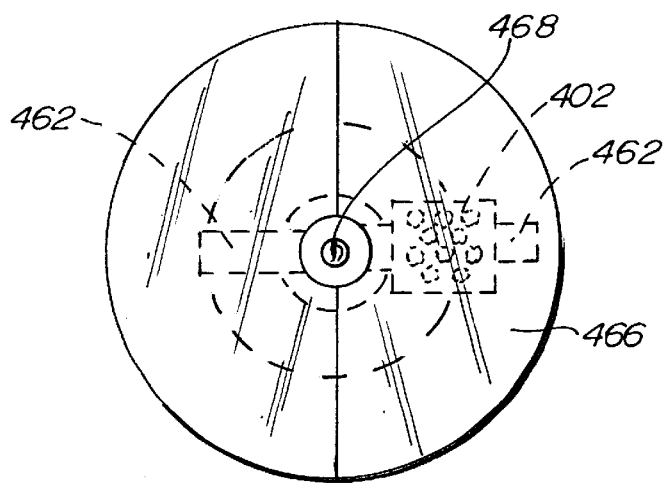
FIG. 45 is a partial phantom line top view of the reflector assembly taken along the line of 45—45 of FIG. 44.

A shaft 464 preferably extends between the motor 412 and the base 462 where operation of the motor 412 rotates the shaft 464 and the base 462 having the light sources 402. Light is transmitted vertically upward from the light sources 402 through the filter 446. (FIGS. 44 and 45.) The filter 446 may include one or more sections of tinted material 466. The filter 446 may be stationary or may be rotatable at the discretion of an individual. The tinted material 466 may be any color as desired by an individual or opaque to establish a desired illumination effect for an emergency warning signal light. Any number of tinted sections 466 or transparent areas may be placed on the filter 446. The filter 446 may be formed of glass or plastic or other sturdy material at the preference of an individual. The tinted sections 466 may be integral to or placed upon the filter 446 as desired. The filter 446 may be attached to the conical reflector 448 by a fastener 468.

The conical reflector 448 preferably includes a straight reflective edge 470. Alternatively, the reflective edge 470 may be concave or convex as desired by an individual to establish a unique lighting effect. The conical reflector 448 is preferably affixed to and descends from the top of a light bar or light support 450 as may be attached to an emergency vehicle 300.

Light transmitted upwardly from the light sources 402 passes through either a substantially transparent section or through the tinted or opaque material 466 which may block light transmission or alter the color of the light as desired. Light is then reflected from the conical reflector 448 at a desired angle for transmission through the vertical sections of the light bar or light support 450 for observation by an individual.

Figure 46:
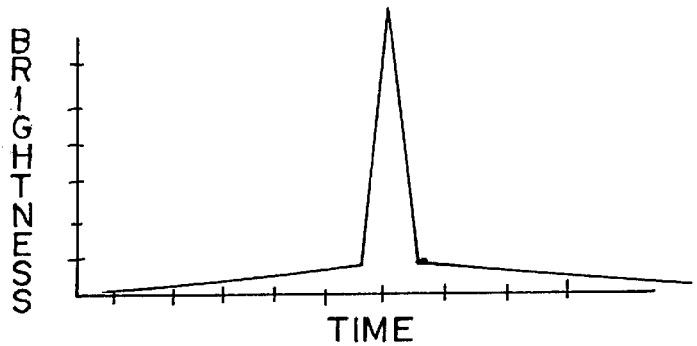
FIG. 46 is an alternative graphical representation of a modulated or variable light intensity curve.
Figure 47:
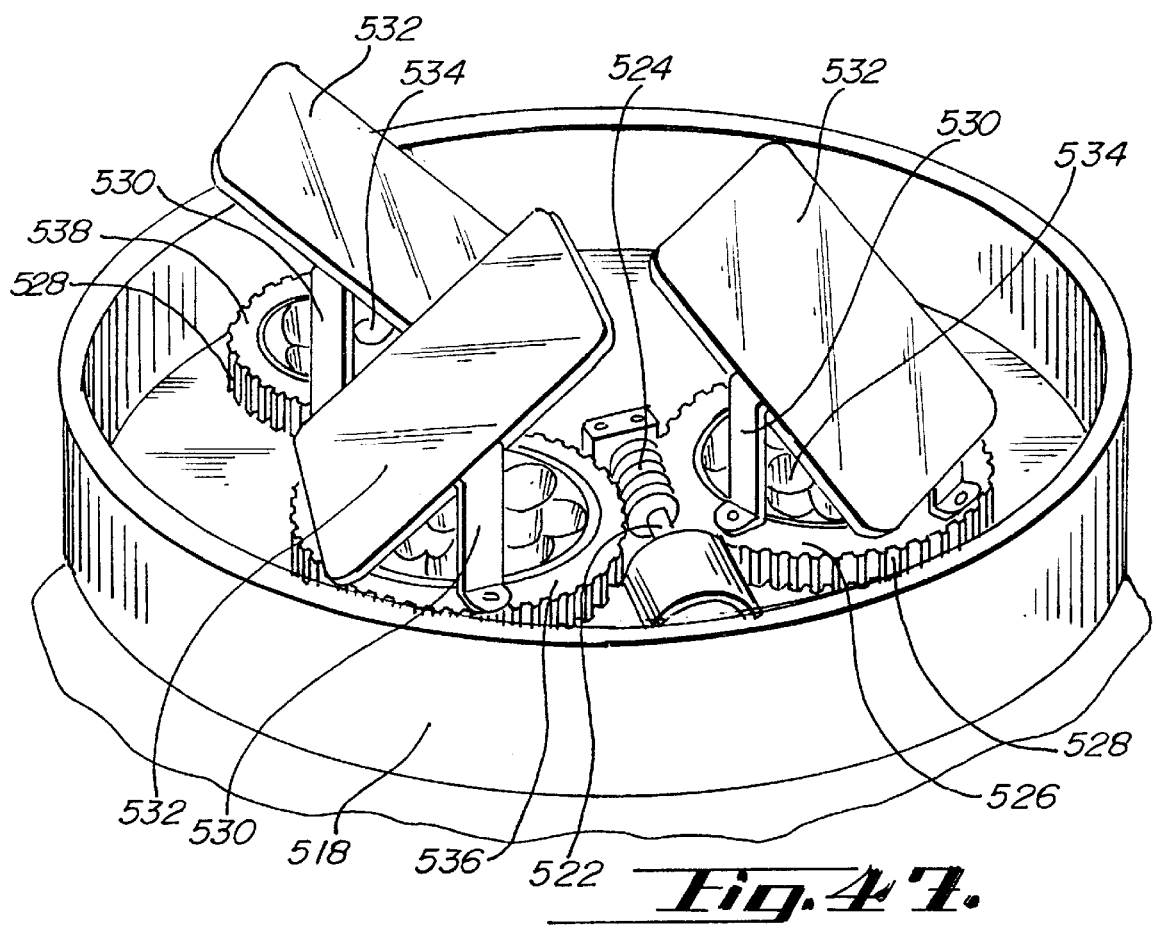
FIG. 47 is an alternative isometric view of a reflector assembly.

FIG. 46 represents graphically the intensity of the observed light as reflected from the conical reflector 448 of FIG. 44. Time is represented along the x-axis and observed brightness is represented along the y-axis. The observed light signal transmitted from the warning signal light of FIG. 44 is much steeper which corresponds to a shorter period of observation more similar to a flashing light signal. It should be noted that the light sources may also be coupled to a controller 50 for the provision of a variable, modulated and/or pulsating light effect.

Figure 31:
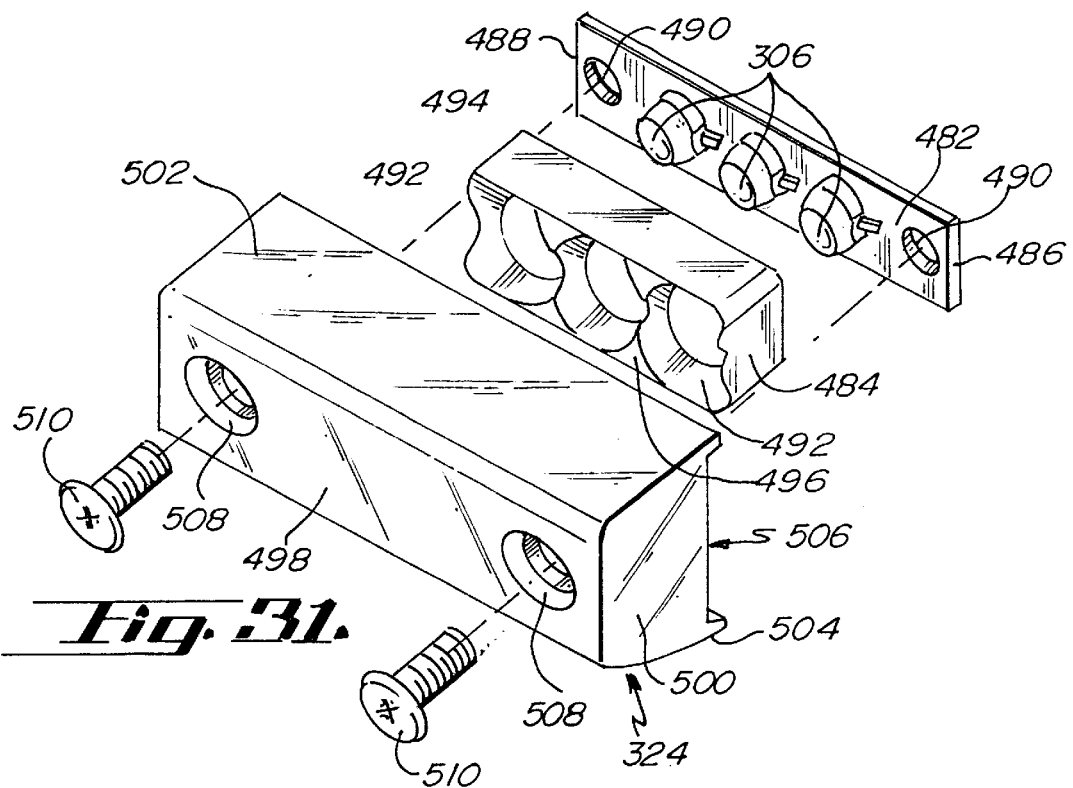
FIG. 31 is an exploded isometric view of an alternative culminator assembly and LED light source.
Figure 32:
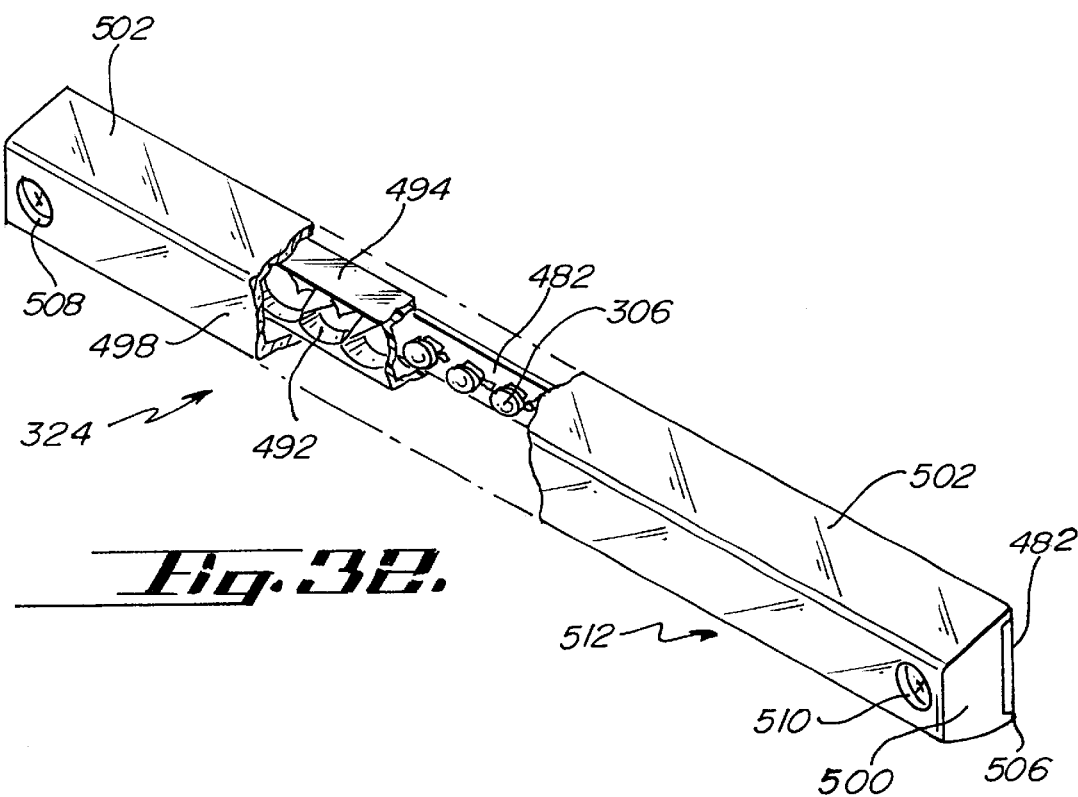
FIG. 32 is an alternative partial cut away isometric view of an alternative culminator assembly and LED light source.

Referring to FIGS. 31 and 32 a modular light support 480 in general includes an LED mounting surface 482 having one or more LED light sources 306, a culminator assembly 484 and a cover 324.

The LED mounting surface 482 is preferably elongate and includes a plurality of LED light sources 306. In general, one to five LED light sources 306 are disposed in a linear orientation along the LED mounting surface 482 which may be a circuit board as earlier described. The LED mounting surface 482 also preferably includes a first end 486 and a second end 488. An opening 490 is preferably positioned through the LED mounting surface 482 proximate to each of the first end 486 and second end 488.

The culminator assembly 484 preferably includes a plurality of reflector cup areas 492. The culminator assembly 484 preferably includes a plurality of support walls 494 and a top surface 496. The culminator assembly 484 preferably includes a plurality of openings 490. Each of the openings 490 is preferably sized to receivingly position and hold the individual LED light source 306 during assembly of the modular light support 480. The reflector cup areas 492 are preferably equally spaced along the culminator 484 to correspond to the spacing between the individual light sources 306 as disposed on the LED mounting surface 482.

The cover 324 is preferably transparent permitting transmission of light emitted from the LED light supports 306 therethrough. The cover 324 preferably includes a forward face 498, a pair of end faces 500, a top face 502 and a bottom face 504. Each of the pair of end faces 500 preferably includes a receiving notch 506 which is adapted to receivingly engage the LED light mounting surface 482 during assembly of the modular light support 480. An affixation opening 508 preferably traverses the forward face 498 proximate to each of the pair of end faces 500. A fastener 510 preferably passes through the affixation opening 508 for engagement to the opening 490 to secure the LED mounting surface 482 into the receiving notch 506. It should be noted that the culminator assembly 484 is then positioned within the interior of the cover 324 where the top surface 496 is proximate to the forward face 498. The illumination of the LED light sources 306 then transmits light through the forward face 498 for observation of an emergency warning light signal.

Specifically referring to FIG. 32 one or more modular light support 480 may be positioned adjacent to each other for the creation of a light bar or light stick 512. The modular light supports 480 and/or light bar or light stick 512 may be coupled to a controller 50 which may independently and/or in combination provide a plurality of independent and visually distinct warning light signals as earlier described. In addition, the controller 50 may provide modulated and/or variable power intensity to the individual LED light sources 306 to establish unique warning light signal effects. It should also be noted that the controller 50 may individually illuminate LED light sources 306 to provide for one or a combination of colored light signals as desired by an individual.

Any number of modular light supports 480 may be positioned adjacent to each other to comprise a light bar or light stick 512 at the preference of an individual. It should be further noted that a plurality of modular light supports 480 may be positioned at any location about the exterior or within the interior of a vehicle at the discretion of an individual. In one embodiment each of the individual modular light supports 480 will be electrically coupled to a power supply and controller for the provision of unique individual and visually distinctive warning light signals and combination warning light signals as earlier described Referring to FIG. 47 and alterative embodiment of a reflector assembly is disclosed. In general, the reflector assembly of FIG. 47 includes an enclosure 518. Positioned within the interior of enclosed 518 is preferably a motor 520 having a shaft 522 and a gear 524. A first support 526 preferably has a periphery having a plurality of teeth 528 adapted to releasably engage the gear 524. The first support 526 preferably includes a mirror bridge 530 which is preferably used to position a mirror 532 and a proximate angle of 45° relative to a LED light source 306. Preferably within the interior of the first support 526 is located a culminator assembly 534 which may include one or more reflective cups as earlier described. Individual LED light sources 306 are preferably positioned within each of the culminator cups of the culminator assembly 534 to maximize the direction of emitted light for reflection from the mirror 542.

On the opposite side of gear 524 is located second support 536. Second support 536 also includes a periphery having a plurality of teeth 528, a mirror bridge 530, a mirror 532, and a culminator assembly 534 disposed adjacent to a plurality of individual LED light sources 306.

A third support 538 is preferably adjacent to the second support 536. The third support 538 also preferably includes a periphery having a plurality of teeth 528, a mirror bridge 530, and a mirror 532 disposed at a 45° angle above a culminator assembly 534. A plurality of individual LED light sources 306 are preferably disposed within the reflector cups of the culminator assembly 534. It should be noted that the teeth 528 of the third support 538 and second support 536 are preferably coupled so that rotational motion provided to the second support 536 by the gear 524 is transferred into rotational motion of the third support 538.

In operation, the individual LED light sources 306 are preferably connected to a power source and/or a controller 50 as earlier described. The controller 50 may provide for any type of unique lighting effect including modulated or variable power intensity as earlier described. An infinite number of independent visually distinctive warning light signals may be provided for the rotational reflector as depicted in 487. It should also be noted that an infinite number of warning light signal combinations may also be provided by the controller 50 for use with the rotational reflector of FIG. 47.

Each of the mirrors 542 may be positioned for reflection and transmission of light to a desired field of vision relative to the rotational reflector. A flashing and/or rotational light source may be provided for observation by an individual.

It should be noted that the first support 526, second support 546, and third support 538 may be synchronized to provide for a unique warning signal light for observation by an individual. It should be further noted that the engagement of the motor 520 for rotation of the gear 524 simultaneously rotates the first support 526, second support 536 and third support 538 for the provision of a warning light signal.

LED technology enables the selection of a desired wave length for transmission of light energy from the individual LED light sources 306. Any wave length of visible or non-visible light is available for transmission from the LED light sources 306. As such, generally no filters are required for use with individual LED light sources 306. The individual LED light sources 306 may be selected to provide for any desired color normally associated with the use in emergency vehicles such as amber, red, yellow, blue, green and/or white.

It should be further noted that the controller 50 may simultaneously display any number of combinations of warning light signals. For example, the controller 50 may provide for a solitary light signal for transmission from a light source. Alternatively, the controller 50 may effect the transmission of two signals simultaneously from the identical light source where a first warning light signal is emitted from one portion of the light source and a second warning light signal is emitted from a second portion of the light source. Alternatively, the controller 50 may alternate the two warning light signals where the first area of the light source first transmits a first warning light signal and secondly transmits a second warning light signal. The second area of the light source initially transmits the second warning light signal and then transmits the first warning light signal. Further, the controller may transmit two independent and visually distinct warning light signals simultaneously within different areas of light source. The controller 50 may also reverse the warning light signals for simultaneous transmission between different areas of the light source. Further, the controller 50 may regulate the transmission of more than two visually distinct types of warning light signals from a light source at any given moment. The controller 50 may alternate warning light signals within different areas or enable transmission of warning light signals in reverse alternating order for the creation of an infinite variety of patterns of visually distinct warning light signals for use within an emergency situation. The controller 50 may also permit the transmission of a repetitive pattern of warning light signals or a random pattern of visually distinct warning light signals at the preference of an individual.

Figures 51, 52:
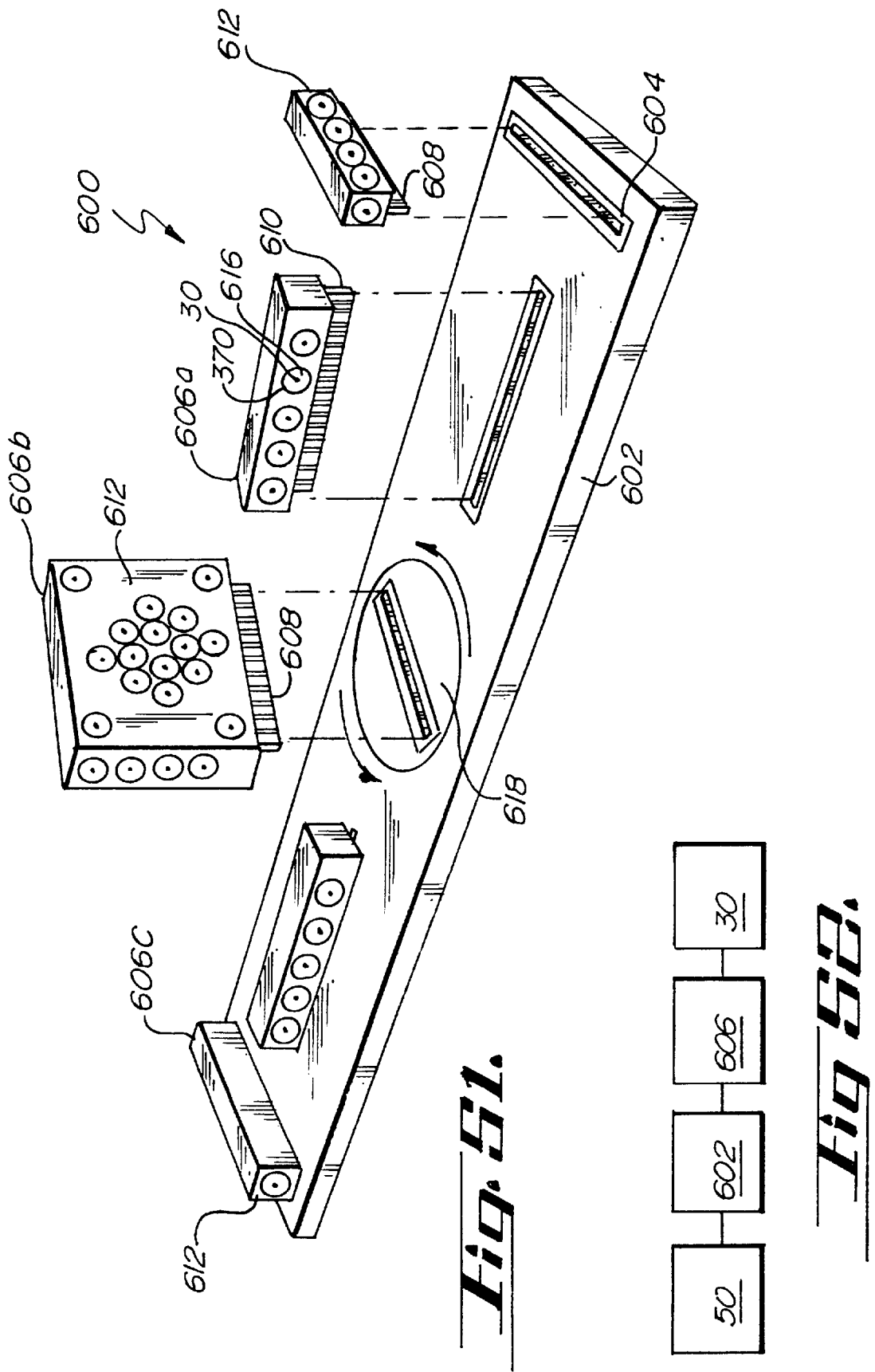
FIG. 51 is a perspective view of a modular warning light signal according to an embodiment of the invention.
FIG. 52 is a block diagram of an electrical schematic of an embodiment of the invention.

Turning to the embodiment shown in FIG. 51. FIG. 51 shows a possible configuration of a warning signal light 600 having modular components. In the embodiment shown a light support 602 has a plurality of module receiving ports 604. The module receiving ports 604 are constructed and arranged to provide electrical communication respectively to a module support member 610 of a module 606 received therein. Each of the module support members 610 may be made up of connection teeth or contacts 608 which electrically contact and engage the receiving ports 604 when inserted therein. Each module 606 has at least one visible light signal display surface 612 which has one or more light sources 30 removably mounted thereon. Preferably the light sources 30 are light emitting diodes, such as have been previously discussed. About each light source 30 may be a culminator 370 as earlier described. Furthermore, each culminator 370 may include a reflective surface 616 at least partially disposed thereon. Reflector 616 more efficiently direct the light emitted from light source 30 in a desired direction. In an additional embodiment of the invention the reflector 616 may be adjustable so as to redirect and/or focus light emitted from the light source 30 during use. Also, the visible surface 612 or the individual culminator cup 370 and reflectors 616 may also have one or more lenses equipped thereon to provide the warning signal light with the ability to magnify and/or diffuse emitted light as may be desired.

In the embodiment shown, the module support members 610 and the module receiving ports 604 respectively are uniform in size. The uniformity of the ports 604 and the members 610 allows modules 606 to be readily replaced and also provides the invention with the capacity to have variously sized and shaped modules 606 to be interchanged and arranged in various configurations as desired by a user. For example a relatively elongated module, such as is indicated by reference numeral 606a, could be positioned in any of the various ports 604 shown and could likewise be replaced with any other module such as the more vertically oriented module 606b, or the remaining module type 606c. Such modularity and standardization of connections provides the present invention with a tremendous variety of module configurations which may be readily reconfigured as desired.

In addition to providing a variety of module types, the present invention also provides for a variety of mechanisms to be associated with the ports 604. In the embodiment shown for example, a rotation mechanism 618 has a port 604 mounted thereon. Any number of rotation mechanisms 618 could be included on the surface of the support 602 such as is shown. Alternatively a similar mechanism or mechanisms could be included on one or more surfaces of a module 606 to provide a dedicated rotation module. The rotation mechanism 618 could also be configured as a gyrator or other motion producing device.

It must also be noted however that the three types module varieties 606a, 606b and 606c presently shown and described are merely three examples of potential module sizes and shapes. It should be understood that modules 606 may be configured in any size or shape as desired. As indicated above, in order to ensure the greatest ease of use and elegance in design, it may be desirable to provide the various modules 606 with uniform support members 610 and also provide the support 602 with similarly uniform ports 604. However, in order to ensure that only certain module types are utilized in certain ports, it is recognized that the present invention could also utilize a support 602 having a variety of port 604 configurations with modules 606 having module supports 610 sized to correspond with specific ports and/or ports 604.

In keeping with the modular construction of the present invention, it should also be understood that the support 602, like most of the components thus described could be embodied in a variety of shapes and sizes. Preferably, the support 602 is a circuit board with a number of ports 604 included thereon. In one aspect of the invention, the support 602 could be embodied as several supports with each support having a unique arrangement of modules and light sources. The electronic schematics shown in FIGS. 52–55 show some possible configurations and their associated electronic connections between the various components of the invention.

Starting in FIG. 52, an embodiment of the invention is showed where the controller 50 is in electronic communication with one or more supports 602, which are in turn in electronic communication with one or more modules 606, which are in turn in electronic communication with one or more light sources 30. FIG. 53 shows a similar series of electric pathways, but in the present embodiment the controller 50 may also be in direct electric communication with each of the various components, support(s) 602, module(s) 606 and light source(s) 30, independent of one another.

In the embodiment shown in FIG. 54, the individual visible surfaces 612 of the various modules 606 may be controlled by the controller 50. Though not indicated in the schematic, the various components: supports 602, modules 606, visible surfaces 612 and light sources 30 may be independently controlled by the controller 50 or may be selectively activated via the electronic pathway shown.

Figure 55:
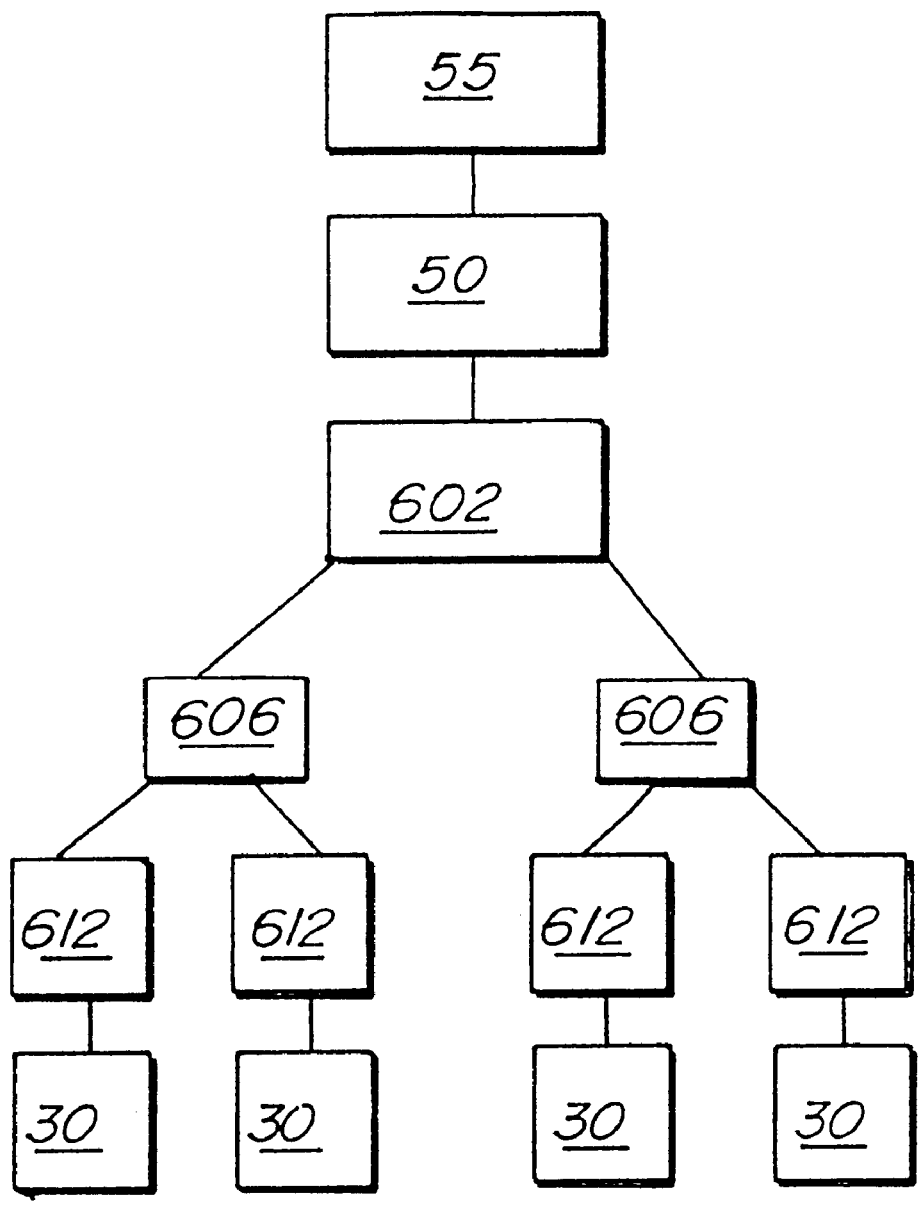
FIG. 55 is a block diagram of an electrical schematic of an embodiment of the invention.

In the embodiment shown in FIG. 55, a support 602 includes a controller 50. Each controller 50 is in electronic communication with an external controller 55 in the manner previously discussed above. The embodiment shown in FIG. 55 could include numerous independently controlled supports 602 which are in communication with the external controller 55. It should also be noted that individual controllers 55 could also be included with each modules 606 to provide for a warning signal light having numerous predetermined light signals or patterns which could be displayed by sending a single signal from the external controller 55 to the various controllers 50.

In reference to the various embodiments shown in FIGS. 52–55, one of ordinary skill in the art will recognize that additional components could be added to any of the various embodiments shown and that numerous configurations other than those shown or described could be created. The present invention is directed to all possible arrangements of the various components described herein regardless of the number, type or arrangement of the components described herein.

It should also be noted that the controller 50 and/or external controller 55 described in relation to FIGS. 52–55 may provide modulated and/or variable power to individual light sources 30 or modules 606 as earlier described. It should also be noted that the controller 50 or external controller 55 may selectively illuminate any combination of individual light sources 30 or modules 606 to provide an infinite variety of patterns and/or combinations of patterns for a warning light signal independently of, or in combination with, the provision of modulated or variable power intensity as earlier described.

Figure 56:
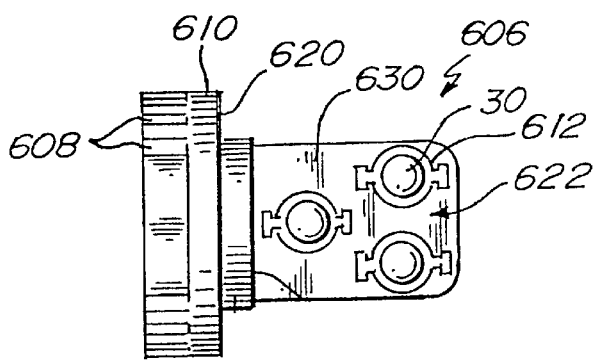
FIG. 56 is a detailed front view of a replacement LED light source.
Figure 57:
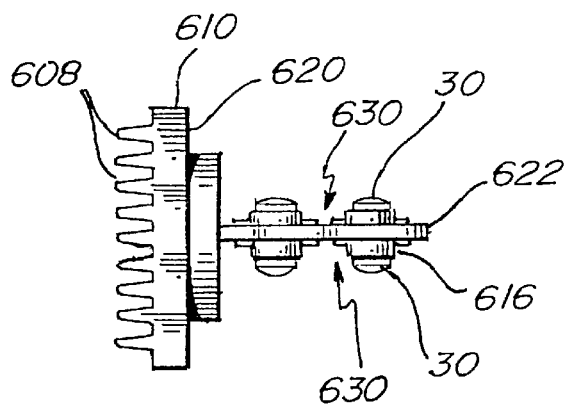
FIG. 57 is a detailed side view of a replacement LED light source.
Figure 58:
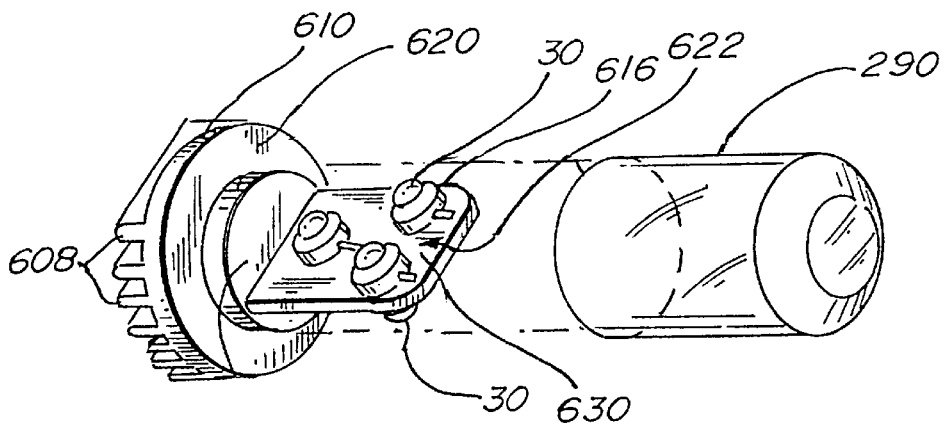
FIG. 58 is a detail isometric view of a replacement LED light source and cover.

Turning to FIGS. 56–58, several views of an example of a module 606 is shown. Typically, a module will include a base portion 620 and light mounting portion 622. The base portion 620 will include the support member 610 which will typically include a plurality of electric contacts 608. The support member 610 and the electric contacts 608 are removably engageable to a port 604 as previously described. The contacts 608 provide the module 606 with an electric path to the support 602 and controller 50 such as is shown in FIGS. 51–55.

The light mounting portion 622 preferably is a vertically oriented circuit board 630 which includes one or more light sources 30 and associated culminator cups 370 with reflective surfaces 616 removably mounted thereon. The light sources are preferably LEDs. As shown in FIG. 51 the light mounting portion 622 may be enclosed in a transparent cover or dome such as protector 290.

As depicted in FIGS. 61, 62, 65, and 66, an LED take-down light 700 and an LED alley light 702, 800, 808 are shown as being integral to a light bar 704, 760 mounted to an emergency vehicle 706.

The LED take-down light 700 may be formed of one or more LED's 336 as earlier described. The LED's 336 forming the LED take-down light 700 may each be surrounded by a culminator 370 as depicted and described with reference to FIGS. 26–32 having one or more reflective sections 374 for transmission of light along a desired line of illumination. Alternatively, a reflector 350, 434 may be positioned adjacent to LED light sources 336 as described in reference to FIGS. 37–47. The reflector 350, 434 used in conjunction with take-down light 700 may be stationary or may be rotatable through the use of a rotational device at the preference of an individual. The LED's 336 forming the LED take-down light 700 may also be angularly offset with respect to horizontal to provide illumination along a preferred line of illumination as earlier described and depicted within FIGS. 13 and 14.

The LED take-down light 700 may be integral to, or mounted upon, the light bar 704, 760 at the discretion of an individual. It should be noted that the LED take-down light 700 may be formed of panels or modules of LED illumination sources as depicted and described in FIGS. 31–32 and 51–58. The LED take-down light 700 may also include circuit boards as earlier depicted and described further using culminator reflectors 370, within a frame or support assembly as earlier described.

The LED take-down light 700 preferably provides enhanced utility for an emergency vehicle warning signal light system for reduction of current draw requirements, electromagnetic emissions while simultaneously providing increased useful life, and enhanced true light output color for an illumination source. The use of an LED take-down light 700 incorporating LED technology improves illumination of areas in front of an emergency vehicle by flooding the area occupied by a stopped vehicle with light while simultaneously secreting the actions and location of law enforcement personnel during law enforcement activities. The illumination of the LED take-down light 700 also assists in enhancing the visibility of an emergency vehicle during dark illumination conditions which in turn improves the safety for law enforcement personnel.

The LED take-down light 700 is preferably coupled to a power supply, battery, or other low voltage power source. The take-down light 700 may also be electrically coupled to a controller 50 for illumination of all or part of the LED light sources 336 to provide for a desired level of illumination for an area adjacent to an emergency vehicle. The controller 50 may alternatively provide a constant light effect, strobe light signal, pulsating light signal, flashing light signal, the illusion of rotation or oscillation for the light signal, or a modulated light signal or may include images or characters as earlier described.

Further, the intensity of the LED light sources 336 may be selectively regulated by a controller 50 dependent upon the darkness of the conditions to be illuminated during law enforcement activities. The controller 50 may be coupled to a light or photosensitive detector to assist in the selection of a desired level of light output dependent upon the environmental conditions encountered by the law enforcement personnel during use of the LED take-down light 700.

The LED take-down light 700 may be formed of one or more adjacent panels or modules 480 of LED illumination sources 336 along a front face 710, 764 for a light bar 704, 760. Alternatively, a plurality of panels or modules 480 of LED light sources 336 may be formed along the front face 710, 764 of the light bar 704, 760 as well as a plurality of panels or modules 480 of LED light sources 336 along the rear face 712, 776 of the light bar 704, 760. It should be noted that the panels or modules 480 selected for the LED illumination sources 336 may be linear, square, rectangular and/or may have two or more sides, or may be a single illumination source at the discretion of an individual. Each individual panel or module 480 of LED illumination sources 336 may be independently illuminated by a controller 50 to provide one of a plurality of individual and distinct warning light effects as earlier described. For example, a first, third, and fifth panel or modules 480 of LED sources 336 may be illuminated where the second and fourth panels or modules 480 are not illuminated. Alternatively, the first, third, and fifth panels or modules 480 of LED light sources 336 may be continuously illuminated and the second and fourth panels or modules 480 may be illuminated to provide a flashing or strobe light signal. It should be noted that illumination of any combination of panels or modules 480 may be provided as desired to create a preferred unique warning light signal for the LED take-down light 700. A constant illumination signal may be provided or a flashing, strobe, and/or modulated light intensity may occur to provide one of a plurality of distinct light signals as desired within an emergency situation.

It should be further noted that the LED light sources 336 within the LED take-down light 700 may be angularly offset as depicted within FIG. 14 to provide a maximum illumination at a preferred distance adjacent to the front of a law enforcement vehicle.

The LED take-down light 700 may be used within any desired type of emergency vehicle including but not limited to automobiles, motorcycles, snowmobiles, personal watercraft, boats, trucks, fire vehicles, ambulances, and/or helicopters.

The LED take-down light 700 may be preferably releasably secured to the top of an emergency vehicle or light bar 704, 760 through the use of standard affixation mechanisms including, but not limited to, the use of suction cups, hook and loop fasteners, brackets, screws, bolts, and/or other fasteners at the preference of an individual. It should be noted that the LED take-down light 700 may be permanently secured to a light bar 704, 760 or may be releasably attached thereto for separation and use as a remote beacon as described in FIG. 15.

The take-down light 700 may alternatively be formed of strips of LED light sources 308 as previously disclosed with respect to FIG. 34. During use of strip LED light sources 308 a culminator/reflector 370 may be used for positioning adjacent to each individual LED light source 336 to reflect light along a desired line of illumination. The strip LED light sources 308 may preferably include adhesive backing material and transparent protective covers to prevent contamination including exposure to water which may adversely affect the performance of the individual LED light sources 336. The adhesive backing material may be used to permanently or releasably secure the strips of LED light sources 308 in a desired location within the LED take-down light 700. Alternatively, the take-down light 700 may be integral to light bars previously illustrated and described.

As depicted in FIGS. 61, 62, 65, and 66, the LED alley lights 800, 808 provide illumination perpendicularly outward from a vehicle illuminating areas adjacent to the drivers side and passengers side of the vehicle 706. The LED Alley lights 800, 808 are almost identical in construction and functionality to the LED take-down light 700. The LED alley lights 800, 808 may be mounted to a mechanical pivot, gears, and/or rotational device which may include an electric motor. The rotation of the mechanical pivot, or gears may alternatively be terminated to permit fixed angular illumination of areas adjacent to a law enforcement vehicle 706 which are not perpendicular to either the drivers or passenger sides in a manner similar to the functionality and operation of a spot light. In this regard, the LED alley lights 800, 808 may be manipulated forwardly, rearwardly, upwardly, and/or downwardly to provide illumination of a desired area relative to an emergency vehicle 706. The LED alley lights 800, 808 may be integral to, or removable from, the light bar 704, 760. As such, the LED alley lights 800, 808 may be releasably secured to the ends of the light bar 760 through the use of fasteners 778 such as bolts and nuts, screws, adhesives, straps, and/or hook and loop fabric material at the preference of an individual. It should be noted that an individual may simultaneously illuminate the LED take-down light 700 and the LED alley lights 800, 808 or may alternatively illuminate the LED alley lights 800, 808 independently from the LED take-down light 700 as desirable within an emergency situation.

Referring to FIGS. 61, 62, 65, and 66, the take-down light 700 may be positioned inside of a housing, base, or enclosure 780 which preferably has a transparent surface 782 permitting light as emitted from LED light sources 784 to pass therethrough. Within the interior of the base/housing 780 are preferably located one or more light emitting diode light sources 784. Each LED light source 784 may include one or more individual light emitting diodes 786 as integral to circuit board 788. The functions and operation of LED light sources, LED's, and circuit boards are earlier described with reference to FIGS. 31 and 32 herein. Each LED light source 784 may also include electrical couplers or connectors 790 which may be adapted for penetrating engagement into a receiving slot 792. The LED light sources 784 may be modular as earlier described with reference to FIGS. 51–58 to facilitate ease of replacement herein. An individual may thereby easily replace and/or substitute an LED light source 784 with another light source having the same or different colors or intensity characteristics as desired by an individual. It should be noted that the circuit board 788 and/or LED light sources 784 may be panels or strips as described with reference to FIGS. 34 and 35.

The circuit board 788 may additionally include heat sink wells 344 as described with reference to FIG. 36. The LED light sources 784 may be either removably or fixedly secured to the housing/enclosure 780 at the preference of an individual. It is therefore apparent that alternative colors may easily replace current LED's 786 and/or replacement LED modules by insertion into and/or removal from a corresponding receiving slot 792.

The LED lights 786 are preferably spaced about circuit board 788 in any desired pattern and/or combination including the use of a linear configuration. Adjacent to each LED light source 784 is preferably positioned a reflector which may be a culminator 730, 534, as earlier described in reference to FIGS. 26–32 and 47. Alternatively, a reflector or mirror 802, 434, 350, as described in reference to FIGS. 21, 22, 37–39, 40–42, and 47, may positioned adjacent to LED light sources 784 to reflect light emitted by LED's 786 in a desired direction for maximization of illumination characteristics for the alley lights 800, 808 and/or take-down light 700. The utility of the alley lights 800, 808 and/or take-down light 700 is thereby enhanced. The reflectors 370, 534, 434, 802, or 350 may be integral and/or attached to circuit board 788 or to a frame or support adjacent to circuit board 788 to reflect light emitted from LED's 786 along a desired line of illumination. The reflector/culminators 370, 534, 434, 802, or 350 may be secured in a desired location through the use of adhesives and/or mechanical devices.

Within the housing/enclosure 780 is preferably located a motor 794 having a worm gear 796 engaged to a shaft 798. Engagement of motor 794 rotates shaft 798 in turn rotating worm gear 796. The motor 794 is preferably electrically coupled to the electrical system and/or controller 50 for the emergency vehicle.

A first alley light 800 may be positioned within housing 780 proximate to motor 794. The first alley light 800 may be stationary and/or rotatable relative to the light bar 760 at the preference of an individual. The first alley light 800 is preferably adapted to flood the environment perpendicular to the sides of a vehicle with light, such as down and "alley", by a passing emergency or law enforcement vehicle. The first alley light 800 is preferably formed of one or more LED's 786 which are preferably each positioned within a culminator reflector 802 for reflection and maximization of light transmission along a desired path of illumination. The first alley light 800 may or may not be engaged to a gear 804. If rotation of the first alley light 800 is desired, then gear 804 may include a receiving slot 792 to provide electrical connection and power to the LED light source 784 for provision of light. Gear 804 may also be coupled to worm gear 796 for the provision of rotation and/or oscillation motion. If motion of first alley light 800 is not desired, then stationary positioning of LED light sources 784 relative to housing 780 may be provided with suitable electrical connection to a vehicle power source. Take-down light 700, first alley light 800, second alley light 808 may be alternatively formed in any shape as earlier described in reference to FIGS. 4–10, 12, 23–25, 31, 32, 34, 35, 37–39, 51, and 56–58. Take-down light 700, first alley light 800, and second alley light 808 may be stationary within housing 780.

A second gear 806 may be provided for central positioning within housing 780. The second gear 806 may preferably be coupled to gear 804 which may in turn be coupled to worm gear 796 as connected to shaft 798. Rotation of shaft 798 by motor 794 thereby imparts rotation of gear 804 and second gear 806. Alternatively, the shaft 798 may be elongate including worm gear 796 for direct coupling to second gear 806. Rotation of 360° or oscillating rotation of second gear 806 may therefore be provided.

Second gear 806 may also include a receiving slot 792 adapted to receivingly engage electronical connectors 790 as integral to circuit board 788 of LED light sources 784. Light sources 784 also preferably include a plurality of individual LEDs 786 which may each be positioned within a culminator 534, 370, 802 as earlier described. A controller 50 as earlier described may be electrically connected to each LED light sources 784 as coupled to either gear 804, second gear 806, third gear 810, and/or housing 780 for selectively illumination of individual LED's 786, or for illumination of a combination of LED's 786 as desired. It should be noted that the features as earlier described for controller 50 are equally applicable for use with the take-down light 700, first alley light 800, and second alley light 808, relative to distinct types and combinations of types of warning light signals including the use of modulated and/or variable light or power intensity for the creation of a desired unique or combination warning light effect.

Second gear 806 may be further coupled to third gear 810 which may include a receiving slot 792 adapted for electrical coupling to connector 790 of take-down light 700.

Second alley light 808 is preferably designed to be rotated and to sweep forwardly to the front of an emergency vehicle at such times when the intersection clearing light mode has been activated. During activation of the intersection clearing light mode, the take-down light 700 as electrically coupled or integral to third gear 810 will rotate sweeping to the outside corner of an emergency vehicle.

The controller 50 is preferably in electrical communication with the take-down light 700, the first alley light 800, and the second alley light 808. Any number of take-down lights 700 or alley lights 800, 808 may be used in association with a light bar 704, 760. The controller 50 additionally regulate the rotation of the motor 794 for imparting rotation to the take-down light 700, and/or the alley lights 800 and 808.

The controller 50 activating the motor 794 may selectively initiate an intersection clearing illumination mode or sequence. Motor 794 causes the shaft 798 to rotate imparting motion to the worm gear 796. The rotation of the worm gear 796 may be transferred to the first alley light 800 through the coupling to the first gear 804. Alternatively, the worm gear 796 may be directly coupled to the second gear 806. In another embodiment, motion may be imparted to the second gear 806 through the use of a tie bar 842 as connected between the second gear 806 and the first gear 804. Rotation of the worm gear 796 rotates first gear 804 whereupon motion may be transferred to the second gear 806 for movement of the second alley light 808. Rotation may be further transferred to the take-down light 700 via the coupling of the third gear 810 to the second gear 806. The tie bar 824 may extend between gear 804 and second gear 806 to synchronize motion, rotation, and illumination of the first alley light 800 relative to the second alley light 808 and take-down light 700.

Each of the first alley light 800, second alley light 808, and take-down light 700, are preferably in electrical communication with a power source for a vehicle and are further in communication with the controller 50. The controller 50 may independently impart motion to the take-down light 700, first alley light 800, and second alley light 808. The alley lights 800, 808, and take-down light 700 may be selectively illuminated without initiation of rotational motion as regulated by the controller 50. Alternatively, the controller 50 may signal engagement of the motor 794 to impart rotation to any one of the first alley light 800, second alley light 808, and/or take-down light 700 for use as an intersection clearing light. The controller 50 is therefore capable of simultaneously regulating motion of the rotational devices such as gears 804, 806, and 810 and illumination of selected individual or groups of LED's 786 to provide independent or combination light effects.

The intersection clearing light mode may generally be initiated by the controller 50 which signals motor 794 to rotate second gear 806 either through rotation of first gear 804 or through direct contact with worm gear 796. The first or at rest position for the second alley light 808 preferably directs the transmission of light in the direction depicted by arrow 812 which is generally perpendicular to the longitudinal axis of a vehicle. As the intersection clearing light mode is engaged, the counter clockwise rotation of gear 804 causes the clockwise forward rotation of the second gear 806 according to arrow 814 until an angle of forward rotation 816 is achieved. The direction of forward rotation 816 preferably transmits light emitted from LED light sources 784 forwardly towards a corner of a vehicle at an approximate angle of 45°. The controller 50 may then continue to rotate the gears 804, or 806, in a counter clockwise direction for 360° rotation, or alternatively the controller 50 may signal the motor 794 to reverse direction to rotate the second alley light 808 rearwardly back to the first at rest position indicated by number 812. During the clockwise rotation the second gear 806, third gear 810 and take-down light 700 may be rotated in a counter clockwise direction. The initial at rest position for the take-down light 700 is forwardly with respect to the alley lights 800, 808. The engagement of the intersection clearing light mode rotates the take-down light 700 outwardly towards the sides of an emergency vehicle from a first position indicated at 818 to a second position indicated at 820 as depicted by arrow 822.

Alternatively, the first alley light 800 may be rotated simultaneously with the second alley light 808 by engagement between the first gear 804 and second gear 706. Synchronous rotation between the first alley light 800 and the second alley light 806 may be provided through the use of the tie bar 824 or through direct coupling engagement of gears 804 and 806.

Figure 66:
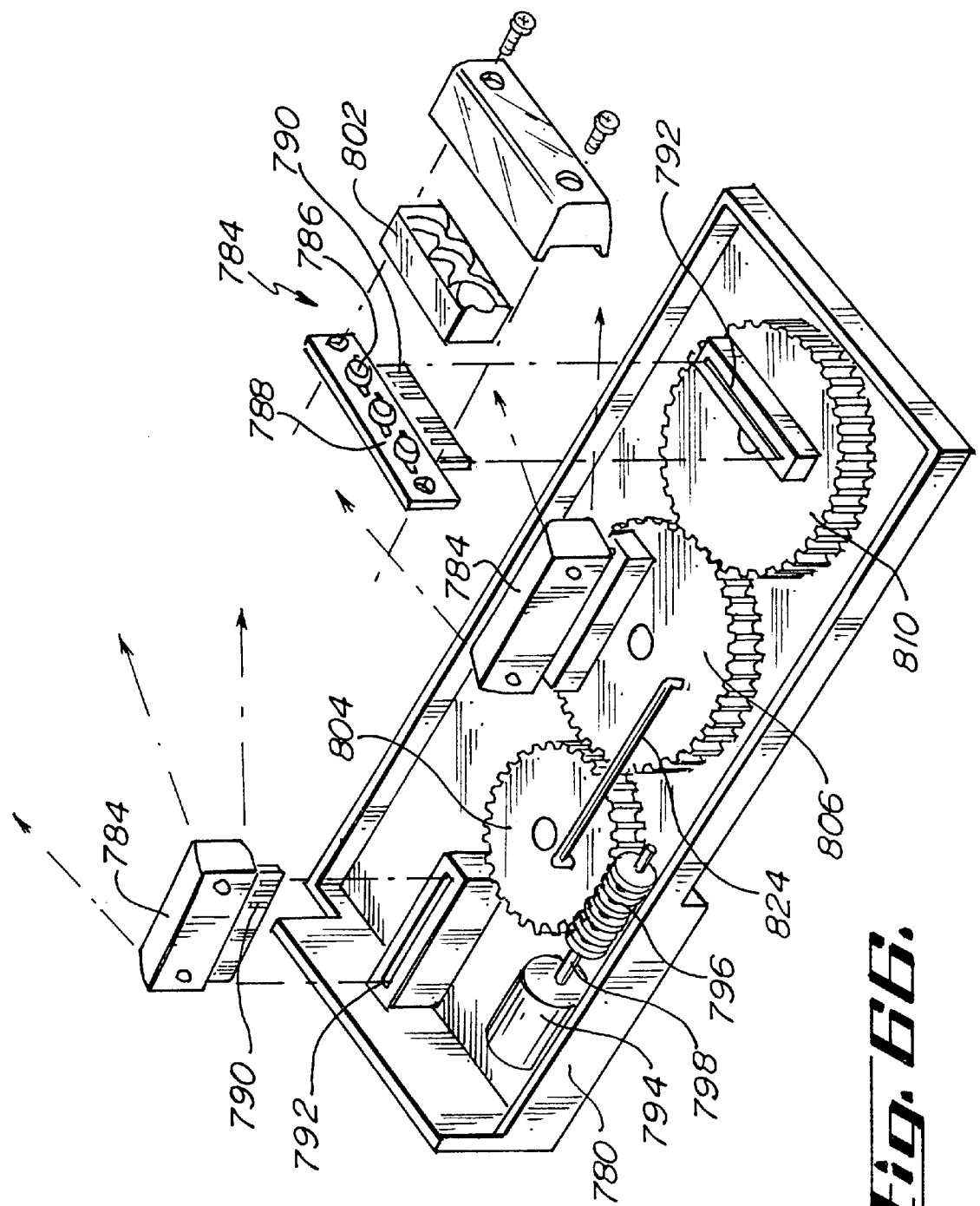
FIG. 66 is an exploded isometric view of the take-down light and alley light.

In an alternative embodiment as depicted in FIG. 66, the first gear 804 is not required to be connected to the second gear 806 with the exception of the tie bar 824. The tie bar 824 preferably extends between the first gear 804 and the second gear 806 and is pivotally and rotatably engaged to each of the first and second gears 804, 806 respectively. The initial positioning of the tie bar 824 on the first gear 804 may be initially indicated as the at 0° location. The initial position of the tie bar 824 on the second gear 806 may also be initially indicated as the at 0° location where the tie bar 824 extends in a linear direction between the first and second gears 804, 806 proximate to the circumference of each of the first and second gears 804, 806 respectively.

The second alley light 808 is initially positioned for transmission of light outwardly from the housing 780 opposite to the location of the tie bar 824. The second alley light 808 is preferably positioned for light transmission at a location approximately 180° from the tie bar 824 on the second gear 806.

As the motor 794 is engaged, the first gear 804 may be rotated in either a clockwise or counter clockwise direction relative to the housing 780. A clockwise rotation or the first gear 804 will be described herein for transfer of motion to the second gear 806 and third gear 810. Alternatively, the motor 794 may be configured to rotate the first gear 804 in a clockwise direction for a desired period of time or distance, and then reverse directions for counterclockwise rotation of the second gear 806 for a desired period of time or distance. It should also be noted that in an oscillating sequence the first gear 804 may be initially rotated 90° in a clockwise direction or counter clockwise direction and then the direction of rotation may be reversed for rotation of 90° or 180°, whereupon rotation may again be reversed for continued rotation of either 90° or 180° in the initial direction.

In a 360° rotation cycle of the first gear 804 in a clockwise direction, motion is transferred to the second gear 806 and third gear 810 in a push-pull configuration through the tie bar 824. Clockwise rotation of the first gear 804 from a position of 0° to a position of approximately 90° causes the second gear 806 to be pulled by the tie bar 824 moving the position of the second alley light 808 from an initial position of 180° to a position of approximately 270°. Continued rotation of the first gear 804 from a position at 90° to a 180° location preferably causes the second gear 806 to be pushed by the tie bar 824 causing the second alley light 808 to be rotated in a reverse direction from a 270° position back to a 180° position. Continued rotation of the first gear 804 in a clockwise direction from a position 180° to a 270° location in turn causes the tie bar 824 to pull the second gear 806 causing the second alley light 808 to continue to be rotated in a reverse direction from a position of 180° to a 90° location. Continued rotation of the first gear 804 in a clockwise direction from a 270° position to a 360° or initial position in turn causes the tie bar 824 to push the second gear 806 causing the second alley light 808 to reverse directions to be rotated from a 90° position to an initial or starting position of 180°.

Rotational motion is also, in turn, transferred to the third gear 810 due to the coupling engagement with the second gear 806. The rotational motion of the third gear 810 relative to the second gear 806 is in the opposite direction. The initial positioning of the take-down light 700 on the third gear 810 is preferably offset relative to the second alley light 808. The initial positioning of the second alley light 808 may be indicated as 180° and the initial position of the take-down light 700 may be initially indicated as 270°. The third gear 810 and the take-down light 700 are, therefore, preferably initially rotated from 270° in a counter clockwise direction to approximately 180°. The rotation of the third gear 810 and the take-down light 700 is then reversed from 180° back to 270° and then to 360° where rotation may be reversed back to 270° at the preference of an individual. The take-down light 700 therefore wags and oscillates between 360° or 0° to 180° through an initial positioning of 270°. Simultaneously, the second alley light 808 is wagged or oscillated between 90° and 270° through an initial position of approximately 180°.

The offset positioning of the second alley light 808 relative to the take-down light 700 prevents obstructed contact between the two light sources 784 permitting free rotational motion therebetween. The offset positioning of the second alley light 808 relative to the take-down light 700 enables the utilization of oversized or enlarged LED light sources 784 as engaged to the second or third gears 806, 810 respectively. The illumination as transmitted by the LED light sources 784 may thereby be significantly increased for unobstructed rotation between the second and third gears 806, 810.

Alternatively, the rotation of the second gear 806 and third gear 810 may occur through an arc of approximately 3600. It should be noted that the controller 50 is not required to continuously illuminate either the take-down light 700, first alley light 800, and/or second alley light 808 where the area of illumination will not be visible to an individual relative to a vehicle. Alternatively, the first gear 806, and third gear 810 may be rotated to a desired position such as indicated by the numbers 820, 816, and oscillated for return to an initial position 818, 812, at the discretion of an individual. The controller 50 may regulate the rotation of the gear 804, second gear 806, and third gear 810, for illumination of LED's 786 during use as an intersection clearing light. The intersection clearing light, take-down light, and/or alley lights, are preferably positioned inside the housing 780 located at the distal ends of LED light bar 760 as depicted in FIG. 63. The intersection clearing light, take-down light, and/or alley lights preferably provide illumination to the sides and further preferably provide illumination angularly with respect to the sides of a vehicle.

The intersection clearing lights, take-down lights, and/or alley lights may additionally include a switch for regulation of rotation of the take-down lights 700 and alley lights 800 or 808, to a desired angle where upon rotation may be terminated. In this situation, the take-down lights 700, and/or alley lights 800, 808, may be utilized in a manner similar to a spotlight integral to a vehicle and as controlled by an operator. The controller 50 or switch may be utilized to provide any desired angle of illumination for the take-down light 700 within an arc of approximately 180° relative to the front and sides of a vehicle between an angle of approximately 45° forwardly and inwardly to an approximate angle of 135° rearwardly and outwardly with respect to the front and sides of a vehicle. The controller 50 or switch may also be utilized to provide any desired angle of illumination for the alley lights 800, 808, within an arc of approximately 140° relative to the sides of a vehicle between an angle of approximately 70° forwardly and outwardly to an approximate angle of 70° rearwardly and outwardly from the sides of an emergency vehicle. A wide area of illumination to the front and sides of an emergency vehicle is thereby provided by the alley lights 800, 808, and take-down light 700 either independently and/or in combination. The controller 50 may independently illuminate either the alley lights 800, 808, and/or take-down lights 700 as desired by an individual.

In an alternative embodiment, a plurality of take-down lights 700 may be positioned adjacent to each other and disposed along the longitudinal length of the of a light bar 760 above the front face 764 and/or rear face 766. Alternatively, the take-down lights 700 may be formed of a plurality of LED light sources 784 positioned adjacent to each other along the entire length of the front face 764 and/or rear face 766 of a light bar 760. (FIG. 63.) The LED light sources 336, 786 in this embodiment are preferably connected to the controller 50. The controller 50 may selectively illuminate one or more LED lights 336, 786 to provide any desired intensity of light to be used in a take-down situation by law enforcement personnel.

As depicted in FIGS. 31, 32, and 63, a single row of LED light sources 336, 786 is disposed on front face 764 and rear face 766 of LED light bar 760. Alternatively, a plurality of rows and/or columns of LED light sources 336, 786 as generally illustrated and described in relation to FIGS. 7, 9, 12, 34, and 35, may be utilized on front face 764 and/or rear face 766 to provide for a desired level of illumination from light bar 760. In addition, it should be noted that a linear culminator assembly 484 (FIGS. 31, 32), or a culminator assembly 392 in the form of an array (FIG. 26), may be positioned adjacent to LED light sources 336, 786. Alternatively, reflectors 350 such as mirrors as illustrated in FIGS. 37–39, may be engaged to front face 764 and/or rear face 766 adjacent to LED light sources 336, 786 to reflect light along a desired line of illumination.

A transparent surface 782 is preferably in sealing engagement with the housing 780 to prevent moisture or other contamination from adversely affecting the performance of the take-down light 700 and/or the alley lights 800, 808. The transparent surface 782 is preferably of sufficient strength and durability to not fracture, break, and/or fail when exposed to adverse environmental and/or weather conditions including but not limited to the exposure to rock or gravel strikes.

Figure 59:
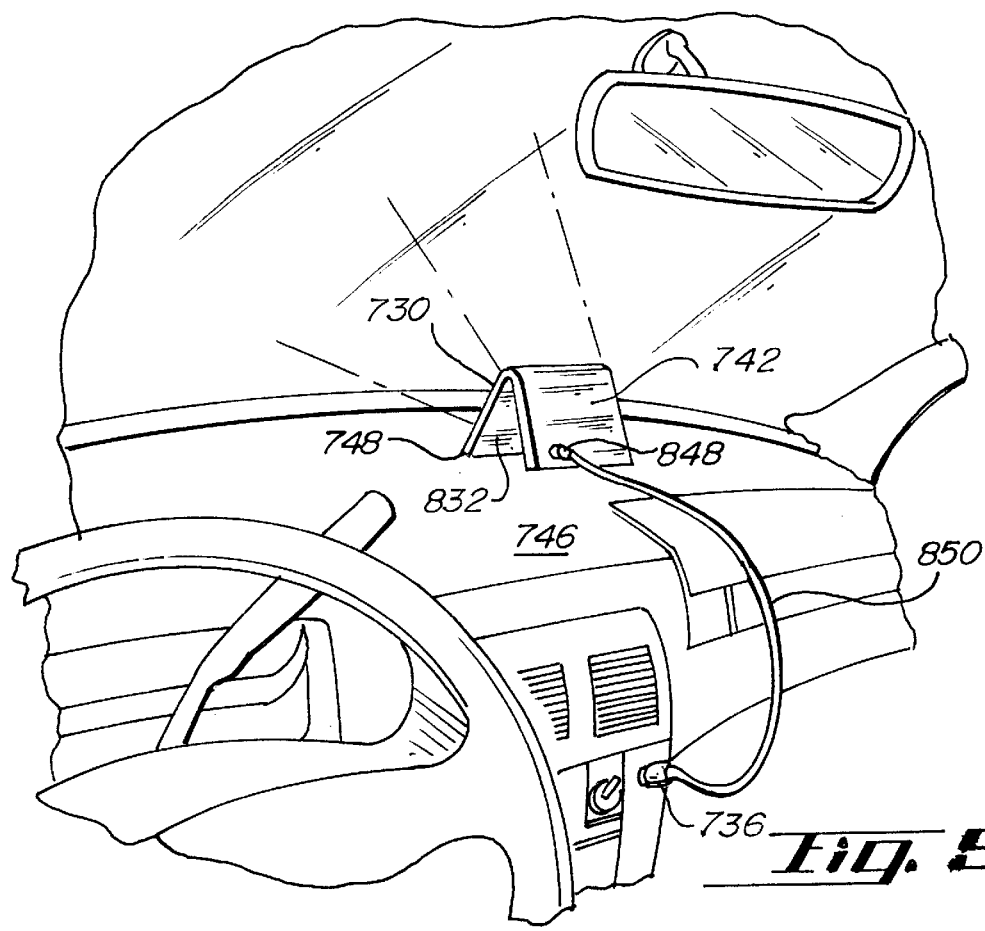
FIG. 59 is an environmental view of an LED personal warning signal light positioned on a dashboard for an emergency vehicle and electrically coupled to a power source such as cigarette lighter receptacle.
Figure 60:
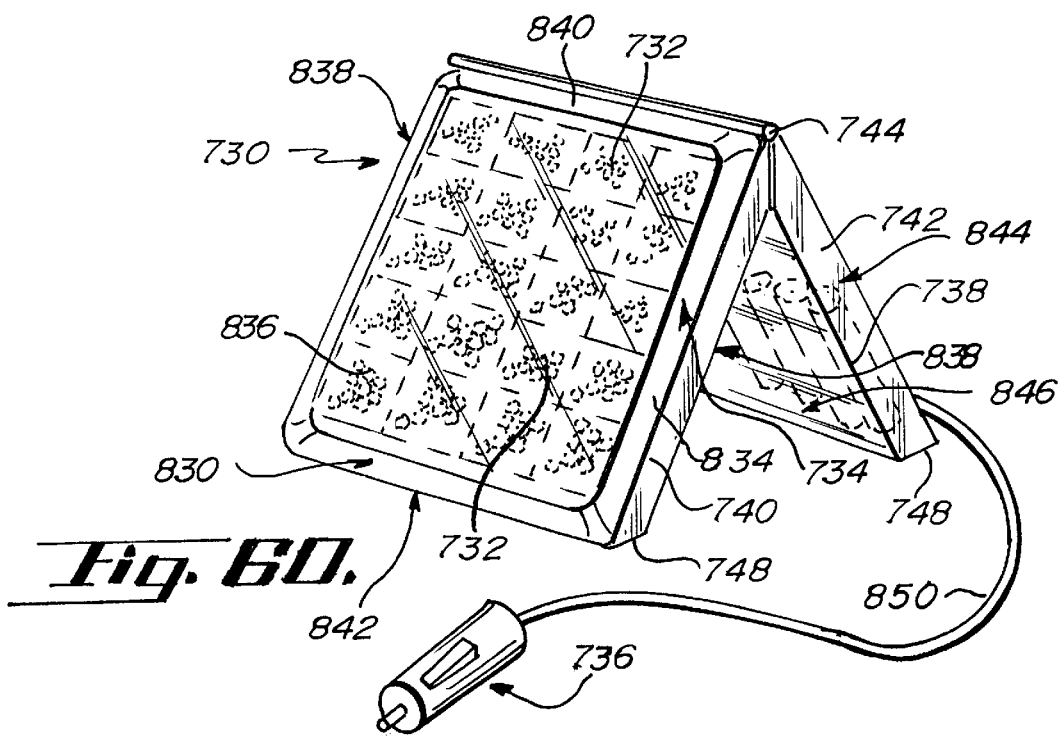
FIG. 60 is a detail isometric view of the LED personal warning signal light and electrical coupler.
Figure 61:
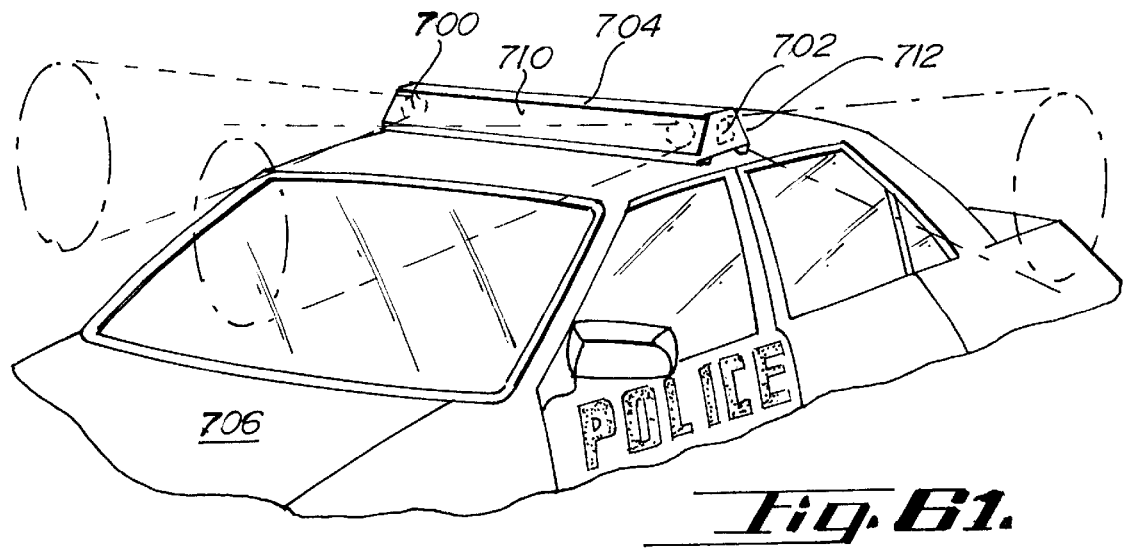
FIG. 61 is an environmental view of an LED take-down light source and an LED alley light source mounted to the light bar of an emergency vehicle.
Figure 62:
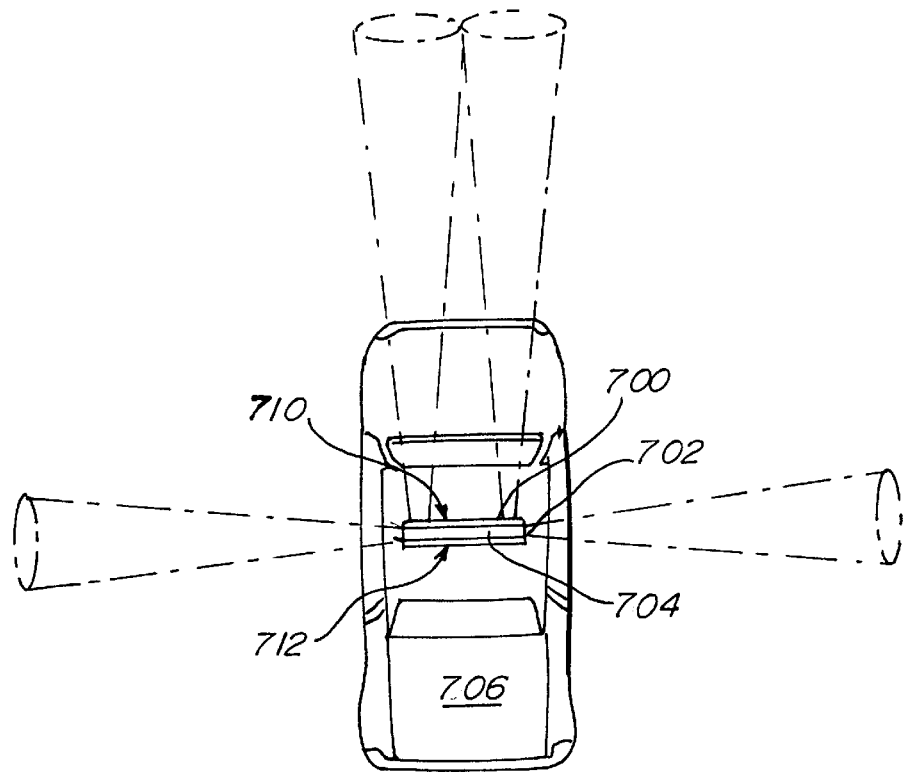
FIG. 62 is a top environmental view of an LED take-down light source and an LED alley light source mounted to the light bar of an emergency vehicle.

Referring to FIGS. 59 and 60, a personal LED warning signal light 730 is shown. The personal LED warning signal light 730 is preferably formed of a plurality of individual LED light sources 732 which may provide illumination in any desired color as preferred by an individual. The individual LED light sources 732 may be selectively illuminated by a controller 50 as earlier described for the provision of any desired combination or pattern of visually distinctive warning light signals during use within an emergency situation.

The personal LED warning signal light 730 may be formed of columns or rows of individual LED light sources 732 which may in turn be sequentially illuminated to provide the appearance of a scrolling or rotating light source at the preference of an individual.

The individual light sources 732 may be formed in an array, panel, or single line, and may include an adhesive backing as earlier described. Further, the individual LED sources 732 may be offset as depicted within FIG. 14 to maximize light output along a desired line of illumination as preferred by an individual. The personal LED warning signal light 730 preferably includes a circuit board or LED mounting surface 482 which may be electrically coupled to a controller 50 for the illumination of any desired type of lighting effect. The types of lighting effects available for illumination by the personal warning signal light 730 include but are not necessarily limited to, a constant light signal, a strobe light signal, a pulsating light signal, a flashing light signal, a rotating light signal, an oscillating light signal, a modulated light signal, or an alternating light signal, or any combination thereof.

The personal LED warning signal light 730 may also include a culminator or reflector 370 as earlier described disposed about the LED light sources 732. The culminator or reflector 370 preferably assists in the maximization of light output along a desired line of illumination for the personal LED warning signal light 730. The culminator 370 may also be angularly offset to conform to any angular offset of LED light sources 732.

The personal LED warning signal light 730 preferably includes the benefits of having reduced heat generation, current draw, electromagnetic emissions, and increased useful life while enhancing true light output color within a compact size. The personal LED warning signal light 730 may be formed of rows and columns of the same or different colored LED light sources 732 at the preference of an individual. In the preferred embodiment the personal LED warning signal light 730 is the approximate size of a hand held calculator which may be easily transported within the pocket of law enforcement personnel. The personal LED warning signal light 730 may be enclosed within a hard or soft sided case 734. Alternatively, the case 734 may have an exterior appearance designed to secrete the function of the personal LED warning signal light 730. For example, the case 734 may be configured to have a first area having a removable or retractable cover to reveal the LED light sources 732. Alternatively, the case 734 may be formed to resemble an article used to transport tobacco products similar to a cigarette case. Alternatively, the case 734 may include a removable or retractable face which is designed in appearance to resemble a hand held calculator, personal electronics device, and/or electronic address book.

The personal LED warning light 730 preferably includes a plug in adaptor 736 which is used to establish an interface for coupling engagement to the cigarette lighter receiver of a motor vehicle. A low voltage power supply is thereby available for the personal LED warning signal light 730 when used in conjunction with a motor vehicle. The plug in adaptor 736 may also resemble a power cord for a cellular telephone thereby hiding the function of the personal LED warning signal light 730. Alternatively, the personal LED warning signal light 730 may be powered by one or more batteries 738.

During use, the personal LED warning signal light 730 may then be withdrawn and opened to expose a first panel 740 and a second panel 742. The first panel 740 and the second panel 742 are preferably joined together by a hinge 744. Following opening, the plug in adaptor 736 may be engaged to either the first panel 740 or to the second panel 742 and to a cigarette lighter receptacle for the provision of low voltage power to the personal LED warning signal light 730. The personal LED warning signal light 730 may then be placed upon the dashboard 746 of a motor vehicle or held for use as a warning signal light by undercover law enforcement personnel.

The first panel 740 and the second panel 742 may each include a tacky and/or adhesive base 748 which preferably functions to assist in the retention of the personal LED warning signal light 730 upon the dashboard 746 of a vehicle. It should be noted that the individual LED light sources 732 may be angularly offset with respect to the first panel 740 and/or second panel 742 at the discretion of an individual.

The personal warning signal 730 may include a frame 830 having a back surface 832. The frame 830 preferably includes a lip 834 which is adapted for positioning and retention of a transparent protector 836. The transparent protector 836 is preferably water resistant and prevents water and/or other contamination from adversely affecting the performance of the LED light sources 732. The frame 830 also preferably includes a pair of parallel sides 838, hinge side 840, and support side 842. The support side 842 may be angled to facilitate positioning upon the dashboard of a vehicle.

An opaque cover or second panel 742 preferably includes a receiving ledge 844 which is preferably adapted for nesting and covering engagement relative to the parallel sides 838 during closure of the second panel or opaque cover 742 over the transparent protector 836. The second panel 742 therefore preferably conceals the LED light sources 732 of the personal warning light 730 during periods of non-use. The personal warning signal light 730 preferably has a first nested closed position and a second open signaling position as indicated in FIGS. 59 and 60. The personal warning signal light 730 may also include a switch which is adapted to detect the closure of the second panel 742 relative to the first panel 740 for termination of power and illumination of the LED light sources 732. The personal warning signal light 730 may also include a power saving feature to prolong the utility and life of internal batteries 738.

An electrical receiving port having a cover may be placed in either the support side 842 or the tacky or adhesive base 748. The electrical receiving port is adapted to receivingly engage a plug 848 of a power cord 850. The power cord 850 is preferably adapted to include an adapter 736 for insertion into the cigarette lighter receiving port of a vehicle. Alternatively, the plug 848 may be inserted into a electrical receiving port integral to either the opaque exterior surface 846 and/or frame 830 at the preference of an individual.

The personal warning signal light 730 preferably includes an internal controller 50 as earlier described. Alternatively, the personal warning signal light 730 may include an external programmable controller as earlier described. Also, the personal warning signal light 730 may include a selector switch for activation of prestored and/or programmed light signals to be regulated by the controller 50 during illumination of the LED light sources 732.

It should be noted that the controller 50 may regulate the illumination of LED light sources 732 either individually and/or in combination for the provision of any of the independent and visually distinct or combination warning light signals as earlier described.

The personal warning signal light 730 may be configured in any shape as desired by an individual including, but not necessarily limited to, square, rectangular, round, and/or oval at the preference of an individual. The personal warning signal light 730 preferably has a reduced thickness dimension following closure of the second panel 742 relative to the frame 834 for placement in the first nesting closed position. The second panel 742 also preferably functions to provide for sealing engagement to the frame 830 to prevent moisture and/or other contamination from adversely affecting the performance of the LED light sources 732. The LED light sources 732 are preferably rugged and shock absorbent facilitating transportation and prolonged usefulness by an individual.

Referring to FIGS. 63 and 64 an LED light bar 760 is disclosed. The LED light bar 760 may be formed of a base 762 which extends longitudinally, traversing the roof of an emergency vehicle. The base 762 preferably includes a front face 764 and a rear face 766. Each of the front and rear faces 764, 766 preferably include LED illumination devices 336, 786 which may be configured similarly to the modular light support 480 identified and described relative to FIGS. 31-32. It should be noted that the LED illumination devices 336, 786 along the front face 764 and rear face 766 are preferably positioned within the interior of the base 762 and are enclosed therein by a transparent protective cover 860 to minimize contamination from the environment and/or exposure to water during use of the LED light bar 760. The transparent protective cover 860 may be placed into sealing engagement with either the front face 764 and/or rear face 766 through the use of a gasket and/or sealant or any other preferred mechanical and/or chemical sealing mechanism as desired by an individual. The protective cover 860 as engaged to the front face 764 and rear face 766 is preferably formed of a transparent material such as plastic, and/or glass to provide for transmission of light from individual LED light sources 336, 786 for observation by an individual.

As earlier depicted with reference to FIGS. 31 and 32 the LED light sources 336, 786 may be formed into modular units which may be regularly spaced along the front face 764 and rear face 766. The LED light sources 336, 786 integral to the front face 764 and/or rear face 766 are each preferably positioned within a culminator 370 as earlier described. It should be noted that the reflector devices as depicted and described with reference to FIGS. 37–39 may be incorporated into modular light supports 480 for utilization along a front face 764 and/or rear face 766 of LED light bar 760. The number of light emitting diode light sources 336, 786 forming each individual modular unit 480 may vary at the discretion of an individual. Preferably each modular unit 480 includes between 2 and 20 LED light sources 336, 786. Each of the LED light sources 336, 786 is preferably electrically connected to a circuit board 346 having heat sink wells 344 as earlier described in reference to FIG. 36. The construction of the modular light supports 480 and LED light sources 336, 786 facilitates ease of color modification and versatile alternative configurations for light transmission from the light bar 760. The LED light sources 336, 786 as integral to the base 762 proximate to the front face 764 and/or rear face 766 may be formed of one or more colors at the preference of an individual. The modular light supports 480 also may preferably include electrical couplers or connectors 790 as earlier described.

Each modular light support 480, and/or individual LED light source 336, 786 is preferably in electrical communication with the controller 50 as earlier described. The controller 50 preferably regulates the illumination of LED light sources 336, 786 to provide any desired color, pattern, combination of patterns, and/or types of light signals including, but not necessarily limited to, flashing, stroboscopic, modulated, variable, pulsating, oscillating, alternating, rotating, illumination of arrows, and/or other types of variable light signals or combination of light signals as earlier described. The controller 50 may also preferably regulate the illumination of modules 480 and/or individual LED light sources 336, 786 independently between the front face 764 and the rear face 766. The controller 50 may also regulate the individual illumination of LED light sources 336, 786 within sections and/or sectors along the front face 764 independently with respect to each other and independently with respect to the rear face 766. It should be apparent that the controller 50 may regulate the illumination of LED light sources 336, 786 in any desired individual combination, pattern, or sector, as desired by an individual for the provision of an infinite variety of different types of light signals. For example, one portion of the front face 764 may transmit a stroboscopic light signal. Simultaneously and/or alternatively, another portion or sector of the front face 764 may transmit a different colored flashing light signal. Alternatively, a third portion of the front face 764 may transmit a third color of a pulsating modulated or variable lighting effect. The controller 50 may additionally alternate any desired pattern of types of lighting effects independently between the front face 764 and/or rear face 766 as desired by an individual. The examples illustrated herein are, by no means, restrictive of the infinite variety of combinations or types of light signals which may be regulated by the controller 50 during use of the LED light bar 760.

The controller 50 is preferably in electrical communication with the modular light supports 480, LED light sources 336, 786 take-down lights 700, alley lights 800, 808, and pod illumination devices 770 during use of the LED light bar 760. The controller 50 may therefore regulate the modular light sources 480, take-down lights 700, alley lights 800, 808, and pod illumination devices 770 either simultaneously, independently, and/or in combination during use of the LED light bar 760. Further, the controller 50 is also preferably in electrical communication with rotational and/or reflector devices such as earlier described with reference to the intersection clearing light. Further, the controller 50 is also in electrical communication with the reflector as described in detail with respect to FIG. 47 which may be positioned within the pod illumination devices 770.

Light bar 760 preferably includes base 762 which is elevated with respect to the roof of an emergency vehicle to enhance visualization during use. The base 762 may be supported above the roof of an emergency vehicle by a plurality of feet 870. The feet 870 are preferably secured to the roof or rain channels of a vehicle through mechanical affixation mechanisms. In a preferred embodiment, preferably four feet 870 extend from the base 762 to the roof of an emergency vehicle. Extending between each pair of feet 870 is preferably at least one support bar 872 which serves as a frame for elevation of the LED light bar 760 above the roof of a vehicle. The feet 870 are preferably adjustable to facilitate use on various makes and/or models of emergency vehicles as may be desired by an individual.

The LED take-down light 700 and/or alley lights 800, 808 may be integral to the base 762 proximate to each of the first and second ends 862, 864 of light bar 760. An end cap 772 may be secured to the first and second ends 862, 864 of the base 762. Each end cap 772 preferably enclosed the take-down light 700 and alley lights 800, 808 as earlier described. The end caps 772 may be elevated above or alternatively may rest upon the roof of an emergency vehicle and may assist to support the longitudinally extending base 762. The end caps 772 preferably provide for visualization of the LED light bar 760 from the sides of an emergency vehicle. The end caps 772 are preferably formed of materials identical to the base 762 which are aerodynamically efficient to promote utility of the LED light bar 760 as used in association with an emergency vehicle. Each end cap 772 may have the same width dimension as the base 762 or have larger or smaller dimension at the preference of an individual.

As earlier described a series of take-down lights 700 may be disposed proximate to front face 764 and/or rear face 766 at the discretion of an individual. Each of the plurality of take-down lights 700 will preferably be coupled to a controller 50 for independent and/or selective illumination, or illumination in combination, with other types of light signals described herein. Alternatively, one or more of the independent light sources 336, 786 as disposed about the front face 764 and/or rear face 766 may be independently illuminated by the controller 50 to function and serve as a take-down light 700 utilized to flood an area in front of, or to the rear of, an emergency vehicle.

Supports 774 preferably extend angularly upwardly and forwardly from the base 762 for elevation and positioning of the pod illumination devices 770 above the base 762. The supports 774 preferably are substantially vertical and are angled inwardly and forwardly toward the front face 764 of the LED light bar 760. The supports 774 may be formed of any material as preferred by an individual provided that the essential functions, features, and attributes described herein are not sacrificed. The supports 774 are preferably aerodynamically designed to improve the efficiency for the LED light bar 760.

Each pod illumination device 770 is preferably elevated by at least one and preferably two supports 774. The elevation of the pod illumination devices 770 above the light bar 760 via the supports 774 enhances illumination source differentiation of light signals as observed by individuals during use of the LED light bar 760.

The pod illumination devices 770 may either be circular, oval, square, rectangular, or any other shape as desired by an individual. The supports 774 are preferably secured to the pod illumination 770 devices for elevated positioning relative to the base 762. The pod illumination devices 770 preferably include LED light sources 336, 786 as earlier described. The visualization of the LED light bar 760 is enhanced by the pod illumination device 770 permitting observation at all angles relative to an emergency vehicle.

The pod illumination devices 770 may be formed of a frame 866 comprised of metal, plastic, rubber, and/or any other sturdy material at the preference of an individual. The frame 866 preferably includes a transparent protective cover 868 which functions to prevent moisture or other contamination from adversely affecting the performance of the LED light source 336, 786. The transparent protective cover 868 is preferably formed of a material such as plastic or glass to permit light transmission therethrough during use of the light bar 760.

Each LED light bar 760 preferably has at least one and preferably two or more pod illumination devices 770 for the provision of warning light signals for observation by individuals. Each of the pod illumination devices 770 are preferably disposed proximate to either the first end 862 and/or second end 864 of light bar 760.

A controller 50 is preferably in electrical communication with the LED light sources 336, 786 integral to the pod illumination devices 770 to provide for an infinite variety of unique lighting signals including, but not limited to oscillating, pulsating, flashing, strobe, modulated, alternating, rotational, and/or any combination thereof including the provision of variable colored light signals. It should be noted that the controller 50 may independently illuminate the pod illumination devices 770 or provide different light signals within each pod illumination device 770 as preferred by an individual. The use of LED light sources 336, 786 within the pod illumination devices 770 prolongs the useful life, requires less current draw, produces truer light output color, and reduces RF electromagnetic emissions as compared to traditional light sources such as halogen, gaseous discharge xenon lamps, and/or incandescent lamp sources.

Each pod illumination device 770 may include individual columns and rows of multicolored LED light sources 336, 786. Each individual light emitting diode light source 336, 786 integral to the pod illumination device 770 may also be enclosed within a culminator and/or reflector 370 as earlier described having reflective and/or transparent sections at the preference of an individual. Alternatively or additionally, each pod illumination device 770 may also include a reflector assembly as illustrated and earlier described within FIG. 47 which includes a culminator 370, 534 and rotational mechanism or motor 794 as positioned within the frame 866. The motor 794 preferably provides rotational or oscillating motion to the reflector 532. Alternatively, reflector devices as earlier described with reference to FIGS. 37–42, and 44–45 may be incorporated into pod illumination devices 770. The pod illumination devices 770 also preferably include a frame 866 having a cover or top 874 which is removable to provide access to either a reflector assembly, culminator, modular light supports 480 and/or LED light sources 336, 786 for repair or replacement therein. The cover or top 874 is preferably affixed to the pod illumination devices 770 by any conventional means including but not limited to the use of screws and/or wing nuts at the preference of an individual.

Figure 4:
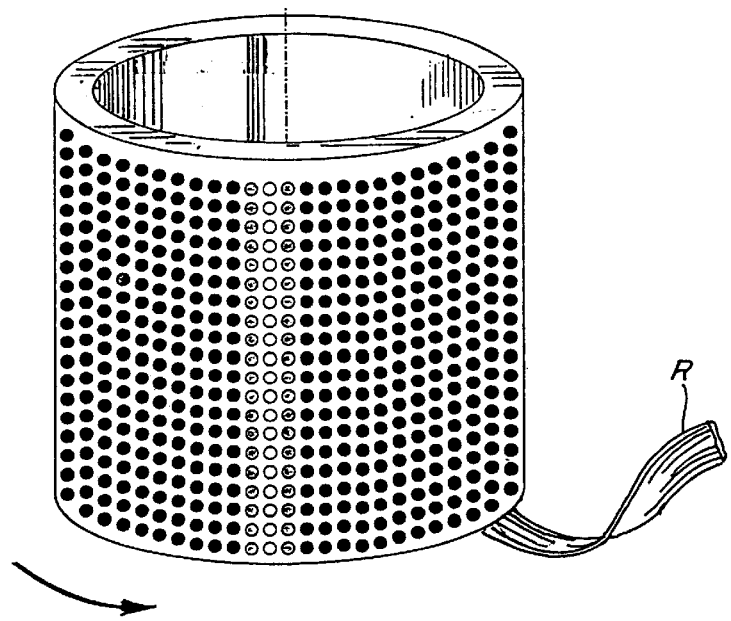
FIG. 4 is a perspective view of a warning signal light according to an embodiment of the invention depicting the sequential activation of columns of light-emitting diodes (LED's).
Figure 12:
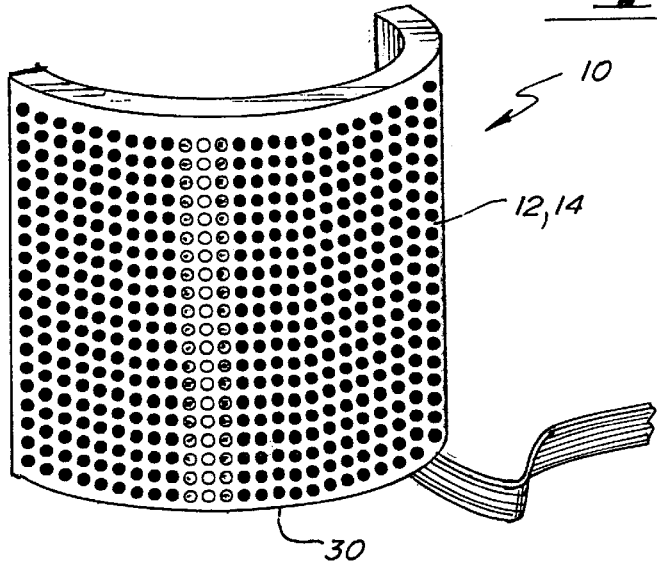
FIG. 12 is a perspective view of a warning signal light according to an embodiment of the invention.

Alternatively, the pod illumination devices 770 may include flexible circuit boards as illustrated and described in FIGS. 4, 5, and 12. Moreover, the individual LED light sources 336, 786 may be relatively flat as depicted within FIGS. 3, 6, 7, 8, 9, and 10. The pod illumination devices 770 and frame 866 preferably provide an aerodynamic encasement for the LED light sources 336,786. It should also be noted that the LED light sources 336, 786 may be angularly offset as previously described in reference to FIG. 14 to enhance visualization of the emitted light signal along a desired line of sight.

The LED light bar 760 is preferably formed of an aesthetically pleasing visual shape providing a high technology appearance to enhance the visualization of a law enforcement vehicle. The LED light bar 760 is preferably of aerodynamic design to reduce drag during use of an emergency vehicle.

The pod illumination devices 770 may include modular light supports 480, 606 as earlier described in reference to FIGS. 23–25, 31–32, and 51–58 herein. Alternatively, the light emitting diode light sources 336, 786 as disposed in pod illumination devices 770 may be configured in any desired shape or panel as earlier described in reference to FIGS. 4–10, 12, 14, 23–25, 31–32, 34, 35, and 37–46, herein. The LED light sources 336, 786 may therefore be replaceable along with a circuit board, or alternatively, the entire pod illumination device 770 may be replaceable at the preference of an individual. The controller 50 preferably functions to regulate the types of warning light signals as earlier described during the use of stationary LED's 336, 786 within the pod illumination device 770.

If modular LED light sources 480, 606 are utilized within pod illumination devices 770 then rotational mechanisms as described in FIGS. 21, 22, 40–42, 44, 47, 51, 63, and/or 65, may be utilized individually, exclusively, and/or in combination with controller 50 to provide a desired rotating and/or oscillating warning signal light. Alternatively, the module light sources 480, 606 are not required to be utilized in association with a rotational device where the controller 50 may be exclusively utilized to selectively illuminate individual and/or combinations of LED's 336, 786 to provide a desired type of warning light signal.

If non-modular light sources 336, 786 are utilized within pod illumination device 770, then rotational mechanisms as described in FIGS. 21, 22, 40–42, 44, 47, 51, 63, and 65, may be utilized individually, exclusively, and/or in combination with a controller 50 to provide a desired rotating and/or oscillating warning light signal. Alternatively, the non-modular LED light sources 336, 786 are not required to be utilized in association with a rotational device where the controller may be exclusively utilized to selectively illuminate individual and/or combinations of LED's 336, 786, to provide a desired type of warning light signal.

It should be noted that any type or configuration of light support, LED's, and/or reflector devices described with reference to FIGS. 1–66 herein may be modified for inclusion and use within either LED light bar 760 and/or pod illumination devices 770 at the discretion of an individual. It should be further noted that any feature and/or combination of features described with reference to FIGS. 1–66 herein may be modified for inclusion and use within either LED light bar 760 and/or pod illumination devices 770 at the discretion of an individual.

As may be seen in the FIGS. 63–65 the LED light bar 760 may be modular in construction for ease of replacement of component elements such as the pod illumination device 770. The LED light bar 760 may be constructed and arranged as a one piece unit including the base 762, end caps 772, supports 774, and pod illumination devices 770. Alternatively, the elements of the base 762, pod illumination devices 770, end caps 772, and supports 774 may be releasably secured to each other by any desired affixation mechanism provided that the essential functions, features, and attributes described herein are not sacrificed.

The rotational light signal provided by the LED light bar 760 and particularly the pod illumination devices 770 may be provided by mechanical rotational elements as earlier described, mirror rotational elements, and/or a controller 50 for selectively illuminating individual columns and/or rows of light emitting diodes 336,786.

In addition to being directed to the embodiments described above and claimed below, the present invention is further directed to embodiments having different combinations of the features described above and claimed below. As such, the invention is also directed to other embodiments having any other possible combination of the dependent features claimed below.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

What is claimed is:

1. A light emitting diode alley light comprising:
   a) a light support having a fit end and a second end said light support having a longitudinal axis;
   b) at least one light emitting diode assembly connected to said light support proximate to each of said first end and said second end, said at least one light emitting diode assembly extending substantially perpendicular to said longitudinal axis, each of said light emitting diode assemblies having a plurality of light emitting diode light sources receiving power from a power source said light emitting diode light sources providing a light signal;
   c) a cover enclosing said light emitting diode light sources, said cover constructed and arranged to permit light passage through said cover whereby light is transmitted from said light emitting diode light sources outwardly from said first end and said second end;
   d) a reflector positioned adjacent to said light emitting diode light sources;
   e) a controller in electric communication with said at least one light emitting diode assembly for illumination of at least one light signal; and
   f) a fist gear rotatably engaged to said at least one light emitting diode assembly.

2. The light emitting diode alley light according to claim 1, further comprising a motor having a shaft and a worm gear, said worm gear being coupled to said first gear.

3. The light emitting diode alley light according to claim 2, further comprising a second gear rotatably engaged to said at least one light emitting diode assembly, said second gear being coupled to said first gear.

4. The light emitting diode alley light according to claim 3, further comprising a tie bar connected to and extending between said first gear and said second gear.

5. The light emitting diode alley light according to claim 3, wherein said at least one light emitting diode assembly is rotatable with respect to said light support.

6. The light emitting diode alley light according to claim 3, further comprising a third gear rotatably engaged to said at least one light emitting diode assembly, said third gear being coupled to said second gear.

7. The light emitting diode alley light according to claim 6, further comprising a take-down light engaged to said third gear.

8. The light emitting diode alley light according to claim 3, said reflector comprising a culminator.

9. The light emitting diode alley light according to claim 3, wherein said controller is in electric communication with said light emitting diode light sources, said controller being constructed and arranged to selectively activate said light emitting diode light sources thereby producing more than two different types of visually distinct light signals.

10. The light emitting diode alley light according to claim 3, wherein said controller is in electric communication with said motor for signaling engagement and disengagement of said motor.

11. The light emitting diode alley light according to claim 3, wherein said controller is electrically coupled to said motor for rotation of said gears relative to said light support.

12. The light emitting diode alley light according to claim 3, said at least one light emitting diode assembly comprising a circuit board having a plurality of heat sink wells, each of said heat sink wells being constructed and arranged to receivingly position one of said light emitting diode light sources.

13. The light emitting diode alley light according to claim 8, said culminator comprising at least one reflective section.

14. The light emitting diode alley light according to claim 13, said culminator comprising at least one transparent section.

15. The light emitting diode alley light according to claim 3, further comprising a switch electrically connected to said motor for initiation or termination of engagement of said motor.

16. The light emitting diode alley light according to claim 8, further comprising a plurality of culminator cups, each of said culminator cups being constructed and arranged for positioning proximate to one of said light emitting diode light sources.

17. The light emitting diode alley light according to claim 16, wherein said culminator cups are disposed in a linear array.

18. The light emitting diode alley light according to claim 3, said reflector comprising at least one mirror.

19. The light emitting diode alley light according to claim 3, wherein said controller is in electric communication with said light emitting diode light sources and said controller is constructed and arranged to selectively activate said light emitting diode light sources to produce a plurality of visually distinct light signals.

20. The light emitting diode alley light according to claim 3, wherein said controller is in electric communication with said light emitting diode light sources and said controller is constructed and arranged to independently illuminate said light emitting diode light sources.

21. The light emitting diode alley light according to claim 3, said light emitting diode light sources comprising light emitting diodes of at least two different colors.

22. The light emitting diode alley light according to claim 21, where said controller selectively activates said light emitting diode light sources to create at least one of a single colored light signal and at least one of a multi-colored light signal.

23. The light emitting diode alley light according to claim 3, wherein said light signal is selected from the group consisting of: a revolving light, a pulsating light, an alternating light, an oscillating light, a flashing light, a stroboscopic light, a modulated light, and any combination thereof.

24. The light emitting diode alley light according to claim 3, wherein more than two different types of light signals are produced simultaneously.

25. The light emitting diode alley light according to claim 3, wherein more than two different types of light signals are produced independently of each other.

26. The light emitting diode alley light according to claim 3, wherein more than two different types of light signals are produced in at least one combination.

27. The light emitting diode alley light according to claim 3, wherein said controller is constructed and arranged to control said light emitting diode light sources proximate to said first end independently with respect to said light emitting diode light sources proximate to said second end.

28. The light emitting diode alley light according to claim 3, wherein said light emitting diode light sources are disposed in a single row.

29. The light emitting diode alley light according to claim 7, wherein rotation of said gears and illumination of said light emitting diode light sources creates an intersection clearing light signal.

30. The light emitting diode alley light according to claim 3, wherein rotation of said gears and illumination of said light emitting diode light sources create an intersection clearing light signal.

* * * * *

UNITED STATES PATENT AND TRADEMARK OFFICE
CERTIFICATE OF CORRECTION

PATENT NO.     : 6,547,410 B1                                              Page 1 of 1
DATED          : April 15, 2003
INVENTOR(S)    : John C. Pederson It is certified that error appears in the above-identified patent and that said Letters Patent is hereby corrected as shown below:

Column 33,
Line 3, delete "404" and insert -- 304 --.

Column 50,
Line 18, delete "3600" and insert -- 360º --.

Column 58,
Line 40, delete "fit" and insert -- first --.
Line 61, delete "fist" and insert -- first --.

Signed and Sealed this

Fourth Day of November, 2003

JAMES E. ROGAN
*Director of the United States Patent and Trademark Office*